United States Patent [19]

Schiavo et al.

[11] Patent Number: 4,899,147

[45] Date of Patent: Feb. 6, 1990

[54] DATA COMPRESSION/DECOMPRESSION APPARATUS WITH THROTTLE, START-UP AND BACKWARD READ CONTROLS

[75] Inventors: Anthony P. Schiavo, Lafayette Hill; Paul H. Selby, III, Norristown; Harold L. Gibson, Lansdale, all of Pa.

[73] Assignee: Unisys Corporation, Blue Bell, Pa.

[21] Appl. No.: 202,733

[22] Filed: Jun. 3, 1988

[51] Int. Cl.$^4$ .............................................. H03M 7/30
[52] U.S. Cl. ........................................ 341/60; 341/87; 341/106; 341/51; 375/122; 370/109; 358/426; 364/200; 364/239
[58] Field of Search ................. 341/51, 60, 61, 86, 341/87, 89, 95, 106; 370/109, 118; 375/122; 358/426, 261.1, 261.2; 364/200, 239

[56] References Cited

U.S. PATENT DOCUMENTS

| | | | |
|---|---|---|---|
| 4,464,650 | 8/1984 | Eastman et al. | 341/51 |
| 4,558,302 | 12/1985 | Welch | 341/51 |
| 4,598,411 | 7/1986 | Berkovich et al. | 370/118 |
| 4,730,348 | 3/1988 | MacCrisken | 370/118 |
| 4,791,403 | 12/1988 | Mitchell et al. | 341/51 |
| 4,796,003 | 1/1989 | Bentley et al. | 358/426 |

*Primary Examiner*—William M. Shoop, Jr.
*Assistant Examiner*—H. L. Williams

*Attorney, Agent, or Firm*—Griffin, Branigan & Butler

[57] ABSTRACT

A data compression/decompression apparatus employs common circuitry and a single string table for compression and decompression. A throttle control is provided to prevent data under-runs and an optimizing start-up control delays the start-up of the recording device until the compression apparatus has compressed sufficient data to effeciently reduce throttling and loss of compression when the output device is started. The decompression apparatus may operate to decompress compressed data when the compressed data is read in either the same direction as it was recorded, or read in the direction reverse to that in which it was recorded. A further feature is the provision of a counter which is incremented by one after a predetermined number of string codes have been written into the string table. The output of the counter is stored in the string table with each string code and prefix code. When searching for an empty or usable location in the string table, the count value read from the location is compared with the count in the counter. If the two counts are not equal then the location is considered "empty" and may be written into. This arrangement avoids the usual procedure of intermittently clearing each location of the string table individually since stepping the counter is equivalent to clearing the entire table.

13 Claims, 22 Drawing Sheets

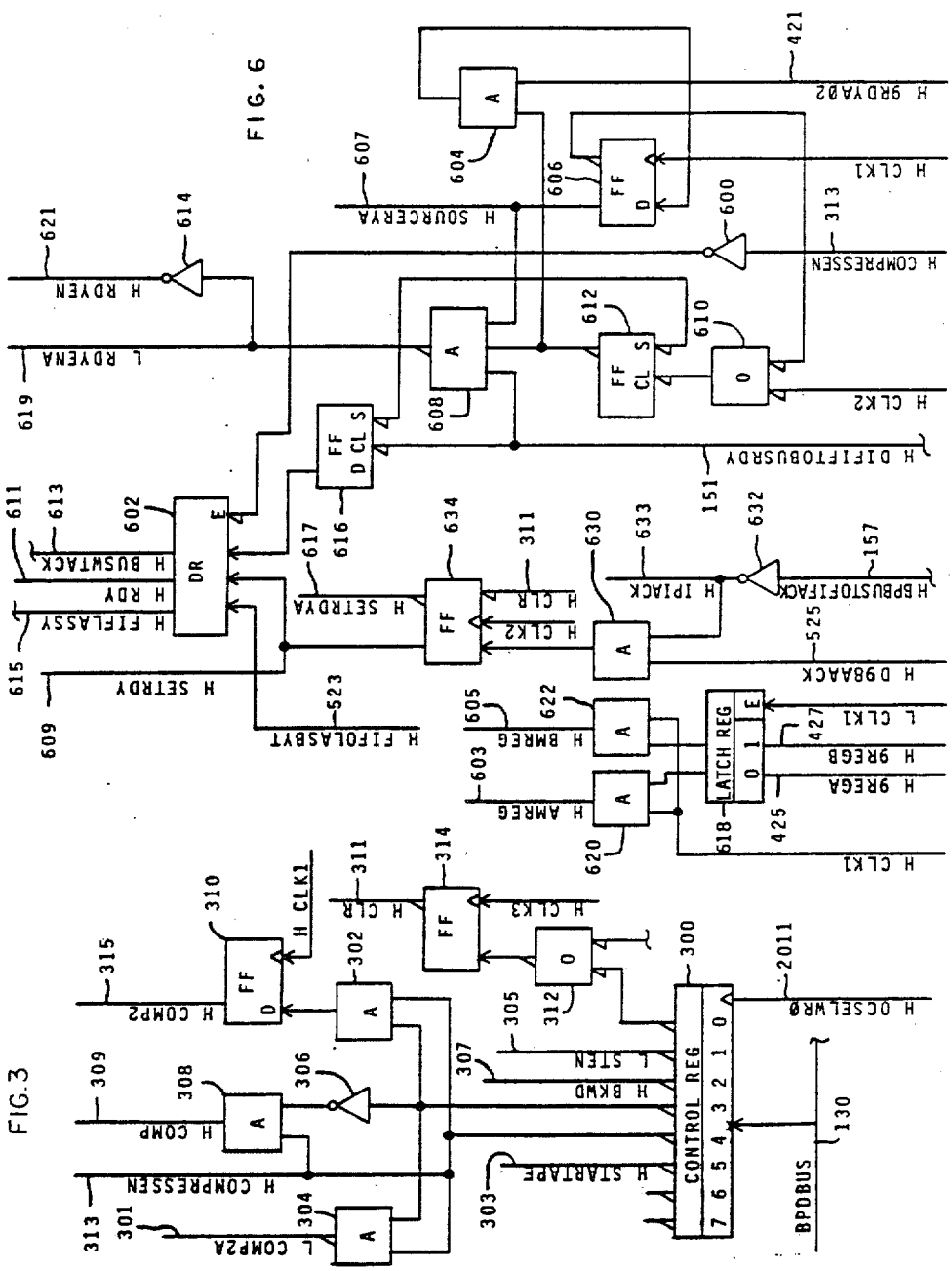

DATA COMPRESSION/DECOMPRESSION APPARATUS WITH THROTTLE, START-UP AND BACKWARD READ CONTROLS

BACKGROUND OF THE INVENTION

The present invention relates to data compression and decompression apparatus and more particulary to an improved apparatus employing common circuitry for compression and decompression, the apparatus being capable of decompressing compressed data recorded in one direction when the compressed data is read in the opposite direction, and further including a throttle control for preventing data underruns.

Eastman et al. U.S. Pat. No. 4,464,650 discloses a data compression and decompression apparatus which parses a stream of input data symbols into adaptively growing sequences of symbols. This apparatus requires numerous memory access cycles for each input character and utilizes time-consuming multiplication and division procedures in order to accomplish the compression and decompression. In addition, the disclosed device requires separate and distinct devices for performing the compression and decompression.

Welch U.S. Pat. No. 4,558,302 discloses a data compression and decompression apparatus wherein a data compressor compresses an input stream of data characters by storing in a string table strings of data character signals encountered in the input stream. A separate decompressor is provided for decompressing the compressed data. The compressor searches the input data stream to determine the longest match to a stored string. Each stored string comprises a prefix string and an extension character where the extension character is the last character in the string and the prefix string comprises all but the extension character. Each string has a code word associated therewith and a string is stored in the string table, at least implicity, by storing the code word for the string, the code word for the string prefix and the extension character. When the longest match between the input data character stream and the stored strings is determined, the code word for the longest match is transmitted as the compressed code signal for the encountered string of characters and an extended string is stored in the string table. The prefix of the extended string is the longest match and the extension character of the extended string is the next input data character following the longest match. Searching through the string table and entering extended strings therein is effected by a limited search hashing procedure. Decompression is effected by a decompressor that receives the compressed code signals and generates a string table similar to that constructed by the compressor to effect lookup of received code signals so as to recover the data character signals comprising a stored string. The decompressor string table is updated by storing a string having a prefix in accordance with a prior received code signal and an extension character in accordance with the first character of the currently recovered string.

While the apparatus disclosed in the Welch patent is admirably suited for its purpose, it lacks several desirable features. It cannot decompress data which is read in the direction reverse to that in which it was recorded. It is subject to data over-run or data under-run conditions. For example, during compression of highly compressible data the data rate may be reduced sufficiently to cause data under-run at the tape control unit or other output device. On the other hand, when highly compressed data is decompressed and transferred through low speed channels it may cause data over-run.

A further disadvantage of the Welch device is that, relatively speaking, considerable time is lost clearing the string table. The string table becomes "tired" in that the accumulation of strings stored therein, after an interval of time, may not be the strings most likely to appear in newer incoming data. Thus, it is necessary to clear or refresh the string table and start a new set of strings. However, the addressing and clearing of each location in the string table takes considerable time during which no compression may take place. In accordance with one aspect of the present invention, actual clearing of the string table does not take place. Instead, a sub-block counter is provided and its contents are written into the string table with each prefix code. The counter is incremented after a predetermined number of string codes have been written into the string table. Each time a location in the string table is accessed to see if it is empty, the sub-block count stored in the location is compared with the count in the counter. If the two are not equal then the location is treated as being empty.

Start-up time for a write-to-tape operation creates a special case which might result in data underrun. To achieve the high compressions possible with the algorithm disclosed in the Welch patent it is necessary that data buffering and compression proceed for some time prior to starting the tape on a write command. However, this precompression has an impact on cost, performance and the resulting compression unless the start time is accurately controlled For example, if the tape is started too soon then it may be necessary to issue throttle characters to prevent tape under-run. This will result in lower overall compression. On the other hand, if the tape is started too late then the tape will have to be run after the compressor has completed its compression in order to write buffered compressed data. This increases the overall time required for the operation. Ideally, the tape should be started at a time such that it will be ready to write the last of the compressed data as that data is produced by the compressor.

SUMMARY OF THE INVENTION

An object of the present invention is to provide a method of, and apparatus for, controlling device start time on write operation so as to optimize both the compression of the data and the total time required for the write operation. To this end, apparatus is provided for solving the equation and issuing a device start signal when $$IB - IO \leq \frac{QO + (RT)(TS)}{\frac{RT}{RC} - \frac{1}{CT}}$$

where,
- RC = compression input data rate;
- RT = tape data rate;
- TS = time to get tape up to speed;
- IB = data block size;
- IO = number of input bytes processed by the compressor prior to tape start;
- QO = number of output bytes produced by the compressor prior to tape start; and,
- CT = a design parameter which sets the maximum overall compression which may be achieved following tape start using the formula. Compressions higher than CT are throttled back to CT or less.

IB is provided by the channel prior to a compression operation. The compression circuits include counters for counting IO and QO. IO is subtracted from IB to obtain the difference and the right side of the equation is implemented by a PROM table lookup. A magnitude comparator detects when the difference is less than or equal to the output of the ROM and causes the start signal to be generated. The data is compressed and the compressed data stored in a buffer until the start signal is generated.

A further object of the invention is to provide a data compression/decompression system capable of decompressing recorded compressed data even though the data is read in the reverse direction from that in which it was recorded.

Another object of the invention is to provide a data compression/decompression system with a throttle control for avoiding under-run by outputting throttle or filler characters when the system approaches the state where data under-run might occur.

An object of the invention is to provide a data compression/decompression apparatus wherein common circuitry performs both the compression and decompression.

An object of the invention is to provide a compression apparatus having a string table wherein storage locations are "cleared" without having to address each location. A sub-block counter is provided and each time a string code is written into a location in the string table the contents of the counter are also written into the location. The counter is incremented after a predetermined number of string codes have been written into the string table. Each time a location is accessed the sub-block count stored therein is compared with the contents of the counter. If the two are unequal then the location is considered to be "empty" and may be written to.

Other objects of the invention and its mode of operation will become apparent upon consideration of the following description and the accompanying drawings.

BRIEF DESCRIPTION OF THE DRAWINGS

FIGS. 3-6 shows the logic circuits for controlling a channel chopper;

DETAILED DESCRIPTION OF THE INVENTION

Overview

Figure 1A:
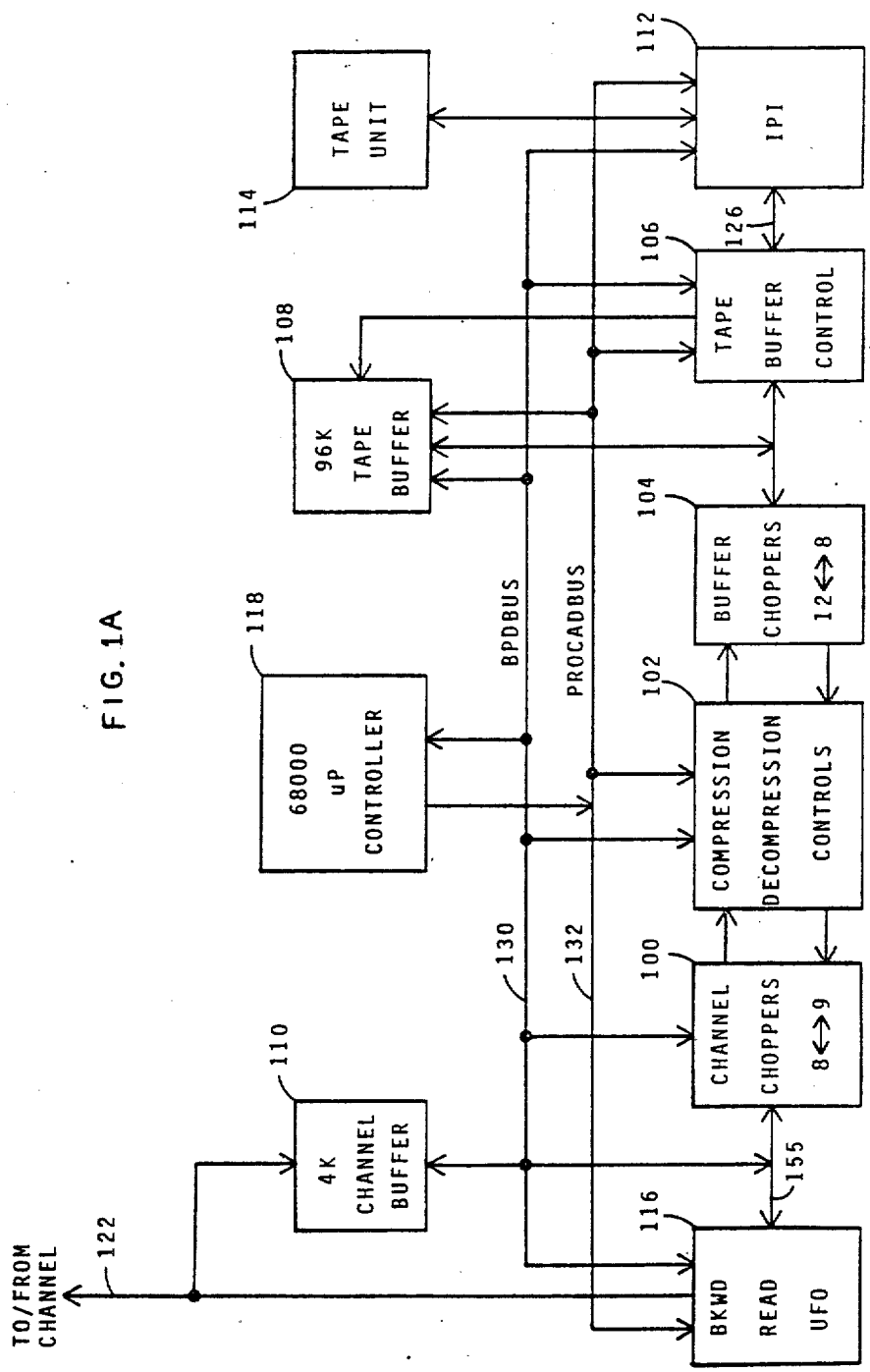
FIG. 1A is a block diagram of a compression/decompression system with backward read controls.

As illustrated in FIG. 1A, a data compression/decompression system constructed in accordance with the principles of the present invention comprises channel data choppers 100, a compression/decompression (C/D) control 102, tape data choppers 104, a tape buffer control 106 and a tape buffer 108. The compression/decompression system is illustrated in FIG. 1A as being connected at one end to a channel buffer 110 which is in turn connected to a channel such as the Unisys SU-39, SU-212 or FIPS 60. At the other end the compression/decompression system is illustrated as being connected through a conventional intelligent peripheral interface (IPI) 112 to a magnetic tape unit 114. However, it will be understood that the tape unit merely represents an output device which may take many forms such as a magnetic floppy or hard disk, an optical compact disk, a communications channel, etc.

If the output device is a tape unit, or any other type of unit wherein data is recorded in one direction and read back in the opposite direction then a backward read control circuit 116 is required.

A controller 118 includes a microprocessor having a bidirectional data bus BPDBUS and an address bus PROCAD connected to various units of the system as illustrated in FIG. 1A. The microprocessor calculates the time for starting the tape unit, monitors status, and provides commands to the compression decompression system as subsequently described. The controller includes a conventional microprocessor such as a type 68000 microprocessor and storage.

Figure 1B:
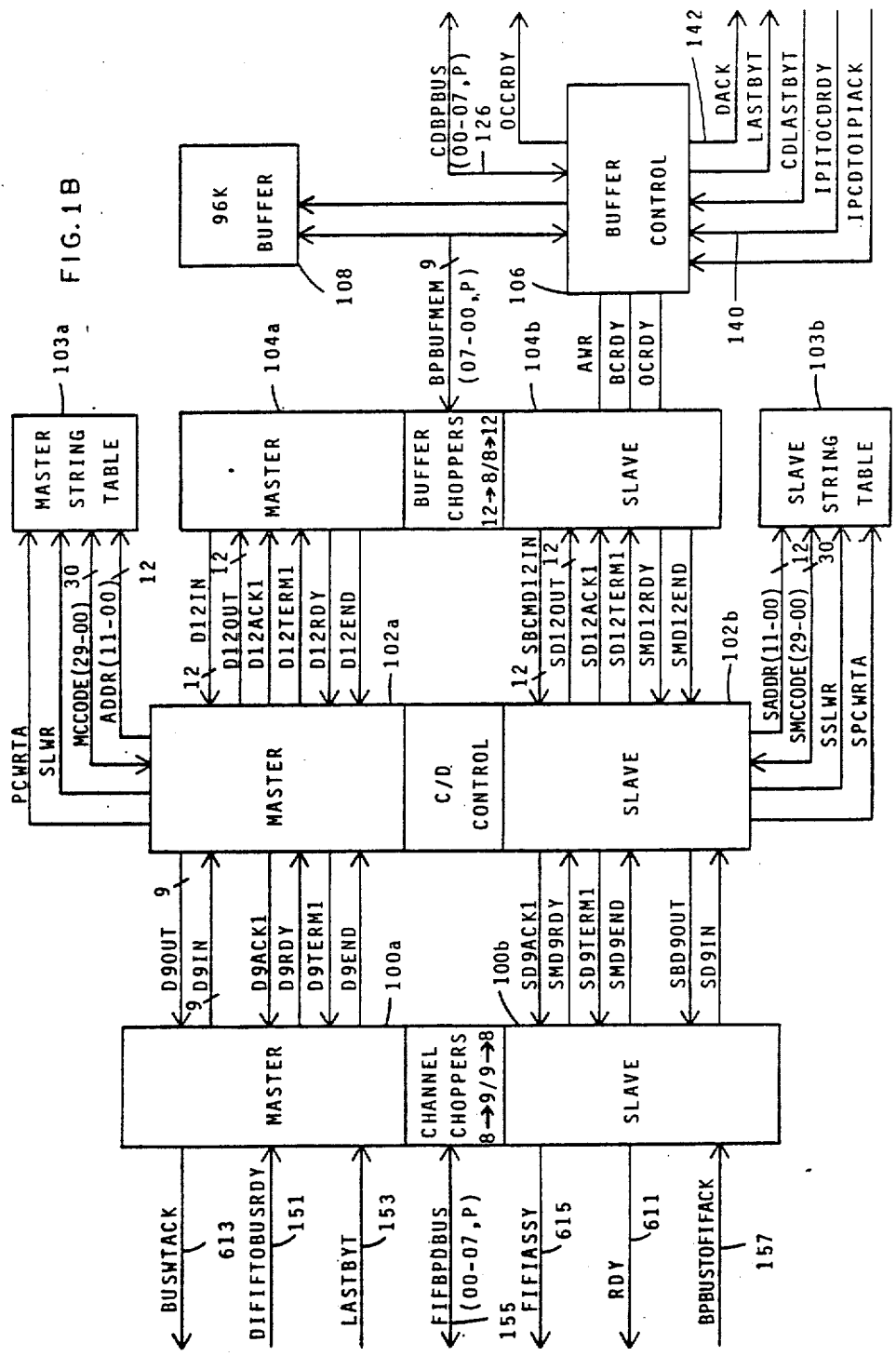
FIG. 1B is a block diagram of a compression/decompression circuit showing the channel choppers, C/D controls, string tables, buffer choppers, buffer controls and tape buffer.

As shown in FIG. 1B, the channel data choppers 100 comprise a master channel data chopper 100a and a slave channel data chopper 100b. In like manner, the tape data choppers 104 comprise a master tape data chopper 104a and a slave tape data chopper 104b. There is also a master C/D control 102a having a master string table 103a associated with it, and a slave C/D control 102b having an associated slave string table 103b. The master and slave units are identical and are connected in parallel. Various comparators (not shown) may be used to compare the states of a master and a slave unit, or the data processed therein, to detect malfunctions and provide status signals to the controller. The circuits for reporting such status to the controller form no part of the present invention and are not shown in the drawings.

The channel data choppers 100a, 100b (channel choppers) are connected by a 9-bit data bus FIFBPD to the channel buffer 110 and a LIFO memory in the backward read circuits 116. During a compression operation, as data bytes are received from the channel buffer, the parities are checked and discarded from the bytes. The master and slave channel choppers reform the data into 9-bit bytes (without parity) which are then fed to the master and slave C/D controls 102a, 102b over buses D9IN and SD9IN, respectively. The data is compressed by the C/D controls acting in conjunction with the master and slave string tables 103a and 103b as subsequently explained. The C/D controls produce 12-bit words of compressed data which are applied over buses D12OUT and SD12OUT to the tape data choppers 104a and 104b. The tape data choppers, hereinafter referred to as the buffer choppers, chop the compressed data into 8-bit bytes, generate a parity bit for each byte, and then transmit the byte and its parity over a bus BPBUF-MEM to buffer 108 and buffer control 106. The buffer control 106 controls buffer 108 to feed the compressed data over a bus CDBPBUS to IPI 112 (FIG. 1A) which controls the recording of the compressed data by tape unit 114.

The operation of the circuit during a normal decompression operation is essentially the reverse of its operation during compression. The compressed data is read from the tape by IPI 112 and fed to the tape buffer control 106 over the bus CDBPBUS. Buffer control 106 controls the tape buffer 108 and buffer choppers 104 so that the compressed data bytes (8 bits plus parity) are fed to the buffer choppers 104a, 104b. The buffer choppers strip the parities and reform the data into 12-bit words which are sent over buses D12IN and SBCMD12IN to the C/D controls 102a, 102b. The C/D controls decompress the data and reform it as 9-bit bytes which are transferred to the channel choppers 100a, 100b over buses D9IN and SD9IN. The channel choppers reform the data as 8-bit bytes, compute the parity of each byte, and transmit each byte and its parity to the channel buffer 110 over the bus FIFBPDBUS.

During a backward read decompression operation an entire block of compressed data is read from the tape unit 114 through IP 112 to the tape buffer 108. The compressed data is then read from the tape buffer in the order reverse to that in which it was entered into the buffer, and is applied to tape buffer control 106. The data is then decompressed as for a normal decompression operation. However, the block of decompressed data appearing at the output of channel choppers 100 is entered into a LIFO memory in the backward read circuits 116. The data is then read out to the channel 122. The backward read circuits 116 are optional and are required only if a backward read requires that data be presented to the channel 122 in the reverse direction from that which it was written.

Channel Chopper

FIGS. 3-6 illustrate the circuits for controlling the channel chopper registers and the handshaking required between the channel chopper and the buffer register 110 and the C/D controls 102. Although not shown in the drawings, the channel chopper includes clock generating circuits for generating 4 phase clock signals designated CLK1 to CLK4 during each 100 ns cycle. These clock signals are supplied to all the logic circuits in the compression/decompression system.

In FIG. 3, the channel chopper is provided with a control register 300 which is connected to the controller 118 via bus BPDBUS. A control word on the bus is gated into register 300 by the signal H OCSELWR∅. This signal is generated in the tape buffer control circuits in response to a microprocessor command as subsequently explained. The signals produced by register 300 are distributed throughout the compression/decompression system to control various functions.

Only bits 0-5 from BPDBUS are utilized at control register 300. Bit 0 is the reset bit. When it is a 1 bit 0 of register 300 is set and it produces an output signal which passes through OR 312 to FF 314. At the next CLK3 the flip-flop is reset to generate the signal H CLR which resets various circuits in the system.

Bit 1 is the string table access bit and when it is a 1 it enables the C/D controls to access the string table by causing register 300 to produce the signal L STEN on lead 305.

Bit 2 is the backward read bit. When it is zero register 300 produces the signal H BKWD on lead 307 to control backward reading.

Bit 3 is the compression mode signal. When it is a 1 it signals the compression mode and when it is a zero it signals the decompression mode.

Bit 4, when it is a 1, disables the compression/decompression system so that the only data path between channel buffer 110 and IPI 112 is a data bypass bus (not shown). When bit 4 is a 0, the compression/decompression circuits are actively connected between buffer 110 and IPI 112.

Bit 5 is the Start Tape bit. When it is a 0 the register 300 produces the signal H STARTAPE which allows the tape buffer controls 106 to send data to IPI 112 during a compression operation. When the bit is a 1 circuits are disabled to prevent data from being set from the buffer controls to the IPI during compression. Preferably, at the start of a data compression operation bit 5 is set to 1 but is set to 0 after compression has proceeded long enough to optimize the balance between compression and performance.

Before a compression or decompression operation the reset bit 0 of control register 300 may be toggled, i.e. set and then reset, to clear various registers and flip-flops throughout the compression/decompression system. When the bit is set, the output of the register 300 passes through OR 312 and at CLK3 FF 314 is reset to produce H CLR for clearing the compression/decompression system to an intial state.

The outputs from stages 3 and 4 of register 300 are applied to an AND 302 and a NAND 304. AND 302 produces a signal to set FF 310 to produce the signal H COMP1 and NAND 304 produces the signal L COMP2A when the system is to operate in the decompression mode. The output of stage 3 is inverted at 306 and applied to AND 308. The output of stage 4 is applied to the second input of AND 308 so that it produces the signal H COMP when the system is to operate in the compression mode.

Figure 2:
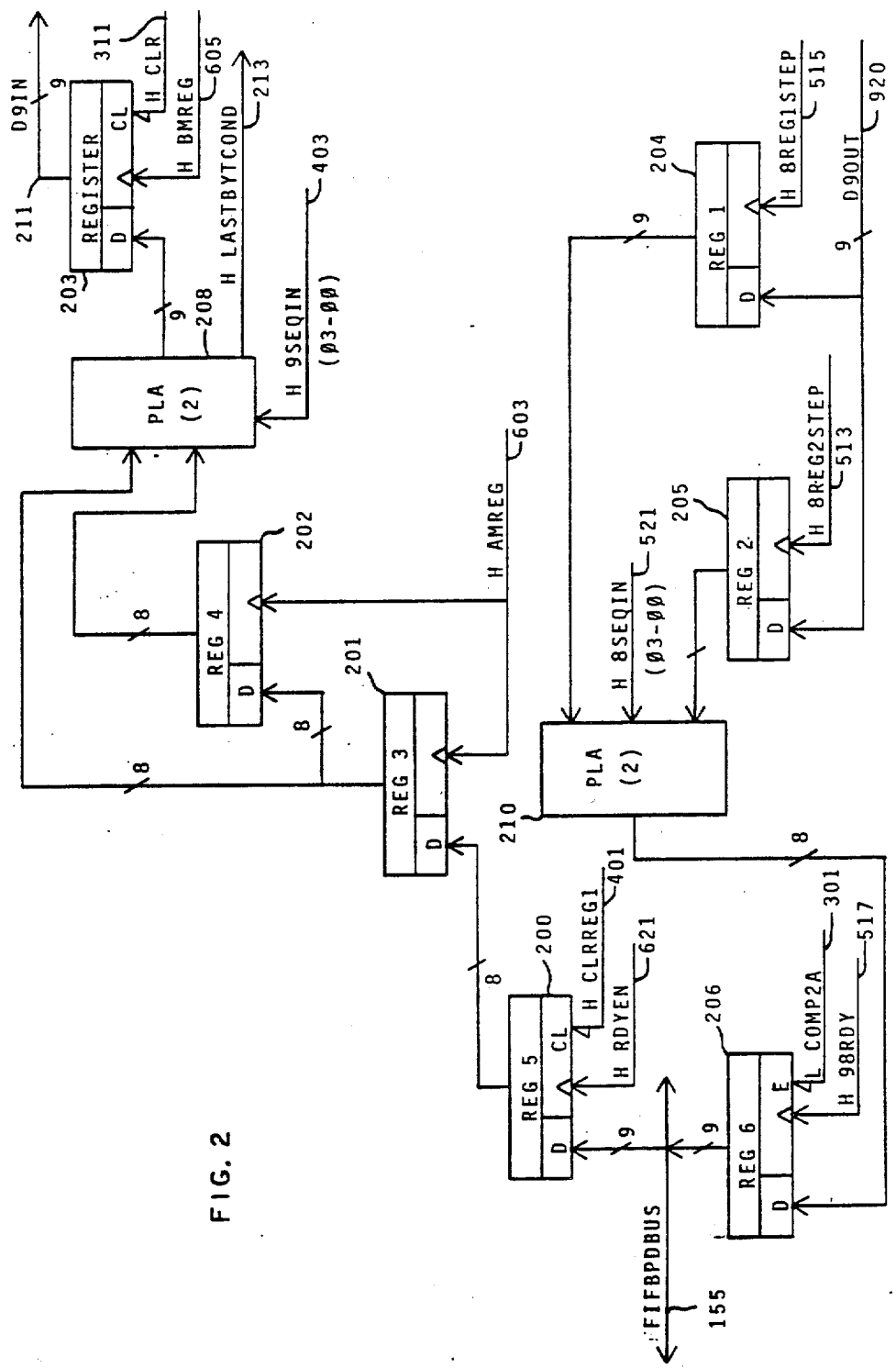
FIG. 2 is a block diagram showing the data paths through a channel chopper.

FIG. 2 is a register level block diagram of one of the channel choppers 100. The channel chopper includes seven registers 200-206 and two groups of programmable logic arrays (PLA) 208 and 210. Each group contains two PLAs. During compression data bytes received from the channel buffer 110 over the bus FIFBP-DBUS are clocked into register 200. At the output of the register the parity bit is checked by a circuit (not shown) and the parity bit is discarded. The remaining eight bits are transferred to register 201. The output of register 201 is connected to PLAs 208 and to register 202 whose output is also connected to the PLAs. The PLAs reform the 8-bit bytes into 9-bit bytes which are entered into register 203. From register 203 the data is transferred over the D9IN bus to the C/D controls 102.

During data decompression, 9 bit bytes (words) received over the D9OUT bus from the C/D controls 102 are entered into registers 204 and 205. The outputs of these registers are connected to PLAs 210 which reform the data as 8-bit bytes.

The parity of each byte produced by PLAs 210 is generated by a parity generator (not shown) and each byte and its parity is entered into register 206 from whence it passes over the bus FIFBPDBUS to the channel buffer 110.

The sequencing of the channel chopper is controlled by two PLAs 400 and 402 during a compression operation and by two PLAs 500 and 502 during a decompression operation.

Channel Chopper Compression Logic Circuits

Figure 4:
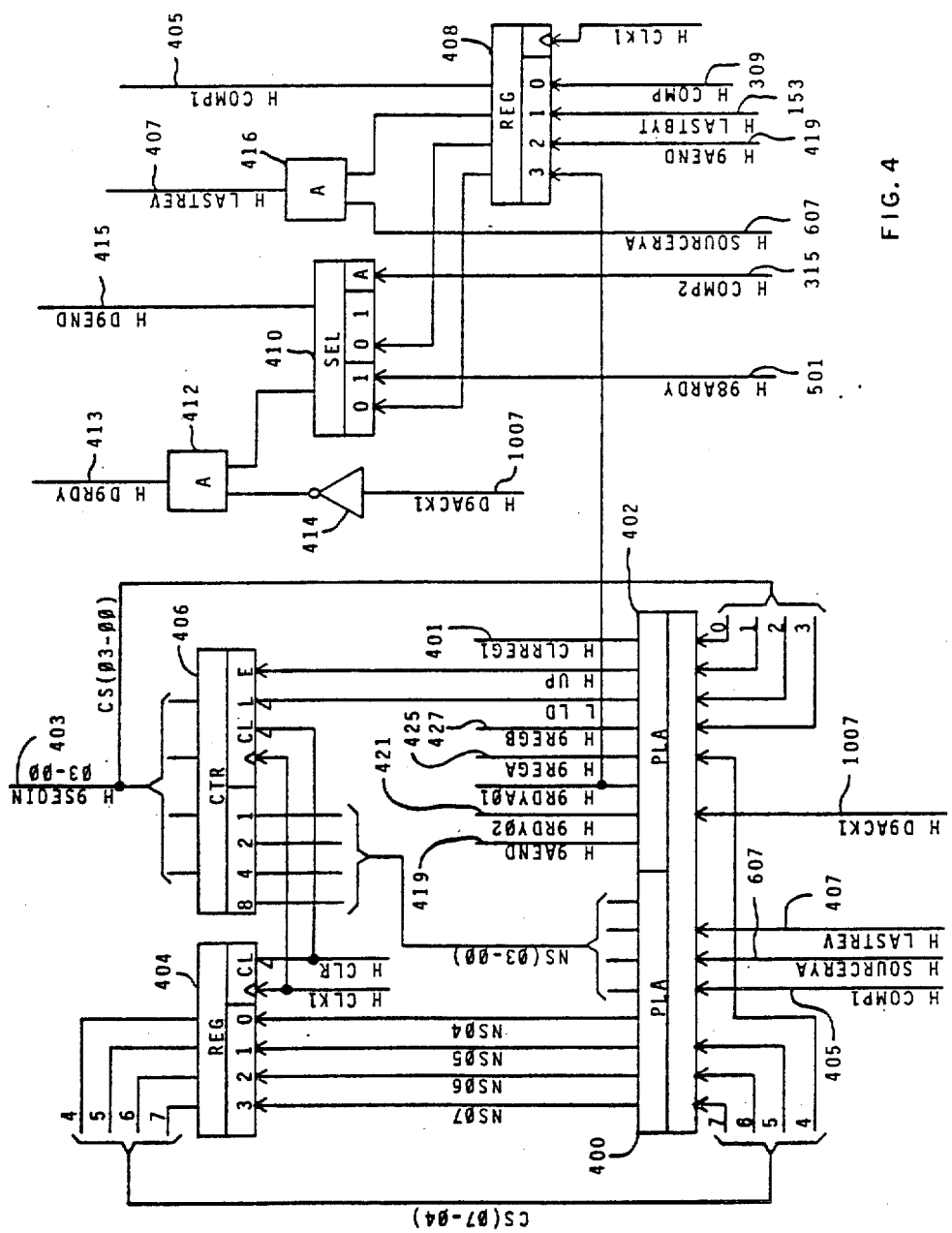
Figure 5:
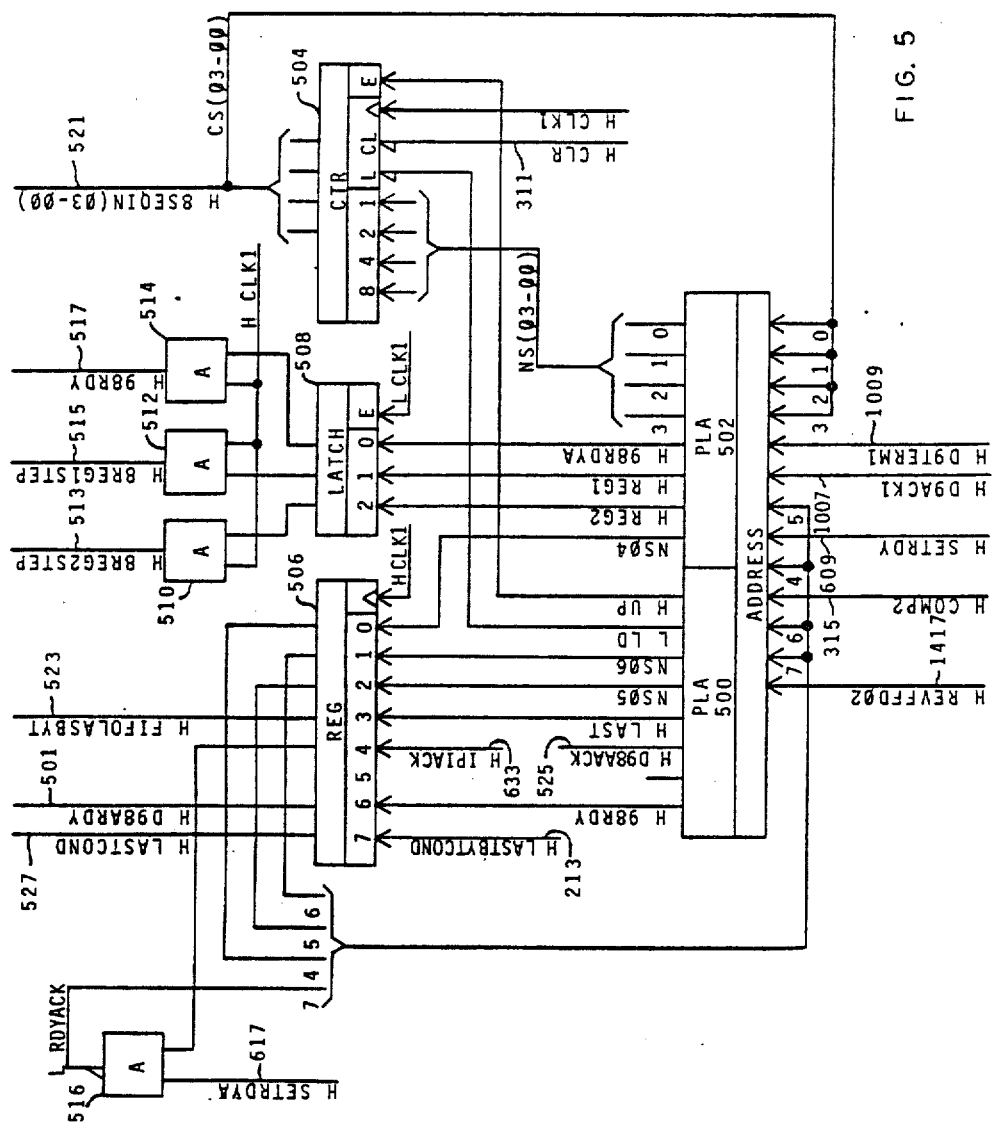

Referring to FIG. 4, PLAs 400 and 402 receive a plurality of input signals and, depending upon which signals are active, they produce a combination of output signals which are sampled at the next CLK1 to drive the logic circuit and develop some of the next input signals to the PLAs.

PLA 400 produces the signals NS (∅7-∅∅) for defining the next state of the logic circuits. These signals are applied to the inputs of register 404 and counter 406. The output signals CS (∅3-∅∅) from counter 406 are applied to inputs of PLAs 400, 402 and define the current state. The outputs NS (∅7-∅4) from PLA 400 are clocked into register 404 at each CLK1 and the outputs from the register determine (with the outputs from counter 406) the logic state until the next CLK1.

The counter 406 may be loaded at CLK1 with the outputs NS (∅3-∅∅) from PLA 400 if the signal LD is active (low). This is the only low active output of PLA 402, the other outputs all being active high. Alternatively, the count in counter 406 may be incremented at CLK1 if the signal UP from PLA 402 is active.

PLA 402 produces the signal H 9RDYA 02 on lead 421 whenever the channel chopper is ready to accept another 8-bit data byte from channel buffer 110. In FIG. 6, H 9RDYA 02 is applied to an AND 604. If the channel buffer 110 (FIG. 2) has placed a byte of data on FIFBPDBUS the FF 612 will be in a reset condition to enable the AND 604. The output of AND 604 sets FF 606 to generate the signal H SOURCERYA. This signal is applied to NAND 608 and to PLAs 400 and 402. The FF 606 also produces a signal which is applied to NOR 610 to inhibit the clearing of FF 612.

When FF 606 is reset, it enables NAND 608 which is also receiving the signal H DIFIFTOBUSRDY from the channel buffer 110 if the buffer has placed a byte of data on FIFBPDBUS. The output of NAND 608 sets FF 612 thus blocking AND 604.

The output of NAND 608 is the signal L RDYENA which is applied over lead 619 to the buffer control circuits where it increments a counter 1630 which counts the number of bytes of data received by the compressor. L RDYENA is also inverted at 614 to generate H RDYEN on lead 621. This signal is applied to register 200 to gate the byte of data on FIFBPDBUS into the register. At the same time, the output of NAND 608 sets FF 616 and the FF produces an output which acts through a driver 602 to generate H BUSWTACK. This signal is transmitted back to the channel buffer 110 where it causes the buffer to drive H DIFIFTOBUSRDY false, load a new byte of data on FIFBPDBUS, and again make H DIFIFTOBUSRDY true. When H DIFIFTOBUSRDY goes false it clears FF 616 thus terminating H BUSWTACK on lead 613, and blocks NAND 608 thus driving L RDYENA and H RDYEN false.

If PLA 402 generates H 9RDYA 02 while FF 612 is set H 9RDYA 02 is blocked at AND 604 by the low output from FF 612. At CLK1 FF 606 is reset to drive H SOURCERYA false and enable CLK2 to clear FF 612.

PLA 402 produces the signal H 9REGA on lead 425 when data in registers 200 and 201 is to be transferred to registers 201 and 202. H 9REGA is latched into register 618 at CLK1 and the output of the register is ANDed at 622 with CLK1 to produce H AMREG. In FIG. 2, this signal clocks the data from register 200 into register 201 and the data in register 201 into register 202.

PLA 402 produces the signal H 9REGB on lead 427 when the 9-bit output of PLAs 208 is to be loaded into the register 203. H 9REGB is latched into register 618 at CLK 1 and the output of the register is ANDed at 622 with CLK 1 to produce H BMREG. In FIG. 2, this signal clocks the data from PLAs 208 into register 203.

PLA 402 produces the signal H 9RDYA ∅1 when the channel chopper has loaded the register 203 and is ready to signal the C/D controls 102 that a byte of data is available on the D9IN bus 211. H 9RDYA ∅1 is gated into stage 3 of register 408 at CLK 1. The output of stage 3 is applied to selector 410. H COMP2 on lead 315 is false during the compression mode so H 9RDYA ∅1 passes through the selector and is applied to AND 412. The signal H D9ACK1 on lead 1007 is an acknowledge signal produced by the C/D control 102. When it is false it is inverted at 414 and enables AND 412 which then produces the signal H D9RDY on lead 413. This signal is transmitted to the C/D controls 102 to inform them that a data byte is present on the D9IN bus 211. When the C/D controls 102 accept the byte of data they generate H D9ACK1. In FIG. 4, this signal causes H D9RDY to go false. H D9ACK1 is also applied to PLAs 400 and 402.

The signal H 9AEND is prodcued at the end of a compression operation to inform the C/D controls 102 that the channel chopper 100 has transmitted the last byte of data. H 9AEND is clocked into register 408 and the output of the register passes through selector 410 to generate H D9END on lead 415. H D9END s then transmitted to the C/D controls 102.

When the channel buffer 110 has transmitted the last byte of data to the channel chopper, and after H DIFIFTOBUSRDY goes false, the signal H LASTBYT is applied to stage 2 of register 408 from the channel buffer 110. At CLK1 the signal is clocked into the register and the register produces a signal to enable AND 416. If the signal H SOURCERYA on lead 607 is true, AND 416 produces the signal H LASTREV which is applied to the PLAs 400 and 402.

Figure 12:
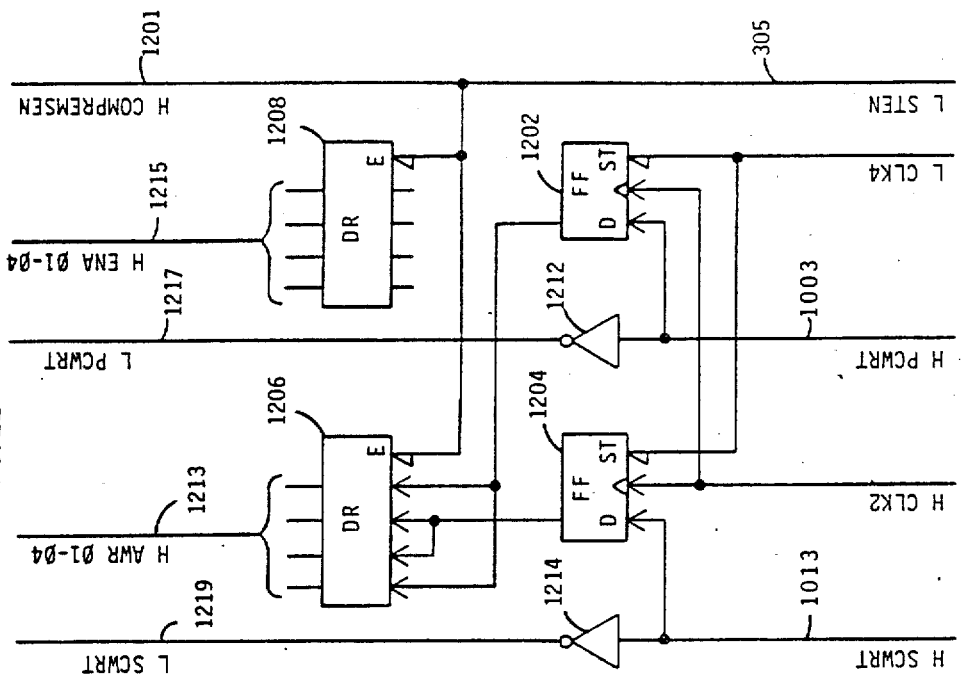
FIG. 12 illustrates logic for controlling the string table.

A compression operation is initiated when the controller 118 addresses control register 300 and loads it with a value so that the signals H COMPRESSEN, H COMP, and L STEN are all true. In FIG. 12, L STEN controls the string table enabling circuits so that they may respond to signals from the C/D controls 102. The signal H COMPRESSEN is also applied to FIG. 6 where it is inverted at 600 and applied as an enabling signal for the set of drivers 602. The signal H COMP is applied to register 408 and is clocked into the register at each CLK1. Register 408 then produces the signal H COMP1 which is applied to the PLAs 400 and 402. The H COMP1 signal is the activating signal for the PLAs and must be true throughout a compression operation.

Channel Chopper Compression Logic States State ∅∅. Before H COMP1 goes true, the channel chopper compression logic is in state ∅∅. In this state the only active output from PLAs 400 and 402 is the signal LD. Since all outputs from PLA 400 are inactive, register 404 and counter 406 are loaded with the value ∅∅ at each CLK1.

When H COMP1 goes true, PLA 400 outputs the value 3 to register 404 while PLA 402 outputs the signals H 9RDYA ∅2 and L LD. At CLK1 the value 3∅ is clocked into register 404 and counter 406 to signal state 3∅. At the same time, H 9RDYA ∅2 causes the circuits of FIG. 6 to produce H SOURCERYA and H RDYEN as previously described. H RDYEN clocks the first 9-bit byte of data from the channel buffer 110 into register 200.

State 3∅. As long as H COMP1 and H SOURCERYA are true and H LASTREV is false, the logic remains in state 3∅. PLA 400 outputs the value 3 to register 404 and PLA 402 generates the signal H 9RDYA ∅2 which is blocked at AND 604.

If H LASTREV should go true before H SOURCERYA goes false it means that the channel buffer has no data to send so the logic advances to an ending sequence. PLA 400 outputs the value 62 to register 404 and counter 406 and PLA 402 produces the signals H 9AEND and L LD. H 9AEND causes H D9END on lead 415 to be applied applied to the compression/decompression controls to initiate an ending sequence. CLK1 clocks the value 62 into register 404 and counter 406 so that the next logic state is the end state 62.

If H SOURCERYA goes false, PLA 400 outputs the value 3 to register 404 while PLA 402 produces the signals H 9RDYA ∅2, H 9REGA and UP. H 9REGA causes the signal H AMREG to be produced on lead 603 and this signal clocks the first byte of data from register 200 into register 201. Concurrently, H 9RDYA ∅2 causes the circuits of FIG. 6 to generate H SOURCERYA, H BUSWTACK and H RDYEN. The signal H RYDEN causes the second byte of data from the channel buffer 110 to be gated into register 200 and H BUSWTACK informs the channel buffer that the data has been accepted. The value 3 is entered into register 404 and the signal UP causes counter 406 to be incremented so that the next state is 31.

State 31. The logic remains in state 31 as long as H COMP1 and H SOURCERYA are true and H LASTREV is false. PLA 400 outputs the value 3 while PLA 402 produces the signal H 9RDYA ∅2 which is blocked at and 604.

If H LASTREV goes true before H SOURCERYA goes false, PLA 400 outputs the value 5 to register 404 and PLA 402 produces H CLRREG1 to clear register 200. At CLK1 the logic advances to state 5X where X is the count (1) in counter 406. From state 5X an ending sequence is performed as subsequently described.

If H SOURCERYA goes false and H LASTREV is false, PLA 400 outputs the value 32 to register 404 and counter 406 while PLA 402 generates the signals H 9REGA and LD. LD loads counter 406 with the value 2 from PLA 400 at CLK1 and at the same time the value 3 from PLA 400 is entered into register 404. The count in the counter 406 is applied to PLAs 208 to form the first 9-bit byte of data from the bytes in registers 202 and 201. H 9REGA causes H AMREG to be generated on lead 603 and this signal gates the first data byte from register 201 into register 202 and the second data byte from register 200 into register 201.

State 32. In state 32, PLA 400 outputs the value 7 to register 404 while PLA produces the signals H 9RDYA ∅2, H 9RDYA ∅1, H 9REGB and UP. The UP signal increments counter 406 to 3 so that the next state will be 73. H 9REGB causes the signal H BMREG to be generated to gate the first 9-bit word from PLAs 208 into register 203. H 9RDYA ∅1 causes the signal H D9RDY to be applied over lead 413 to the C/D controls 102 to signal them that a word of data is present on the bus 211. H 9RDYA ∅2 causes H RYDEN and H BUSWTACK to go true as previously described to gate the next data byte into register 200 from FIFBPDBUS and send an acknowledge signal to the channel buffer 110.

State 7X. The logic remains in state 7X until such time as the C/D controls 102 accept the byte of data on bus 211 and generate the acknowledge signal H D9ACK1. The particular output signals generated during this interval depend on the conditions of the control signals applied to PLAs 400 and 402.

If H SOURCERYA are true and H LASTREV is false, PLA 400 outputs the value 7 to register 404 while PLA 402 produces H 9RDYA ∅2 and H 9RDYA ∅1. AND 604 blocks H 9RDYA ∅2 but H 9RDYA ∅1 causes H D9RDY on lead 413 to again inform the C/D controls 102 that a word of data is ready for transfer over bus 211. The count in counter 406 does not change.

If H SOURCERYA is false then PLA 400 outputs the value 7 to register 404 and PLA 402 produces the signal H 9RDYA ∅1 to thereby generate the signal H D9RDY on lead 413. The count in counter 406 does not change.

If H SOURCERYA and H LASTREV are true, PLA 400 outputs the value 7 to register 404 while PLA 402 produces the signals H 9RDYA ∅2 and H 9RDYA ∅1. H 9RDYA ∅2 is blocked by AND 604 but H 9RDYA ∅1 again causes H D9RDY to be sent over lead 413 to the C/D controls 102. The count in counter 406 does not change.

When the C/D controls 102 accept the first word of data on bus 211 and return H D9ACK1 on lead 1007, the particular output signals generated by PLAs 400 and 402 are determined by the states of the other control signals applied to the PLAs.

If H LASTREV is true and state 7X (where X is less than 9) is present in register 404 and counter 406, PLA 400 outputs the value 5 to register 404 and PLA 402 produces H CLRREG1 to clear register 200. At CLK1 the logic advances to state 5X where X is the count (3 to 8) in counter 406. State 5X is the start of an ending sequence subsequently described. Exactly the same signals are produced if the state is 79 and H SOURCERYA and H LASTREV are true.

If H SOURCERYA is true and H LASTREV is false PLA 400 outputs the value 1 to register 404 while PLA 402 produces the signal H 9RDYA ∅2 which is blocked at AND 604. At CLK1 the value 1 is gated into register 404 but the count in counter 406 remains unchanged so that the next state is 1X.

If H SOURCERYA and H LASTREV are false PLA 400 outputs the value 2 to register 404 while PLA 402 produces the signals H 9RDYA ∅2 and H 9REGA. At CLK1 H 9REGA and H 9RDYA ∅2 cause H AMREG and H RDYEN to be produced on leads 603 and 621 to shift the data in registers 200 and 201 into registers 201 and 202 and clock another byte of data into register 200. CLK1 gates the output of PLA 400 into register 404 but the count in counter 406 remains unchanged so that the next state is 2X.

State 1X. When the logic enters state 1X it remains in that state as long as H SOURCERYA is true and H LASTREV is false. PLA 400 outputs the value 1 to register 404 while PLA 402 generates H 9RDYA ∅2 which is blocked at AND 604.

If H LASTREV goes true PLA 400 outputs the value 5 to register 404 and PLA 402 produces H CLRREG1 to clear register 200. At CLK1 the logic advances to end sequence state 5X where X is the count in counter 406.

When H SOURCERYA goes false, PLA 400 outputs the value 2 while PLA 402 produces the signals H 9RDYA Ø2 and H 9REGA. At CLK 1 H 9REGA and H 9RDYA cause H AMREG and H RDYEN to be produced to shift the data in registers 200 and 201 into registers 201 and 202 and clock another byte of data into register 200. CLK1 gates the output of PLA 400 into register 404 but the count in counter 406 remains unchanged so that the next state is 2X.

From state 1X the logic moves to state 29 if the count in counter 406 stands at 8. The reason for this is that eight nine-bit words are formed from each nine eight-bit bytes so after every eighth nine-bit word there must be an extra shift into registers 201 and 202. If counter 406 does not contain a count of 8 the logic proceeds to state 2X as indicated above.

State 2X. In state 2X, (X is not 9) PLA 400 outputs the value 7 while PLA 402 produces the signals H 9RDYA Ø2, H 9RDYA Ø1, H 9REGB and UP. At CLK1 these signals generate the gating signals that clock the registers 200-204 to place a new word of data on D9IN bus 211 and load a new byte of data from FIFBPDBUS into register 200. In addition H 9RDYA Ø1 causes H D9RDY to be generated on lead 413 to inform the C/D controls that a byte of data is available on bus 211. The signal UP causes the count in counter 406 to be incremented at CLK1 at the same time the value 7 is clocked into register 404. The logic thus returns to state 7X where X is the value in counter 406 and is one greater than the last time state 7X was executed.

State 29, In state 29, PLA 400 outputs the value F while PLA 402 generates the same signals as it does in state 2X. This causes a byte of data to be entered into register 203, the contents of registers 200 and 201 to be entered into registers 201 and 202, and a word of data from FIFBPDBUS to be clocked into register 200. H D9RDY is generated on lead 413 to tell the C/D controls 102 that a word of data is present on bus 211. The signal UP causes counter 406 to be incremented to A as the value F is clocked into register 404 so that the next state is FA.

State FA. The logic remains in state FA until the C/D circuits accept the word of data on bus 211 and respond by making H D9ACK1 true. If H SOURCERYA is true and H LASTREV is false, PLA 400 outputs the value F to registers 404 and PLA 402 produces the signals H 9RDYA Ø2 and 9RDYA Ø1. H 9RDYA Ø2 is blocked at AND 604 but H 9RDYA Ø1 causes H D9RDY to be sent to the C/D controls. At CLK1 the value F is entered into register 400 and counter 406 retains its count of A.

If H SOURCERYA is false, PLA 400 outputs the value F to register 404 and PLA 402 produces the signals H 9RDYA Ø1 and H 9REGA. At CLK1 H RDYEN goes true on lead 413 to clock a byte of data from FIFBPDBUS into register 200 and H AMREG goes true to clock the contents of registers 200 and 201 into registers 202 and 203. In addition, H D9RDY is generated and sent to the C/D circuits. The value F is entered into register 404 and counter 406 retains its count of A.

If H SOURCERYA and H LASTREV are both true PLA 400 outputs the value F to register 404 and PLA 402 generates the signals H 9RDYA Ø2 and H 9RDYA Ø1. H 9RDYA Ø2 is blocked at AND 604 but H 9RDYA Ø1 causes H D9RDY to be sent to the C/D controls over lead 413. Counter 406 retains a count of A.

When the C/D controls accept the word of data on bus 211 and generate the response H D9ACK1, the logic may proceed to state 3Ø, state 31 or state 62.

If H SOURCERYA is true and H LASTREV is false, PLA 400 outputs the value 3Ø to register 404 and counter 406. PLA 402 generates the signal H 9RDYA Ø2 which is blocked at AND 604 and the signal LD which enables counter 406. At CLK1 the value 3Ø is entered into register 404 and counter 406.

If H SOURCERYA and H LASTREV are false, PLA 400 outputs the value 31 to register 404 and counter 406. PLA 402 generates the signals H 9RDYA Ø2, H 9REGA and LD. H 9REGA generates H AMREG on lead 603 to shift the contents of registers 200 and 201 into registers 201 and 202. H 9RDYA Ø2 generates H RDYEN to gate a byte of data from FIFBPDBUS into register 200. At CLK1 the value 31 is entered into register 404 and counter 406.

If H LASTREV is true then PLA 400 outputs the value 62 to register 404 and counter 406. PLA 402 generates the signals H 9AEND and LD. H 9AEND is gated into register 408 by CLK1 and the output of the register passes through selector 410 to become the signal H D9END on lead 415. This signal is applied to the C/D controls to force a compression end cycle as subsequently described. CLK1 clocks the value 62 into register 404 and counter 406.

State 62. State 62 is the end state of a compression operation and when the logic enters this state it remains there until H COMP1 goes false. While H COMP1 remains true, PLA 400 outputs the value 62 to register 404 and counter 406 and PLA 402 generates the signal H 9AEND to keep the signal H D9END on lead 415 true.

State 5X. The logic remains in state 5X (where X is not equal to 8) for only one cycle during which PLA 400 outputs the value 4 to register 404 and PLA 402 produces the signals H 9REGA and H CLRREG1. At CLK1 H 9REGA causes the signal H AMREG to be applied to registers 201 and 202 to clock the bytes in registers 200 and 201 into registers 201 and 202. H CLRREG1 clears register 200. At the same time, the value 4 is clocked into register 404 so that the next state is 4X.

In state 5X, where X is equal to 8, PLA 400 makes H NS Ø7 and H NS Ø6 active while PLA 402 makes H 9RDYA Ø1, H 9REGA and H 9REGB active. This loads register 203, shifts the contents of registers 200 and 201 to registers 201 and 202, sends H D9RDY to the C/D controls, and makes the next state C8.

State C8. In state C8, with H D9ACK1 false, PLA 402 makes H 9RDYA Ø1 active to send H D9RDY to the C/D controls and PLA 400 makes H NS Ø7 and H NS Ø6 active to repeat the state.

When H D9ACK1 goes true PLA 402 makes H UP active to increment counter 406 and PLA 400 makes H NS Ø6 active so that the logic advances to state 49.

State 4X. The logic remains in state 4X (X is not 9) for only one cycle during which PLA 400 outputs the value 61 to register 404 and counter 406 while PLA 404 generates the signals H 9RDYA Ø1, H 9REGB and L LD. At CLK1 H 9REGB is latched into register 618 and AND 622 produces H BMREG to gate the last data word into register 203. At the same time, H 9RDYA Ø1 is entered into register 408 and the output of the register passes through selector 410 and AND 412 to generate H D9RDY on lead 413. This signal informs the C/D controls that a word of data is present on bus 211. The CLK1 signal clocks the value 61 into register 404 and counter 406.

If X is equal to 9 PLA 402 makes H 9RDYA Ø1 active to send H D9RDY to the C/D controls 102, H 9REGB active to load the register 203 from PLAs 208, and L LD active to load state counter 406. PLA 400 outputs the value 6F to register 404 and counter 406 to define the next state.

State 6F. If H D9ACK1 is false, PLA 400 outputs the value 6 to register 404 to repeat state 6F and PLA 402 makes h 9rdya Ø1 active to send H D9RDY to the C/D controls 102.

When H D9ACK1 goes true PLA 402 makes H 9AEND active to send H D9END to the C/D controls. PLA 402 makes L LD active and PLA 400 makes H NS Ø6, H NS Ø5, H NS Ø3, H NS Ø2 and H NS Ø1 active so that the logic advances to state 6E.

Figure 14:
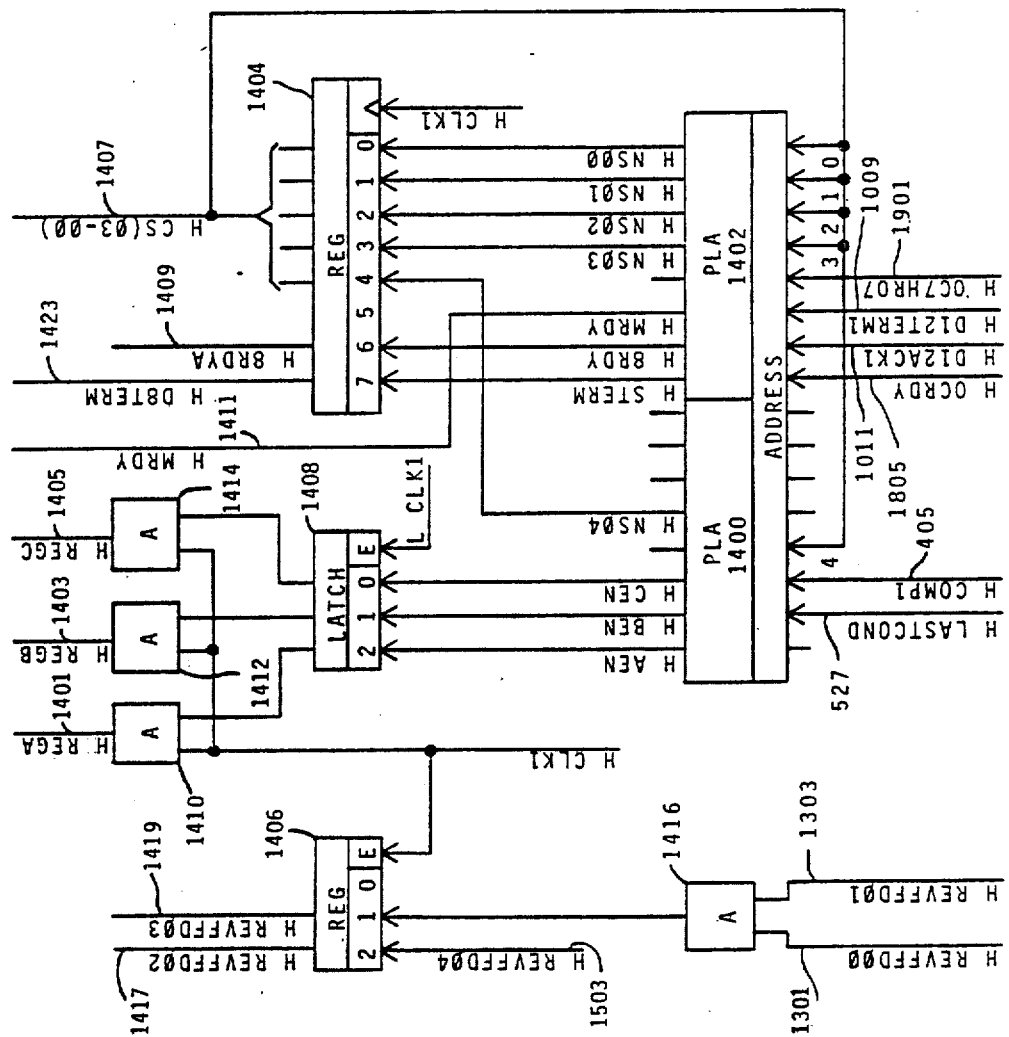
FIGS. 14 and 15 illustrate the logic for controlling a buffer chopper.

State 6E. In state 6E the PLA 208 produce the signal H LASTBYTCOND on lead 213 and this signal is entered into register 506 to generate the signal H LAST-COND which is applied over lead 527 to the buffer chopper circuits of FIG. 14. PLA 402 makes H 9AEND active so that H D9END is sent to the C/D controls 102. PLA 400 makes H NS Ø6 and H NS Ø5 active to repeat state 6E. The state is repeated as long as H COMP1 remains true.

State 61. The logic remains in state 61 until C/D controls 102 accept the data byte on bus 211 and generates H DACK1 on lead on lead 1007. During this interval PLA 400 outputs the value 6 to register 404 and PLA 402 generates H 9RDYA Ø1 so that at CLK1 the value 6 is entered into register 404 and the signal H D9RDY is sent to the C/D controls. When the C/D controls respond by generating H DACK1, PLA 400 applies signals representing the value 6 to register 404 while PLA 402 generates the signal UP. At CLK1, the value 6 is entered in register 404 and the count in counter 406 is incremented so that the next logic state is the state 62 previously described.

Channel Chopper Decompression Logic Circuits

PLAs 500 and 502 control the operation of channel chopper 100 during a decompression operation. PLA 502 produces the next state signals NS (Ø3-ØØ) which are applied to state counter 504. The state signals are clocked into counter 504 by CLK1 if the signal L LD is made active by PLA 500. Alternatively, the counter 504 may be incremented by CLK1 if PLA 500 makes the signal H UP true. The counter produces the current state signals CS (Ø3-ØØ) which are applied to PLAs 500 and 502. The output of the counter is also applied over leads 521 to PLAs 210.

PLA 502 also produces the next state signal NS Ø4 and PLA 500 produces the next state signals NS Ø5 and NS Ø6. These signals are applied to a register 506 and are clocked into the register by CLK1. The resulting output signals from the register are the current state signals CS Ø6-CS Ø4 which are applied to the inputs of PLAs 500 and 502. The current state signals CS Ø6-CS ØØ produced by counter 504 and register 506 define the current state of the logic circuits during a compression operation.

PLAs 502 produces the signals H REG1, H REG2 and H 98RDYA to clock data into the registers 204, 205 and 206. The signals pass through latch register 508 to enable three ANDs 510, 512, and 514. At CLK1 the signals are latched in register 508. At the same time, CLK1 is applied to ANDs 510, 512, and 514. The output of AND 514 is the signal H 98RDY which is applied to register 206 to clock a byte of data from PLAs 210 into the register. The outputs of ANDs 512 and 510 are the signals H 8REG1STEP and H 8REG2STEP, respectively, which are applied to registers 204 and 205, respectively, to clock data on the D9OUT bus into the registers.

PLA 500 produces the signal H LAST when the last byte of decompressed data has been placed on the FIFBPDBUS 155. H LAST is clocked into register 506 by CLK1 and the register produces the signal H FIFO-LASBYT on lead 523. In FIG. 6, this signal passes through a driver 602 to generate H FIFLASSY on lead 615. H FIFLASSY is applied to the channel buffer 110 and backward read circuits 116 to signal that the last byte of decompressed data has been transmitted.

PLA 500 makes the signal H D98AACK active in order to inform the channel buffer 110 or backward read circuits 116 that a byte of decompressed data is available on the FIFBPDBUS 155. H D98AACK is applied to one input of AND 630. Assuming that H BPBUSTOFIFACK on lead 157 is false, the output of inverter 632 enables the second input of AND 630. The AND produces an output signal which sets FF 634 at CLK2. The output of FF 632 causes a driver 602 to produce the signal H RDY on lead 611. This signal is transmitted to the channel buffer 110 and backward read circuits 116 as an indication that a byte of data is available on the FIFBPDBUS 155. In response to the signal H RDY, the channel buffer 100 or backward read circuits 116 accepts the byte of data and raises the signal H BPBUSTOFIFACK on lead 157 to block AND 630. At the next CLK2 FF 634 is reset thus terminating H RDY. In response, the channel buffer 110 or backward read circuits 116 cause H BPBUSTOFIFACK to go false.

When H BPBUSTOFIFACK is false, inverter 632 produces the signal H IPIACK which is applied over lead 633 to stage 4 of register 506. The register produces an output signal from stage 4 to enable one input of AND 516. The second input of AND 516 is the signal H SETRDYA which is generated by FF 617. Thus, if the channel buffer 110 or the backward read circuit 116 is not ready to accept a byte of data and the channel chopper has not set FF 64 to generate H RDY, and 516 produces an output signal L RDYACK which is applied to PLAs 500 and 502. On the other hand, if FF 634 is set to thereby indicate that a byte of data is on the FIFBPDBUS, the signal H SETRDY produced by FF 634 is true and this signal is applied to PLAs 500 and 502.

PLA 500 produces the signal H 98RDY when the channel chopper 100 is ready to receive another byte of data from the C/D controls 102. H 98RDY is clocked into 506 by CLK1 and the register generates H D98ARDY on lead 501. In FIG. 4, H D98ARDY passes through selector 410 (H COMP2 is true) and enables one input of AND 412. When H D9ACK1 goes false (for 100 ns at the start of decompression or when the C/D controls have placed a byte of data on the D9OUT bus) AND 412 generates H D9RDY to indicate to the C/D controls that the channel chopper is ready to receive a byte of data. The C/D controls respond by placing a byte of data on the D9OUT bus and raising H D9ACK1 on lead 1007. This terminates H D9RDY which in turn terminates H D9ACK1.

Channel Chopper Decompression Logic States

State ØØ. H COMP2 on lead 315 is the signal which activates the PLAs 500 and 502 for decompression H COMP2 on lead 315 must be true throughout the decompression operation. Also, the control register 300 must be loaded so that the circuits of FIG. 3 generate L COMP2A on lead 301 to enable register 206, H COMPRESSEN on lead 313 to enable drivers 602, and L STEN to enable the string table circuits of FIG. 12.

Prior to the time H COMP2 goes true, the only active output from PLA 500 is the signal L LD which enables the loading of counter 504. Since all other outputs from PLAs 500 and 502 are false, state ØØ is loaded into register 506 and counter 504 at each CLK1 so that the state is repeated. When H COMP2 goes true the logic remains in state ØØ until the C/D controls raise H D9ACK1 on lead 1007. At this time PLA 500 makes H 98RDY, H NS Ø5 and L LD active while PLA 502 generates H NS Ø4. H 98RDY cause H D9RDY to be transmitted to the C/D controls 102 as previously described. L LD loads zeros into counter 504. Therefore, register 506 and counter 504 output signals representing 3Øas the next logic state.

H D9TERM1 should be true because the C/D controls have no words to send, PLA 500 makes the signals H LAST, H NS Ø5 and L LD active while PLA 502 makes H NS Ø4, H NS Ø1 and H NS ØØ true. H LAST causes H FIFLASSY to be sent over lead 615 to the channel buffer 110 and backward read circuits 116 to signal that there are no more bytes to transfer. The logic advances to end state 33.

State 3Ø. The logic waits in state 3Ø for either H D9ACK1 to go true, signalling that the C/D controls 102 have placed a word on the D9OUT bus, or H D9TERM1 to go true, signalling that the C/D controls have transmitted the last word to the channel chopper 100.

During the wait, PLA 500 makes H 98RDY and NS Ø5 active on each cycle while PLA 502 makes H NS Ø4 active. Thus, H D9RDY is sent to the C/D controls and state 3Øis repeated.

If H D9ACK1 goes true PLA 500 makes the signals L LD and H N Ø5 active while PLA 502 makes H NS Ø4, H REG1 and H NS ØØ active. The byte of data on the D9OUT bus is clocked into register 204 and the logic moves to state 31.

If H D9TERM1 goes true PLA 500 generates L LD, H NS Ø5 and H LAST while PLA 502 generates H NS Ø4, H NS Ø1 and H NS ØØ. H LAST causes H FIFLASSY to be sent to the channel buffer 110 and backward read circuits 116 and the logic advances to ending state 33.

State 31. In state 31 PLA 500 generates H 98RDY so that H D9RDY is sent over lead 413 to the C/D controls. The PLA 500 also makes H D98AACK active to send the signal H RDY to the channel buffer and backward read circuit to indicate that a byte of data is on the FIFBPDBUS 155. PLA 502 makes H 98RDYA active so that a byte of data is clocked from PLAs 210 into register 206 so that it is available on the bus. The PLAs make H NS Ø4 and H UP active so that the next state is 1X where X is now 2.

State 1X. The logic waits in state 1X for the C/D controls 102 to raise the signal H D9ACK1 on lead 1007 signalling that a second word has been placed on the D9OUT bus 920 or raise the signal H D9TERM1 on lead 1000 to signal that the last word has been placed on the bus. The output signals produced by PLAs 500 and 502 vary depending upon whether AND 516 is producing the signal L RDYACK or FF 634 is producing the signal H SETRDY.

If H SETRDY is true and L RDYACK is false, PLA 500 generates H D98AACK and H 98RDY to signal the channel buffer 110 (or read backward circuits 116) that a byte of data is on the FIFBPDBUS and signal the C/D controls that the channel chopper is ready to accept another word. PLA 502 generates only H NS Ø4 and since the count in counter 504 does not change, state 1X is repeated.

If H SETRDY is false and L RDYACK is false, or if H SETRDY and H D9TERM1 are false and L RDYACK is true, then PLA 502 generates only H 98RDY so that H D9RDY is sent to the C/D controls 102. PLA 502 generates only H NS Ø4 so that state 1X is repeated.

If H D9TERM1 goes true PLA 500 makes H LAST, L LD and H NS Ø5 active while PLA 502 makes H NS Ø4, H NS Ø1 and H NS ØØ true. H LAST causes H FIFLASSY to be transmitted over lead 615 to the channel buffer 110 and backward read circuits 116 as an indication that the channel chopper has transmitted the last byte. H NS Ø5, H NS Ø4, H NS Ø1, H NS ØØ and L LD cause the logic to step to the ending state 33.

When H D9ACK1 goes true while the logic is in state 1X, the output signals produced by PLAs 500 and 502 depend on the state of the signals H SETRDY and RDYACK and whether the state is even or odd i.e. whether the signal H CS ØØ produced by counter 504 is true or false.

If L RDYACK is true and H SETRDY and H CS ØØ are false, PLA 502 generates H REG2 to read the word from the D9OUT bus into register 205. On the other hand, if L RDYACK is true, H SETRDY is false and CS ØØ is true then PLA 502 generates H REG1 to clock the word from the D9OUT bus into register 204. In either case, PLA 500 generates H NS Ø6 so that the logic moves to state 4X where X is the count retained in counter 504.

If H SETRDY is true and L RDYACK and H CS ØØ are false, PLA 502 generates H REG2 to read the word from the D9OUT bus into register 205. However, if H SETRDY, and H CS ØØ are true and L RDYACK is false, PLA 502 generates H REG1 to clock the word from the D9OUT bus into register 204. In either case, PLA 500 generates H D98AACK to cause H RDY to be sent over lead 611 to the channel buffer and backward read circuits. PLA 500 also generates H NS Ø5 so that the logic moves to state 5X.

If H SETRDY and L RDYACK are false, and H CS ØØ is false H REG2 is generated by PLA 502 so that the word on the D9OUT bus is loaded into register 205. Alternatively, if H CS ØØ is true then PLA 502 generates H REG1 so that the word on the bus is clocked into register 204. In either case, PLA 500 generates H NS Ø5 so that the next state is 5X.

State 2X. In state 2X, if L RDYACK is false PLA 502 produces no output signals. If H SETRDY is also true then PLA 500 makes H D98AACK and H NS Ø5 true to send H RDY to the channel chopper and backward read circuits and repeat state 2X. If H SETRDY is false then PLA 500 merely makes H NS Ø5 active to repeat state 2X.

If L RDYACK is true and H SETRDY is false, the signals generated in state 2X depend on whether or not X=8. If X is not equal to eight (i.e. CS ∅3 is false) PLA 500 makes H 98RDY, H D98AACK and H UP active while PLA 502 makes H NS ∅4 and H 98RDYA active. On the other hand, if X is equal to eight then PLA 500 makes H D98AACK, H NS ∅6 and H UP active. Thus, if X =8 H RDY is sent over lead 611 to the channel buffer and backward read circuits, H D9RDY is sent over lead 413 to the C/D controls, register 206 is loaded with a byte of data which is placed on the FIFBP-DBUS, and the logic steps to 1X where X is now one greater than before. If X is equal to 8-, H D98AACK caused H RDY to be sent to the channel buffer and backward read circuits and the program advances to state 59.

The different operations where X=8 result from the fact that during decompression the PLAs 210 chop 9-bit bytes into 8-bit bytes. Therefore, after 8 bytes have been read from the D9OUT bus the PLAs 210 have formed 9 bytes and there must be an extra transfer to the channel buffer and backward read circuits before the channel chopper is ready to accept another word from the C/D controls.

State 4X. State 4X is entered from state 1X as previously described. If X is not equal to 8, PLA generates H 98RDY to send H D9RDY over lead 413 to the C/D controls to indicate that the channel chopper is ready to receive another word. H D98AACK is also generated by PLA 500 to send H RDY over lead 413 to the channel buffer and backward read circuits. PLA 502 generates H 98RUYA to load a byte into register 206. PLAs 500 and 502 also make H UP and H NS ∅4 active so that the logic returns to state 1X with X being one greater than the last time state 1X was entered.

If X is equal to 8 PLA 500 makes H D98AACK, H NS ∅6 and H UP active while PLA 502 makes H NS ∅4 and H 98RDYA active. These signals cause a byte of data from PLAs 210 to be loaded into the register 206, and H RDY signal to be sent to the channel buffer and backward read circuits to inform them that a byte of data is on the FIFBPDBUS, and the counter 504 to be incremented so that the next logic stae is 59.

State 59. If L RDYACK is false and H SETRDY is true then PLA 500 generates H D98AACK and H NS ∅6 while PLA 502 generates H NS ∅4. H D98AACK causes H RDY to be sent to the channel buffer and backward read circuits and state 59 is repeated.

Except for H D98AACK, the same signals are generated by PLAs 500 and 502 when L RDYACK and H SETRDY are false.

If H REVFFD∅2, and H SETRDY are false and L RDYACK is true, PLA 500 makes H D9AACK, H NS ∅6 and L LD active while PLA 502 makes H 98RDYA, H NS ∅4, H NS φ3 and H NS ∅1 active. H 98RDYA causes a byte of data to be loaded into register 206 and H D98AACK causes H RDY to be sent to the channel buffer and backward read circuits to inform them that a byte is available on the FIFBPDBUS. L LD loads the value A (NS ∅3 and NS ∅1) into counter 504 so that the next state is 5A.

If H REVFFD∅2 and L RDYACK are true but H SETRDY is false, PLA 500 makes H NS ∅6 and L LD active while PLA 502 makes H 98RDYA, H NS ∅4, H NS ∅3, H NS ∅1 and H NS ∅∅ active. This loads the output of PLAs 210 into register 206 and loads the value B into counter 504 so that the next state is 5B.

State 5A. As long as L RDYACK is false and H SETRDY is true PLA 500 makes H D98AACK and H NS ∅6 active while PLA 502 makes H NS ∅4 active. H D98AACK attempts to set FF 634 and generate H RDY on lead 611 if H BPBUSTOFIFACK on lead 157 is false. The count in counter 504 is not changed so state 5A is repeated.

If L RDYACK is false and H SETRDY goes false, PLA 500 makes only H NS ∅6 active while PLA 502 makes only H NS ∅4 active so that state 5A is repeated.

If L RDYACK goes true and H SETRDY goes false, PLA 500 generates H 98RDY, H NS ∅5 and L LD while PLA 502 generates H NS ∅4. This cause H D9RDY to be sent to the C/D controls 102 and the logic advances to state 3∅.

State 5B. In state 5B, the logic waits for the C/D controls to send H D9TERM1 or H D9ACK1 to the channel chopper. As long as both signals are false PLA 500 generates H 98RDY so that H D9RDY is sent to the C/D controls over lead 413 to indicate that the channel chopper is ready to receive another word. PLA 500 makes H NS ∅6 active while PLA 502 makes H NS ∅4 active so that state 5B is repeated If H D9TERM1 goes true PLA 500 generates H LAST so that H FIFLASSY is sent to the channel buffer and backward read circuits over lead 615. PLA 500 makes H NS ∅5 and L LD active while PLA 502 makes H NS 4, H NS ∅1 and H NS ∅∅ active so that the next state is the end state 33.

If H D9ACK1 goes true PLA 500 generates H D98AACK, H NS ∅6 and H UP while PLA 502 generates H NS ∅4 and H REG1. Register 204 is loaded with the word from the D9OUT bus and H RDY is sent to the channel buffer and backward read circuits. Counter 504 is incremented so that the logic advances to state 5C.

State 5C. The logic waits in state 5C until L RDYACK goes true. If H SETRDY is also true then PLA 500 makes H D98AACK and H NS ∅6 active while PLA 502 makes H NS ∅4 active. H D98AACK sets FF 634 to generate H RDY if H BPBUS-TOFIFACK on lead 157 is false. State 5C is repeated.

If H SETRDY is false then PLA 520 makes H NS ∅6 active while PLA 502 makes H NS ∅4 active so that state 5C is repeated.

When L RDYACK is true and H SETRDY is false PLA 500 makes H NS ∅5 and L LD active while PLA 502 makes H NS ∅4 and H NS ∅∅ active. Therefore, the logic advances to state 31.

State 33. In ending state 33 PLA 500 produces H LAST and H NS ∅5 while PLA 502 produces H NS ∅4. State 33 is continuously repeated and on each cycle H FIFLASSY is sent to the channel buffer 110 and backward read circuits 116.

Compression/Decompression Algorithm

Figure 7:
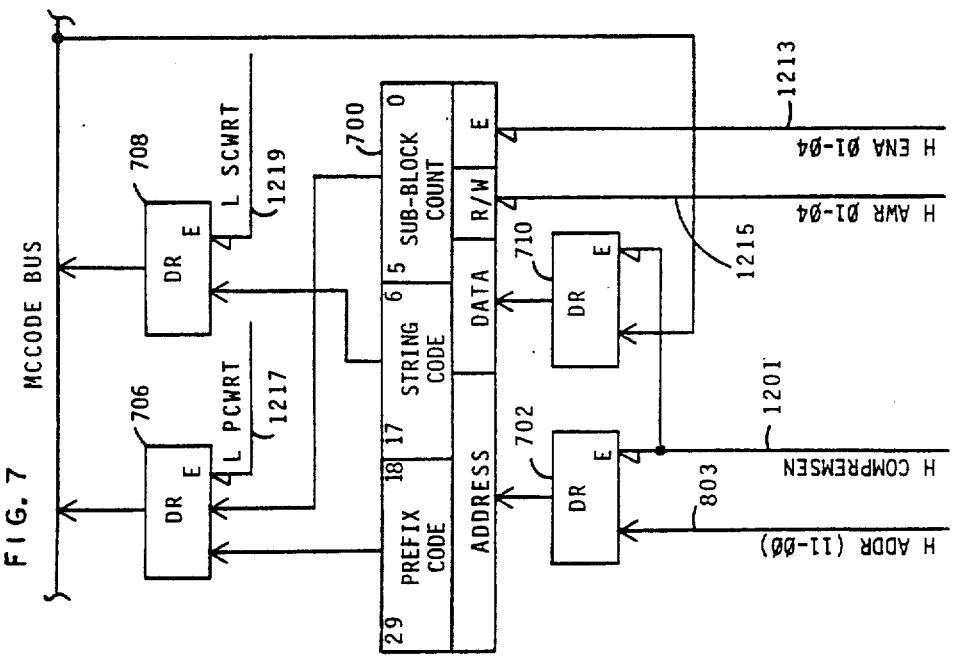
FIG. 7 illustrates a string table.

Compression is achieved in the present invention by replacing a string of two or more characters by a single string code. A new string is formed by appending one character to an old string. Thus, every legal string, no matter how long it is, can be identified by the string code previously assigned to the old string (called the prefix code) and the appended character (called the extension character). The string codes are stored in a string table 700. Each location in the string table is either "empty" (i.e. usable) or contains a string code. If it exists, the string code corresponding to the string defined by prefix code (P) and extension character (E) is stored in the location whose address is a hash of P and E. Since more than one string could hash into the same location, the prefix code P is also stored in the location to identify which string is stored therein. Thus, as shown in FIG. 7, each location of a string table 700 is capable of storing a 12-bit prefix code, a 12-bit string code and a 6-bit sub-block count. The hash function is chosen such that no two strings with the same prefix code P but different extension characters E hash into the same table address. Four hashes are available. If all four hashes fail to locate a match the string code is discarded and the character code, with a left zero extension of three bits, becomes the output of the compressor.

Initially, the only string codes which are defined are one for each input character. Since the string code is 12 bits long and the character is only 9 bits, expansion of data occurs when a character is replaced by its string code. Character codes, i.e. string codes representing single characters, are not stored in the string table but are used as prefix codes to make two-character strings.

Decompression is the process of recovering strings of characters from their string codes. Since a string code is not produced during compression until the second appearance of the string, it is possible to rebuild the string table during decompression but in a somewhat different form. The string table for compression contains the prefix code and extension character at the address given by the string code. Character codes do not address the string table. Instead, the left-extending three zeros are removed and the character is transmitted to the channel chopper. While each string is assigned to an associated prefix code during compression it is associated with an extension character during decompression. Thus, to create an entry in the decompression string table the prefix code is obtained from the compressed data and the extension character is obtained from the next string when it is decoded. This requires that a previous string code be saved in a LIFO memory to make a table entry when the next string is decoded. The strings are decompressed in reverse order and the LIFO memory is used to store the string and correct the order on output to the channel chopper 100.

C/D Control

Figure 8:
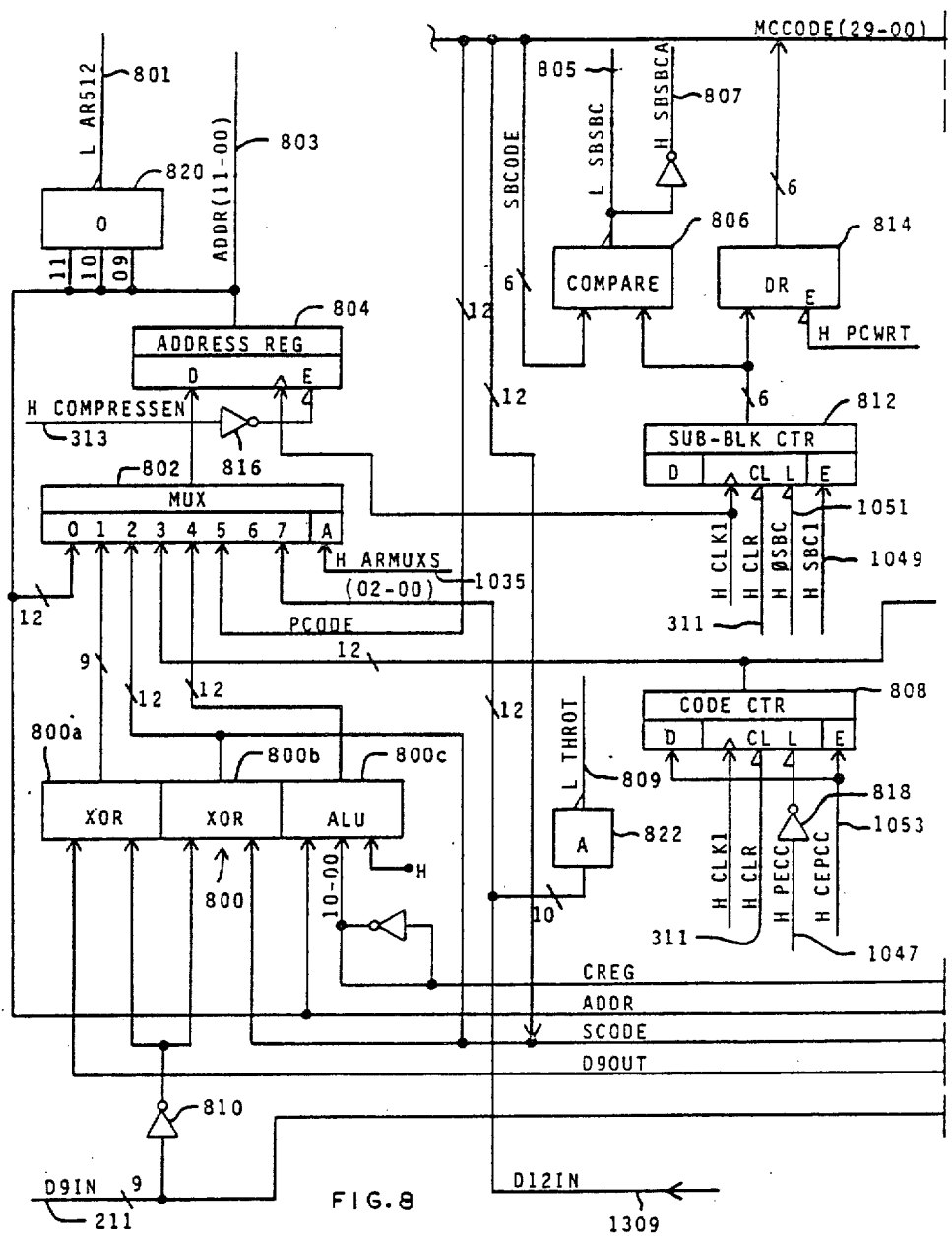
FIGS. 8 and 9 comprise a block diagram showing data paths in the C/D controls.
Figure 9:
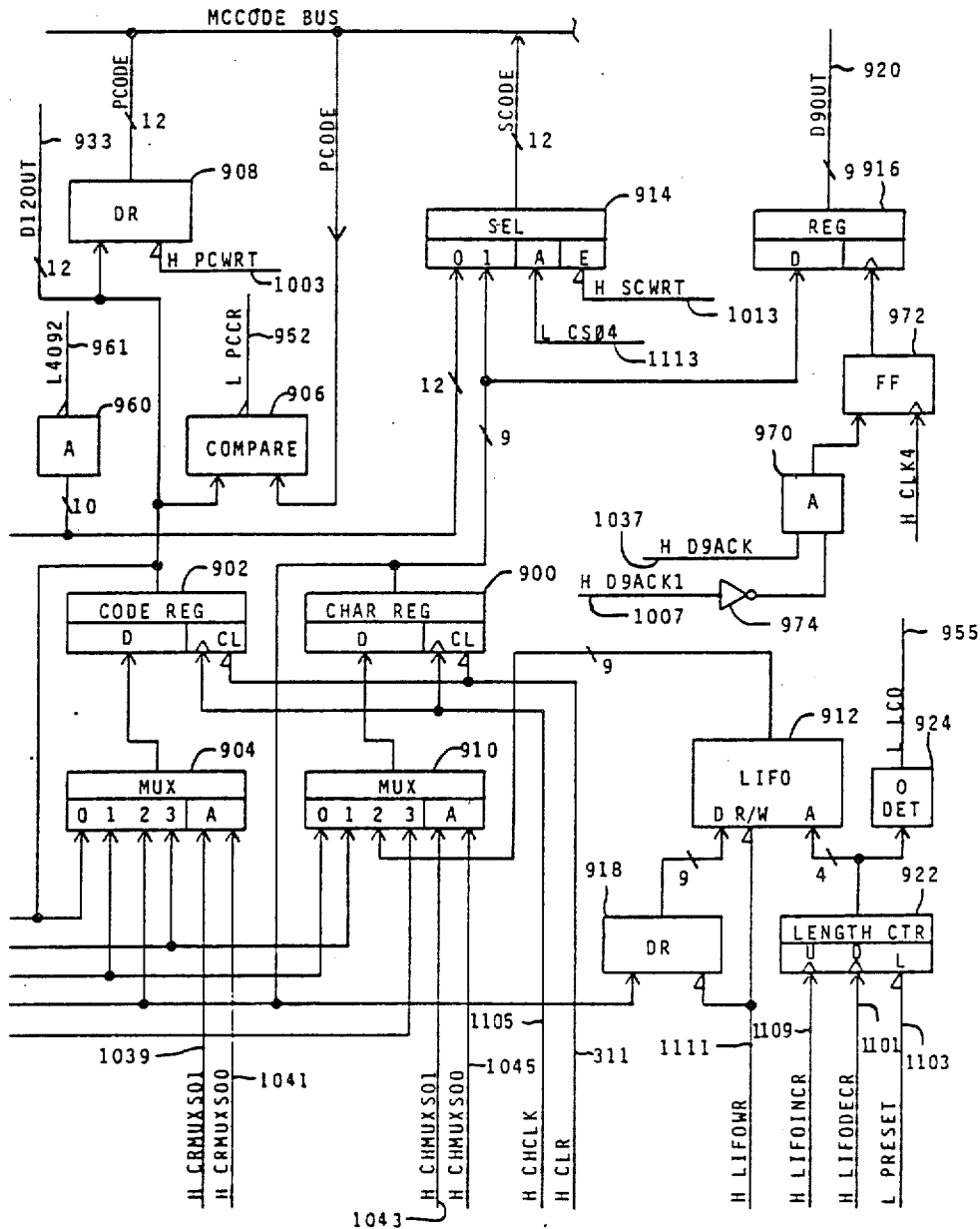

FIGS. 7, 8 and 9 comprise a register level block diagram of the circuits 102 which perform the compression or decompression.

As shown in FIG. 7 the string table 700 is a memory capable of storing a 12-bit prefix code, a 12-bit string code and a 6-bit sub-block count at each addressable location. The string table 700 may be addressed by an address applied through a set of drivers 702. The address is derived from an address register 804 which is loaded from an address multiplexer 802. The 0 inputs of multiplexer 802 are connected to the output of address register 804. Inputs 3 of multiplexer 802 are connected to the output of a code counter 808 while the inputs 5 receive the prefix code from the string table 700 via the MCCODE bus. Inputs 7 of multiplexer 802 receive the 12-bit data bytes from the buffer chopper 104 via the D12IN bus during decompression.

The 1, 2 and 4 inputs of multiplexer 802 are connected to three hash circuits 800a, 800b and 800c, respectively of an address hashing circuit 800. Bytes of data received over the D9IN bus 211 from the channel chopper 100 are inverted at 810 and applied to hash circuits 800a and 800b. Hash circuit 800a takes the Exclusive-Or (XOR) of the inverted data byte and the contents of a character register 900. Hash circuit 800b takes the XOR of the inverted data byte and a string code read from the string table 700. The hash circuit 800c sums the output of the address register 804 with one plus twice the output of a code register 902.

A sub-block counter 812 is provided for "clearing" or reestablishing the string table 700. This sub-blocking is required to allow a reasonable size hardware string table to span large data blocks without excessive reduction in compression performance. A code counter 808 is incremented each time a string code is written into string table 700. When the code counter reaches a count of 4092 (the capacity of the string table is 4096) the sub-block counter 812 is incremented. The output of the sub-block counter is connected to one input of a comparator 806. The output of the sub-block counter is also applied through drivers 814, over the MCCODE bus and through drivers 710 to the data input of the string table so that a sub-block count is written into the string table with each string code. When searching the string table for an empty location into which a string code may be written, the sub-block count read from a location is compared with the count in the sub-block counter 812. If the counts are not equal then the location is considered to be empty and may be written into.

Prefix codes are entered into the string table 700 from code register 902. This register is loaded from a multiplexer 904 having inputs connected to the code register 902, the string code output of the string table 700, character register 900, and address register 804. The output of the code register 902 is connected to a comparator 906, and to the string table via a set of drivers 908, the MCCODE bus and drivers 710. During compression the 12-bit string codes formed by the C/D controls are entered into code register 902 and applied to the buffer chopper 104 over the D12OUT bus 933.

String codes are entered into the string table from either code counter 808 or a character register 900. The character register 900 is loaded from a multiplexer 910 which has four sets of inputs connected to receive the string code output of string table 700, the output of address register 804, the output of a LIFO memory 912, or the data bytes received from the channel chopper over the D9IN bus 211. The outputs of the character register 900 and the code counter 808 are connected to the inputs of a selector 14. The output of the selector is applied over the MCCODE bus and through drivers 710 to the string table 700.

The output of the character register 900 is also connected to an output register 916 and to a set of drivers 918. During decompression, the output of register 916 is decompressed 9-bit data bytes which are transferred over the D9OUT bus 920 to the channel chopper 100. The drivers 918 are connected to the data input of LIFO memory 912, the purpose of which is subsequently explained. The LIFO memory is addressed by an up/down length counter 922. A detection circuit 924 is provided for sensing when the count in counter 922 is zero.

String codes in string table 700 may be read out to the MCCODE bus through a set of drivers 708 and the sub-block counts and prefix codes may be read out to the same bus through a set of drivers 706. In FIGS. 8 and 9, the string codes are applied to address hashing circuit 800b, and one input of multiplexers 802, 90 and 910. The prefix codes are applied to multiplexer 802 and one input of comparator 906. The sub-block counts are applied to comparator 806 for comparison with the contents of sub-block counter 812.

A NOR 820 is connected to the outputs of stages 9-11 of address register 804 and produces the signal L AR512 on lead 801 when the address in the register is 512 (200H) or greater.

A NAND 822 is connected to the D12IN bus and senses special characters FFC-FFF during decompression. When one of these characters appears on the D12IN bus the NAND produces the signal L THROT on lead 809.

A NAND 960 is provided for detecting when the count in code counter 808 is 4092. When this count is detected the NAND produces the signal L 4092 on lead 961.

The output signals from NOR 820, NAND 822 and NAND 960 are applied to four PLAs 1000-1003.

Figure 10:
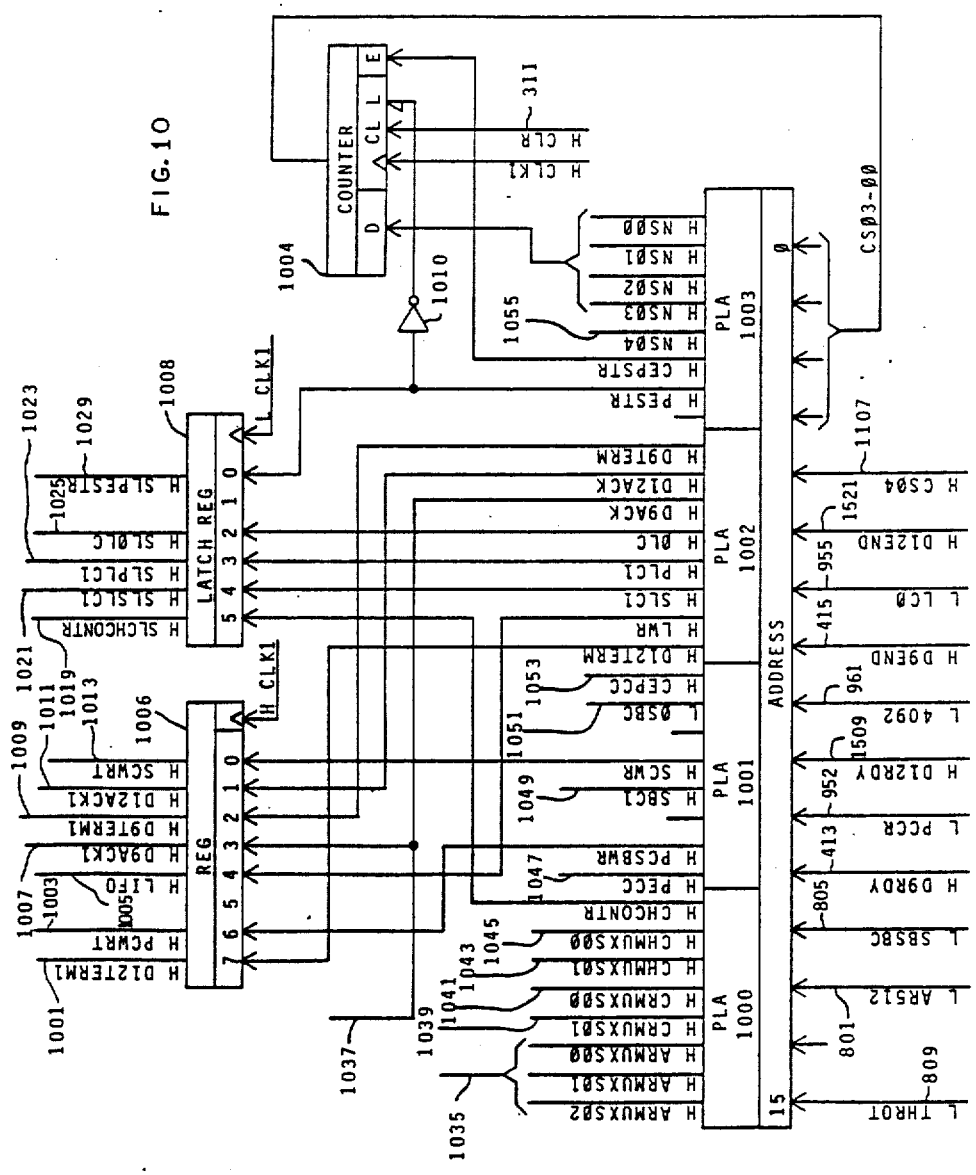
FIGS. 10 and 11 show the logic circuits for controlling the registers in the C/D controls.
Figure 11:
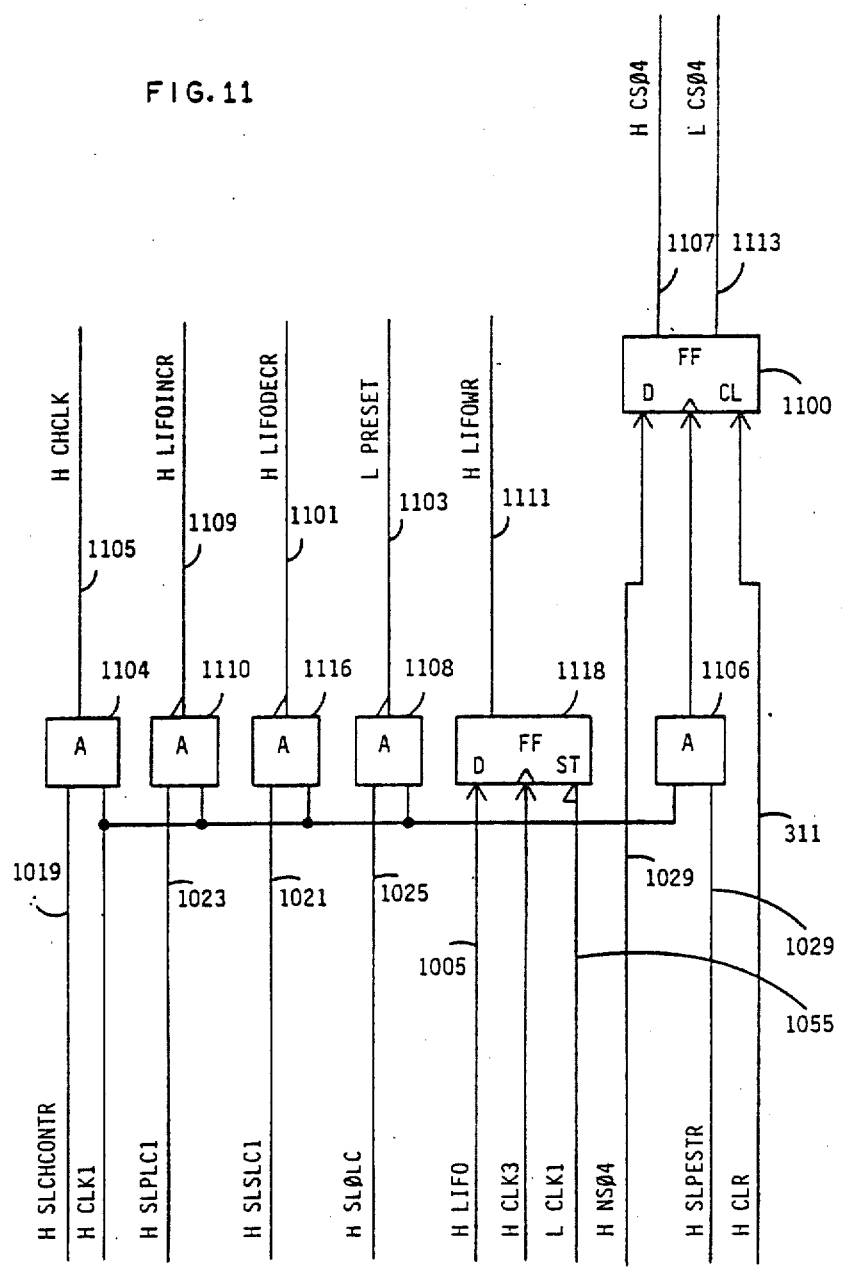

The compression/decompression circuits of FIGS. 8 and 9 and the string table of FIG. 7 are sequenced by the four PLAs 1000-1003 shown in FIG. 10, either by signals applied directly from the PLAs or signals derived from the logic circuits of FIGS. 11 and 12 in response to signals produced by the PLAs. All of the PLAs receive the same input signals and these signals change the states of the PLAs as manifested by the output signals they produce. The hexadecimal count in a FF 1100 and a counter 1004 defines the logic state. Any change in state occurs at CLK1 when counter 1004 is incremented or loaded. At the same time, register 1006 is loaded by some of the outputs of the PLAs, the outputs of the PLAs are latched into latch register 1008.

In the following discussion it is assumed that the microprocessor has loaded the control register 300 in the channel chopper 100 and the signals L STEN on lead 305 and H COMPRESSEN on lead 313 are true. In FIG. 8, H COMPRESSEN is inverted at 816 and enables address register 804. In FIG. 12, L STEN enables two sets of drivers 1206 and 1208. The drivers 1206 are controlled as subsequently described to selectively produce the signals H AWR (∅1-∅4). When these signals are true string table 700 is read at the address specified by address register 804 and when they are false the address is written into. The signals H ENA (∅1-∅4) produced by drivers 1208 are false and in FIG. 7 these signals enable the string table 700 for reading or writing. The signal L STEN on lead 305 becomes the signal L COMPREMSEN which is applied over lead 1201 to the drivers 702 and 710 through which address and data signals are applied to the string table 700.

PLA 1003 produces the signals for determining the next state of the C/D controls. It produces the next state signals H NS (∅3-∅1) which are applied to state counter 1004. These signals are entered into the counter only if the signal H PESTR produced by PLA 1003 is true. H PESTR is inverted at 1010 before being applied to counter 1004. H PESTR also causes latch register 1008 to generate H SLPESTR on lead 1029. In FIG. 11 this signal enables one input of AND 1106. The signal H NS ∅4, produced by PLA 1003 on lead 1055, is applied to the data input of FF 1100. At CLK1 H NS (∅4∅∅) are clocked into FF 1100 and counter 1004 if H PESTR is true to thereby define the next state.

PLA 1003 also produces the signal H CEPSTR and when the signal is true it enables counter 1004 to be incremented by CLK1.

The outputs CS (∅-∅∅) from counter 1004 and CS∅4 from FF 1100 are continuously applied to PLAs 1000-1003 to define the logic state. In addition, the reset output of FF 1100 is the signal L CS∅4 which addresses selector 914 to select the source of a string count which is to be written into the string table 700.

PLA 1000 produces the signals H ARMUXS∅2- H ARMUXS∅∅ which are applied over leads 1035 to the addressing inputs of MUX 802 to select the source the next address to be applied to address register 804. The PLA also produces signals H CRMUXS∅1 and H CRMUXS∅∅ on leads 1039 and 1041 to address MUX 904 and select the source of a character to be entered into code register 902. The signals H CHMUXS∅1 and H CHMUXS∅∅ are generated on leads 1043 and 1045 to address MUX 910 and select the source of a character to be entered into the character register 900.

PLA 1000 produces the signal H CHCONTR to permit the clocking of characters into code register 902 and character register 900. The signal passes through latch register 1008 so that H SLCHCONTR on lead 1019 follows H CHCONTR. H SLCHCONTR is applied to AND 1104 and enables the AND to pass a CLK1 signal to generate H CHCLK on lead 1105. In FIG. 11, this signal clocks the outputs of MUXs 904 and 910 into the registers 902 and 900.

The signals H PECC and H CEPCC are produced by PLA 1001 to control the code counter 808. H PECC is inverted at 818 to enable the loading of a value into the counter at CLK1. If H CEPCC and H PECC are both true the hexadecimal value 2∅∅ (512) is loaded into the counter. If H PECC is false and H CEPCC is true then the count in the counter is incremented by one at CLK1.

The signals H SBC1 and L ∅SBC are produced by PLA 1001 control the sub-block counter 812. When both signals are active (true) a zero count is loaded from the counter at CLK1. If L ∅SBC is false and H SBC1 is true, the counter is incremented at CLK1.

PLA 1001 generates the signals H PCSBWR and H SCWR to control the string table 700. If H PCSBWR is true then the string table is enabled for reading a prefix code (PCODE) and a sub-block code (SBCODE) into the string table. If H PCSBWR is false then it enables the string table for writing a PCODE and an SBCODE. Similarly, H SCWR controls the writing or reading of a string code (SCODE) to/from string table 700. H PCSBWR and H SCWR are considered "active" when they are false, i.e. they are active for causing writing into string table 700.

H PCSBWR and H SCWR are applied to register 1006 and clocked into the register at CLK1. The register 1006 then produces H PCWRT and H SCWRT which are applied over leads 1003 and 1013 to set or reset FF 1202 and FF 1204. In addition, H PCWRT, when false, enables drivers 814 amd 908 to pass an SBCODE and PCODE to the string table 700 over the MCCODE bus. H SCWRT, if false, enables selector 914 to apply an SCODE to the string table over the MCCODE bus.

In FIG. 12 H PCWRT is inverted at 1212 to generate L PCWRT on lead 1217 while H SCWRT is inverted at 1214 to generate L SCWRT on lead 1219. In FIG. 7, when L SCWRT is true it enables drivers 708 to read an SCODE from the string table 700 while L PCRT, when true, enables drivers 706 to read a PCODE and SBCODE from the string table. The PCODE and SBCODE are transmitted over the MCCODE bus to comparator 806 and comparator 906, respectively for comparison with the outputs of sub-block counter 812 and code register 902, respectively. The PCODE is also applied to input 5 of address MUX 802. The SCODE is applied to the address hashing circuit 800 and MUXs 904 and 910.

In FIG. 12, if H PCWRT is false then FF 1202 is reset at CLK2. The output from the FF causes drivers 1206 to make signals H AWRØ1 and H AWRØ4 false. In FIG. 7 these signals enable the string table for writing a PCODE and an SBCODE. If H PCWRT is true then FF 1202 is set by CLK2 and the signals H AWRØ1 and H AWRØ4 are true to enable the string table for reading out a PCODE and an SBCODE.

Also in FIG. 12, H SCWRT controls the setting or resetting of FF 1204. The output of this FF is applied to drivers 1206 to control the generation of the signals H AWRØ2 and H AWRØ3. In FIG. 7, H AWRØ2 and H AWRØ3 control the string table for reading or writing an SCODE. Reading takes place if H SCWRT sets FF 1204 and writing takes place if H SCWRT resets the FF. FF 1202 and FF 1204 are both cleared (set) at each CLK4. Reading or writing of the string table takes place between CLK2 and CLK4 (the interval when FF 1202 and FF 1204 are set/reset).

PLA 1002 produces the signals H ØLC, H SLC1 and H PLC1 to control length counter 922 which addresses LIFO memory 912. H SLC1, H PLC1 and H ØLC are applied to latch register 1008 and generate the signals H SLCLC1, H SLPLC1 and H SLØLC on leads 1021, 1023 and 1025. The signals are latched in register 1008 at CLK1. In FIG. 11, H SLSLC1 enables NAND 1116, H SLPLC1 enables NAND 1110 and H SLØLC enables NAND 1108. These NANDs all receive the signal CLK1.

If H SLØLC is true then CLK1 causes NAND 1108 to generate L PRESET on lead 1103 and in FIG. 9 this signal loads a zero count into length counter 922. If H SLSLC1 is true CLK1 causes NAND 1116 to generate H LIFODECR on lead 1101 and in FIG. 9 this signal decrements the count in length counter 922. If H SLPLC1 is true then CLK1 causes NAND 1110 to generate H LIFOINCR on lead 1109 and in FIG. 9 this signal increments the count in the counter.

PLA 1002 produces the signal H LWR to control the reading or writing into the LIFO memory 912. If L LWR is active (false) then writing takes place. If H LWR is true then the LIFO memory is read out to MUX 10. H LWR is applied to register 1006 and clocked into the register by CLK1 at which time the register generates H LIFO on lead 1005. In FIG. 11, if H LIFO is false it clears FF 1118 at CLK3 and if H LIFO is true it sets the FF. The FF and produces the signal H LIFOWR on lead 1111. If H LIFOWR is true the LIFO memory is enabled for reading and if H LIFOWR is false the LIFO memory is enabled for writing. The timing is such that the state of H LWR during one cycle controls the reading or writing of memory 912 during the next cycle.

PLA 1002 produces the handshaking signals for controlling the transfer of data between the channel chopper 100 and the C/D controls, and between the buffer chopper 104 and the C/D controls. During compression PLA 1002 produces the signal H D9ACK each time the C/D controls accept a byte of data placed on the D9IN bus 211. The signal is applied to register 1006 and entered into the register at CLK1. The register produces the signal H D9ACK1 which is transmitted over the lead 1007 to the channel chopper.

During decompression, at the time H D9ACK goes true, the signal H D9ACK1 produced by register 1006 is false. H D9ACK1 is inverted at 974 and enables the AND 970 to produce an output signal which sets FF 972 at CLK4. The output of the FF clocks the next byte of data into register 916 for transmission to the channel chopper 100. At the first CLK1 after H D9ACK goes true it is gated into register 1006. H D9ACK goes true and is inverted at 974 thus blocking AND 1120. H D9ACK1 is also transmitted to the channel chopper 100 over lead 1007 to signal that a byte of data is on the D9OUT bus and ready for the channel chopper to accept it.

PLA 1002 produces the signal H D9TERM during a decompression operation to indicate to the channel chopper 100 that the last word has been transmitted to the channel chopper 100. This signal is gated into register 1006 by CLK1 to produce H D9TERM1 which is transmitted to the channel chopper over lead 1009.

PLA 1002 produces the signal H D12ACK during a compression operation to indicate to the buffer chopper 104 that the C/D controls have a string code ready for transfer to the buffer chopper. During a decompression operation the signal is generated to indicate that the C/D controls are ready to accept another string code from the buffer chopper. H D12ACK is gated into register 1006 by CLK1. The register produces H D12ACK1 on lead 1011 to signal the buffer chopper.

PLA 1002 produces the signal H D12TERM during a compression operation to indicate to the buffer chopper that the C/D control has sent the last string code. H D12TERM is gated into register 1006 by CLK1. The register produces H D12TERM1 on lead 1001 to signal the buffer chopper.

The actions performed by the C/D logic are summarized below for the various states assumed by PLAs 1000-1003. The output and input signals are defined but the resulting actions are summarized without tracing the function of each signal in order to avoid unnecessary repetition. Reference may be made to the description given above to determine which actions are controlled by each active PLA output signal. In this regard, it should be remembered that H PCSBWR and H SCWR, when active, control writing of the string table 700 and H LWR when active controls writing of the LIFO memory 912. If these signals are inactive then a read operation takes place at the string table and the LIFO memory 912.

C/D Control Compression Logic States

State ØØ. When counter 1004 and FF 1100 is reset the inputs CSØ3-ØØ to PLAs 100-1003 are all false and the logic is in state ØØ. The active outputs from the PLAs are L ØSBC to load the sub-block counter 812 with a zero count, H PECC which loads the code counter 808 with a zero count, and H PCSBWR, H SCWR and H CEPSTR. H PCSBWR and H SCWR are set into register at CLK1 to control the reading of the string table 700. H CEPSTR causes counter 1004 to be incremented to define state Ø1.

State Ø1. This is an initializing state. It is repeated and on each repetition one location in the string talbe 700 is cleared. Active outputs of the PLAs are H ARMUXSØ1 and H ARMUXSØØ which gate the contents of the code counter 808 (now zero) through MUX 802 to the address register 804, H CEPCC which enables the incrementing of the code counter 808, and H PCSBWR and H SCWR for controlling the writing into the string table. H PCSBWR and H SCWR are active (low), a write operation takes place at address Ø to write the contents of sub block counter 804, code register 902 and character register 900 which are all empty.

The logic remains in state ∅1 until the code counter 808 reaches a count of 4092. On each cycle the count in the code counter is used to address the string table for clearing the addressed location and the counter is then incremented. On the cycle in which address 4091 is cleared, the count in counter 808 reaches 4092. This is detected by NAND 960 which applies the signal L 4092 over lead 961 to the PLAs 1000-1003. The PLAs respond by making the signals H NS ∅∅, H NS ∅3 and H PESTR are made active to clear FF 1100 and set counter 1004 to state ∅9.

State ∅9. In state ∅9 the PLAs again generate the signals H ARMUXS ∅1 and H ARMUXS ∅∅ to gate the next address (4092) into the address register 804 to address and clear location 4092. The signal H CEPCC is active to increment the code counter 808 to a count of 4093. H PCSBWR and H SCWR are active to control writing to the string table. H CEPSTR is made active so that the count in counter 1004 may be incremented to thereby define state ∅A.

State ∅A. In state ∅A the signals H ARMUXS ∅1 and H ARMUXS ∅∅ are made active to gate the address 4093 through MUX 802 to the address register 804 to address and clear location 4093. H CEPCC is active to increment the count in code counter 808 to 4094. H PCSBWR and H SCWR are again made active to control writing into the string table. H CEPSTR is made active so that counter 1004 may be incremented to thereby define state ∅B.

State ∅B. In state ∅B the signals H ARMUXS ∅1 and H ARMUXS ∅∅ are made active to gate the address 4094 through MUX 802 to the address register 804 to address and clear location 4094 H CEPCC is active so that the code counter 808 is incremented to 4095. H PCSBWR and H SCWR are made active to control writing into the string table 700. H CEPSTR is made active and controls the incrementing of counter 1004 to count C to thereby define state ∅C.

State ∅C. In state ∅C H ARMUXS ∅1 and H ARMUXS ∅∅ are made active to gate the address from code counter 808 through MUX 802 to address register 804 to address and clear location 4095. H CEPCC is made active so that the code counter 808 is incremented to zero. H PCSBWR and H SCWR are made active to write into the string table. H PESTR and H NS ∅1 are made active to enable FF 1100 to be cleared and counter 1004 loaded with the value 2 to thereby define state ∅2.

State ∅2. State 2 is a wait state which the C/D controls maintain until the PLAs receive a start signal. This start signal may be either the signal H D9RDY on lead 413 which is made true during a compression operation when the channel chopper 100 has placed a byte of data on the D9IN bus 211, or the signal H D12RDY on lead 1509 which is made true during a decompression operation when the buffer chopper 104 has placed a byte of data on the D12IN bus 1309.

Assume first that a compression operation is being performed. As long as H D9RDY is false there are no active outputs from PLAs 1000-1003. When H D9RDY goes true the PLAs make H D12ACK active so that H D12ACK1 will be sent to the buffer chopper 104. The buffer chopper responds by making the signal H D12RDY true on lead 1509. H PESTR, H NS∅4 and H NS∅1 are made active to advance to state 12.

State 12. This state controls the start of a block. H CHMUXS∅∅, H CHMUXS∅1 and H CHCONTR are made active to gate the character byte of data on the D9IN bus 211 through MUX 910 and clock it into character register 900. H ∅LC is made active to reset length counter 922 to zero. H D9ACK is active so that H D9ACK1 is sent to the channel chopper 100 as a signal that the byte of data on the D9IN bus has been accepted. H CEPSTR is made active so that counter 1004 is incremented to 3 thereby defining state 13.

State 13. When the channel chopper 100 places the next data byte on the D9IN bus and raises the signal H D9RDY (with D9END being false) the PLAs 1000-1003 produce the signals H CHMUXS∅1, H CHMUXS∅∅ and H CRMUXS∅1 to gate the first data byte from character register 900 through MUX 904 and gate the second data byte from the D9IN bus through MUX 910. H CONTR is active to generate H CHCLK which clocks the first data byte into code register 902 and the second data byte into character register 904.

Since H PCSBWR and H SCWR are not active and since the address register 804 is clear, location ∅ is read from string table 700 and the string count from this location is applied to hash circuit 800a. The second data byte is also being applied to hash circuit 800a. H ARMUXS∅∅ is active and gates the output of hash circuit 800a through MUX 802 to the address register 804 to serve as the next address for reading from the string table.

H SBC1 is active to increment sub-block counter 812. H PECC and H CEPCC are active to load the value 512 (2∅∅ hex) into code counter 808. H D9ACK is active to cause H D9ACK1 to be sent back to the channel chopper as an acknowledgement that the data byte on the D9IN bus has been accepted H PESTR, H NS ∅4 and H NS ∅3 are active so that the next state is 18.

In state 13, if H D12RDY and H D9END are true H CRMUXS∅1 and H CHCONTR are made active to gate the output of the character register 900 into the code register 902. H D12ACK is made active to send H D12ACK1 to the buffer chopper 104 to inform it that a string code is on the D12OUT bus 933. H PESTR, H NS ∅4, H NS ∅2 and H NS ∅∅ are made active so that logic moves to ending state 15.

State 18. As long as the inputs CS ∅4-CS ∅∅ to PLAs 1000-1003 define state 18, the other inputs to the PLAs have no effect on the outputs from the PLAs. State 18 is the first hash probe state. In this state the hash address gated through MUX 802 during the preceding state is used to address the string table to read the SBCODE, PCODE and SCODE from the hash address. Comparator 800 compares SBCODE with the output of sub-block counter 812 and applies the signal L SBSBC to the PLAs 1000-1003 if an equality is found. Comparator 906 compares PCODE with the contents of the code register 902 and applies the signal L PCCR to the PLAs if an equality is found.

H PLC1 is active to increment the length counter 922 and H CEPSTR is active to thereby define state 19.

State 19. State 19 is the first hash test state. The outputs from PLAs 1000-1003 depend upon the results of the comparisons of SBCODE and PCODE with the sub-block counter 812 and code register 902 at comparator 806 and 906. These comparators produce the signals L SBSBC and L PCCR.

Assume first that a match has been found (L SBSBC and L PCCR are true) and there will be no more characters forthcoming from the channel chopper 100 (H D9END is true). H CRMUXS∅∅ and H CHCONTR are made active to gate SCODE from the MCCODE bus through MUX 904 and enter it into code register 902. H PESTR, H NS∅4 and H NS∅2 are active so that counter 1004 and FF 1100 are set to 14. The logic thus jumps to the block end state 14.

If no match is found (L SBSBC is true and L PCCR is false) H ARMUXS∅2 is active to gate the output of hash circuit 800c through MUX 802 to address register 804. H CEPSTR is active to increment counter 1004 to thus define state 1A. The logic thus jumps to the second hash probe state 1A subsequently described.

If an empty location has been found (L SBSBC is false), and it is not the end of a string (L LC∅ is false), then a table entry must be made. H PCSBWR and H SCWR are active to write into the string table the contents of the code register 902, code counter 808 and sub-block counter 812. If H D12RDY is true the, in addition, H D12ACK and H ∅LC are active to clear length counter 922 and send a D12ACK1 signal to the buffer chopper to inform it that the D12OUT bus carries an output character from code register 902 which should be sampled. H PESTR, H NS ∅4, H NS ∅2 and H NS ∅1 are active so that the next logic state will be the string end state 16. If the input conditions are the same except L LC∅ is, true the same operations are performed except that H PCSBWR and H SCWR are not active to cause writing into the string table.

If there is a match (L SBSBC and L PCCR are both true) and there are more characters to be processed (H D9RDY is true and H D9END is false) H ARMUXS∅1 is active to gate the output of hash circuit 800b through MUX 802 to the address register 804. H CRMUXS∅∅, H CHMUXS∅1, H CHMUXS∅∅ and H CHCONTR are all active to gate the character on the D9IN bus through MUX 910 into the character register 900 and the SCODE from the MCCODE bus into code register 902. H D9ACK is active to cause H D9ACK1 to be sent back to the channel chopper as an acknowledgement that the character has been read from the D9IN bus. H PESTR, H NS ∅4 AND H NS ∅3 are active so that the next state will again be the first hash probe in state 18.

State 1A. State 1A is the second hash probe state. It is entered from state 19 if no match was found during the first hash test state 19. The hash address from 800c is used to address the string table to read out the SBCODE, PCODE and SCODE and generate the comparison signals L SBSBC and L PCCR as described with respect to state 18. The length counter 922 is not incremented. H CEPSTR is active to increment counter 1004 so that the next state is 1B.

State 1B. This is the second hash test state. The same signals are generated to cause exactly the same operations as described above for state 19. However, in the situation where no match is found (L PCCR is false) the incrementing of counter 1004 causes the next state to be 1C.

State 1C. This is the third hash probe state. It is executed exactly like state 1A except that the hash address developed in state 1B is used to address the string table. Also, when counter 1004 is incremented it causes the next state to be 1D.

State 1D. State 1D is the third hash test state. The operations performed in state 1D are the same as those performed in states 19 and 1B. However, for the case where there is no match ( L SBSBC is true and L PCCR is false) the incrementing of counter 1004 causes the next state to be 1E.

State 1E. Exactly the same operations are performed in state 1E as were performed in states 1A and 1C. The only difference is that the hash address is the one developed in state 1D. The incrementing of counter 1004 causes the next state to be 1F.

State 1F. If the addressed location is full (L SBSBC is true), there is no match (L PCCR is false) and the buffer chopper 104 is ready to receive a word (H D12RDY true), H D12ACK is made active so that D12ACK1 is transmitted to the buffer chopper to inform it that another word (in code register 902) is ready on the D12OUT bus. H ∅LC is active to clear the length counter 922. H PESTR, H NS ∅4, H NS ∅2 and H NS ∅1 are active so that FF 1100 and counter 1004 are set to 16.

If the addressed location is empty (L SBSBC is false) and it is not the end of a string (L LC∅ is false) and the channel chopper is ready to accept another word (H D12RDY) H PCSBWR and H SCWR are made active so that an entry may be written into the string table. H PESTR, H NS ∅4, H NS ∅2 and H NS ∅1 are active so that FF 1100 and counter 1004 are set to 16.

If the addressed location is empty (L SBSBC false) and the buffer chopper is ready to receive another word (H D12RDY is true) then H D12ACK is active to signal the buffer chopper 104 that a word is on the D12OUT bus 933 and H ∅LC is active to clear the length counter 922. H PESTR, H NS∅4, H NS∅2 and H NS∅1 are active so that FF 1100 and counter 1004 are set to represent state 16.

When the addressed location is not empty (L SBSBC is true) a match is found (L PCCR is true) and the channel chopper 100 has another word to transmit (H D9RDY true) but is not signalling an end condition (L D9END) then H ARMUXS∅1 is active to gate the output of address hash circuit 800a through MUX 802 to address register 804. H CRMUXS∅∅ is active to pass the SCODE through MUX 904 and H CHMUXS∅1 and H CHMUXS∅∅ are active to pass the word on the D9IN bus through MUX 910. H CHCONTR is active to clock the outputs of MUXs 904 and 910 into registers 902 and 900. H D9ACK is active so that H D9ACK1 is sent back to he channel chopper 100. H PESTR, H NS ∅4 and H NS ∅3 are active so that the next state is the first hash probe state 18.

If the addressed location is full (L SBSBC is true), there is a match (L PCCR is true) and the channel chopper is signalling an end (H D9END true) then H CRMUXS∅∅ and H CHCONTR are active to gate the SCODE from the MCCODE bus through MUX 904 and into the code register 902. H PESTR, H NS ∅4 and H NS ∅2 are true so that FF 1100 and counter 1004 designate the block end state 14 as the next state.

State 16. State 16 is the string end state. If H D9RDY is true, H D9END is false and L 4092 is false H ARMUXS∅∅ is active to gate the output of address hash circuit 800a through MUX 802 to the address register 804. H CRMUXS∅1 is active to gate the output of character register 900 through MUX 904 to the code register 902. H CHMUXS∅1 and H CHMUXS∅∅ are active to gate the word on the D9IN bus through MUX 910 to the character register 900. H CHCONTR is active to clock the outputs of MUXs 904 and 910 into registers 902 and 900, respectively. H CEPCC is active to increment the count in string code counter 812. H D9ACK is active so that H D9ACK1 is sent back to the channel chopper to acknowledge that the word on the D9IN bus has been accepted. H ØLC is active to clear the length counter 922. H PESTR, H NS Ø4 and H NS Ø3 are active so that the logic will advance to the first hash probe state 18.

If H D9RDY and H D12RDY are true, H D9END is false, and the code counter contains a count of FFE (L 4092 is true) H ØLC is active to clear length counter 922. H PESTR, H NSØ4, H NSØ1 and H NSØØ are active so that the logic will advance to sub-block start state 13.

If the channel chopper 100 has raised H D9END and buffer chopper 104 has raised the signal H D12RDY then H CRMUXSØ1 and H CHCONTR are active to transfer output of the character register 900 through MUX 904 and into code register 902. H D12ACK is made active to raise H D12ACK1 to inform the buffer chopper 104 that another word is available on the D12OUT bus 933. H PESTR, H NS Ø4, H NS Ø2 and H NS ØØ are active to designate the end state 15 as the next state.

State 14. In state 14 the logic waits until the buffer chopper 104 raises the signal H D12RDY. H D12ACK then goes true so that H D12ACK1 is sent to the buffer chopper and the buffer chopper samples the word that is in the string code register 902 and on the D12OUT bus 933. H CEPSTR is incremented so that end state 15 is designated as the next state.

State 15. In state 15 the logic waits until the buffer chopper 104 raises the signal H D12RDY. H D12TERM is made active so that H D12TERM1 is sent to the buffer chopper to signal termination of the operation. H PESTR is active but H NS Ø4-H NS ØØ are inactive so that FF 1100 and counter 1004 are cleared to designate logic state ØØ as the next state.

C/D Control Decompression Logic States

Initialization of the C/D controls prior to a decompression operation is exactly the same as for a compression operation. That is, states ØØ, Ø1, Ø9, ØA, ØB and ØC are executed and wait state Ø2 is entered as described above.

State Ø2. The logic waits in state Ø2 until the buffer chopper 104 raises H D12RDY on lead 1509 and the signal H D9RDY applied to the PLAs 1000–1003 over lead 413 is false. H D12RDY signals that the buffer chopper has placed a 12-bit word on the D12IN bus 1309. H D9ACK goes active so that H D9ACK1 is sent to the channel chopper 100 over lead 1007. This is a false acknowledge issued in order to raise H D9RDY. The channel chopper responds by raising H D9RDY on lead 413. H PESTR and H NSØ2 are active to designate state Ø4 as the next state.

State Ø4. In state Ø4, with H D12RDY true, H ARMUXSØ2, H ARMUXSØ1 and H ARMUXSØØ are active to pass the word on the D12IN bus 1309 through MUX 802 to the address register 804. H D12ACK is active to send H D12ACK1 to the buffer chopper as an acknowledgement that the word on the D12IN bus has been accepted. If the word on the D12IN bus is one of the special characters FFC-FFF, the signal L THROT on lead 809 is true and PLA 1003 has no active outputs. The logic thus repeats state Ø4 until a valid data character appears on the D12IN bus. At this time L THROT goes false and PLA 1003 produces H CEPSTR so that counter 1004 is incremented to designate state Ø5.

State Ø5. In state Ø5, H CRMUXSØ1 and H CRMUXSØØ are active to gate the output of address register 804 through MUX 904 to the code register 902 and H CHMUXSØØ is active to gate the output of the address register through MUX 910 to the character register 910. H CHCONTR is active so that the outputs of MUXs 904 and 910 are clocked into the code register 902 and the character register 900. H PECC and H CEPCC are active to set the code counter 812 to 512. H ØLC is active to clear the length counter 922. H CEPSTR is active so that the counter 1004 is incremented to 6.

State Ø6. This state prepares for a speculative write into the string table. H ARMUXSØ1 and H ARMUXSØØ are active to gate the output of code counter 808 through MUX 802 to address register 804. H PCSBWR and H SCWR are made active so that a write operation takes place to write the contents of the character register 900 and code register 902 into the string code and prefix code sections of the addressed location. H CEPSTR is active to increment counter 1004 to state 7.

State Ø7. State Ø7 is the output character loop. If the count in length counter 922 is not zero (L LCØ is false) and H D9RDY is true and H D9END is false H CHMUXSØ1 and H CHCONTR are active to pass a character read from memory 912 through MUX 910 into character register 900. H SLC1 and H D9ACK are active to decrement length counter 922, clock the character in the character register 900 into the output register 916, and send H D9ACK1 over lead 1007 to the channel chopper 100 as an indication that a word has been placed on the D9OUT bus 920.

If H D12END goes true then H D9TERM is made active so that H D9TERM1 is sent to the channel chopper 100 to signal the end of the decompression. At the same time H PESTR is made active to clear FF 1100 and counter 1004 to thereby designate state ØØ as the next state.

If L LCØ, H D9RDY and H D12RDY are all true and H D9END, H D12END and L THROT are false then H ARMUXSØ2, H ARM UXSØ1 and H ARMUXSØØ are active to gate the word on the D12IN bus through MUX 802 to the address register 804. H D12ACK is made active so that H D12ACK1 is sent to the buffer chopper to inform the buffer chopper that it is ready to receive another word. H DACK9 is true to gate the output of the character register 900 into the output register 916, and to generate H DACK1 which informs the channel chopper 100 that another word is present on the D9OUT bus 920. H PESTR, H NS Ø3, H NS Ø2 and H NS ØØ are true to load state ØD into FF 1100 and counter 1004.

If L LCØ, H D9RDY and H D12END are true and H D9END is false then H D9ACK is active so that H D9ACK1 is sent to the channel chopper 100 to indicate that a word is available on the D9OUT bus. H PESTR and H NS Ø3 are active so that FF 1100 and counter 1004 are set to represent state Ø8. In addition, if L THROT and H D12RDY are true and H D9END and H D12END are false then H D12ACK is active so that H D12ACK1 signals the buffer chopper 104 to place another word on the D12IN bus. The state does not change until the buffer chopper places a word on the D12IN bus which is not one of the special characters FFC-FFF or until the buffer chopper raises H D12END.

State ØD. In state ØD, if the value in the address register is a string code rather than a character code then the signal L 512 on lead 801 is true. The outputs H ARMUXS∅2 and H ARMUXS∅∅ are active to select the PCODE read from the string table 700 for passage through MUX 802 to address register 804. H CRMUXS∅1, H CRMUXS∅∅ and H CHCONTR are active to gate the contents of the address register through MUX 904 and into code register 902. H LWR is active (low) to set make H LIFO on lead 1005 false so that the character in character register 900 is written into LIFO memory 912. H PLC1 is active to increment the count in the length counter 922. Since H CHMUXS∅1 and H CHMUXS∅∅ are not active but H CHCONTR is active, the SCODE from the MCCODE bus passes through MUX 910 and is entered into code register 900. H PESTR and H NS ∅3-H NS ∅∅ are active to load counter 1004 and FF 1100 with the representation of state ∅F.

If L 512 is false then the value in the address register is a character with a left extension of three zeros. H ARMUXS∅1 and H ARMUXS∅∅ are made active to pass the output of the code counter 808 through MUX 802 to the address register 804. H CRMUXS∅1 and H CRMUXS∅∅ are active to gate the output of the address register 804 through MUX 904 and H CHMUXS∅∅ is active to gate the output of the address register 804 through MUX 904 through MUX 910. H CHCONTR is active to clock the outputs of MUXs 904 and 910 into register 902 and 900. H SCWR is active for writing a string code into the string table 700 from character register 900. In addition, if L 4092 is false H CEPCC is made active to increment the code counter 808. On the other hand, if L 4092 is true then H CEPCC and H PECC are active to load the value 512 into the code counter 808. In either case, H PESTR, H NS ∅2 and H NS ∅1 are active to designate state ∅6 as the next state.

State ∅F. If L AR512 is true then H ARMUXS∅2 and H ARMUXS∅∅ are active to gate the PCODE from the MCCODE bus through MUX 802 to the address register. H CHCONTR is active to clock the SCODE into the character register 900 (H CHMUXS∅1 and H CHMUXS∅∅ are inactive). H CHCONTR also causes the contents of the code register 902, which are recirculated to the input of the register through MUX 904 (H CRMUXS∅1 and H CRMUXS∅∅ are inactive), to again be entered into the code register. H PLC1 and H LWR are active to increment the length counter 922 and write the content of the character register 900 into the LIFO memory 912 through drivers 918. The states of FF 1100 and counter 1004 are not changed so state ∅F is repeated until L AR512 goes false.

If L AR512 is false then H ARMUXS∅1 and H ARMUXS∅∅ are active to pass the output of code counter 808 through MUX 802 to the address register 804. H CRMUXS∅∅ and H CHCONTR are active to pass the contents of the address register through MUX 910 and enter them in the character register 900. H SCWR is active so that the contents of the character register may be written into the string table. If L 4092 is false then H CEPCC is active to increment the code counter 808 but if L 4092 is true then H CEPCC and H PECC are true to set the code counter to a value of 512. H PESTR, H NS∅2 and H NS∅1 are active to designate state ∅6 as the next state.

State ∅8. State ∅8 is the end state. H D9TERM is made active so that H D9TERM1 is sent to the channel chopper 100. The logic remains in state ∅8 until a reset command returns it to the initialization state ∅∅.

Buffer Chopper

Figure 13:
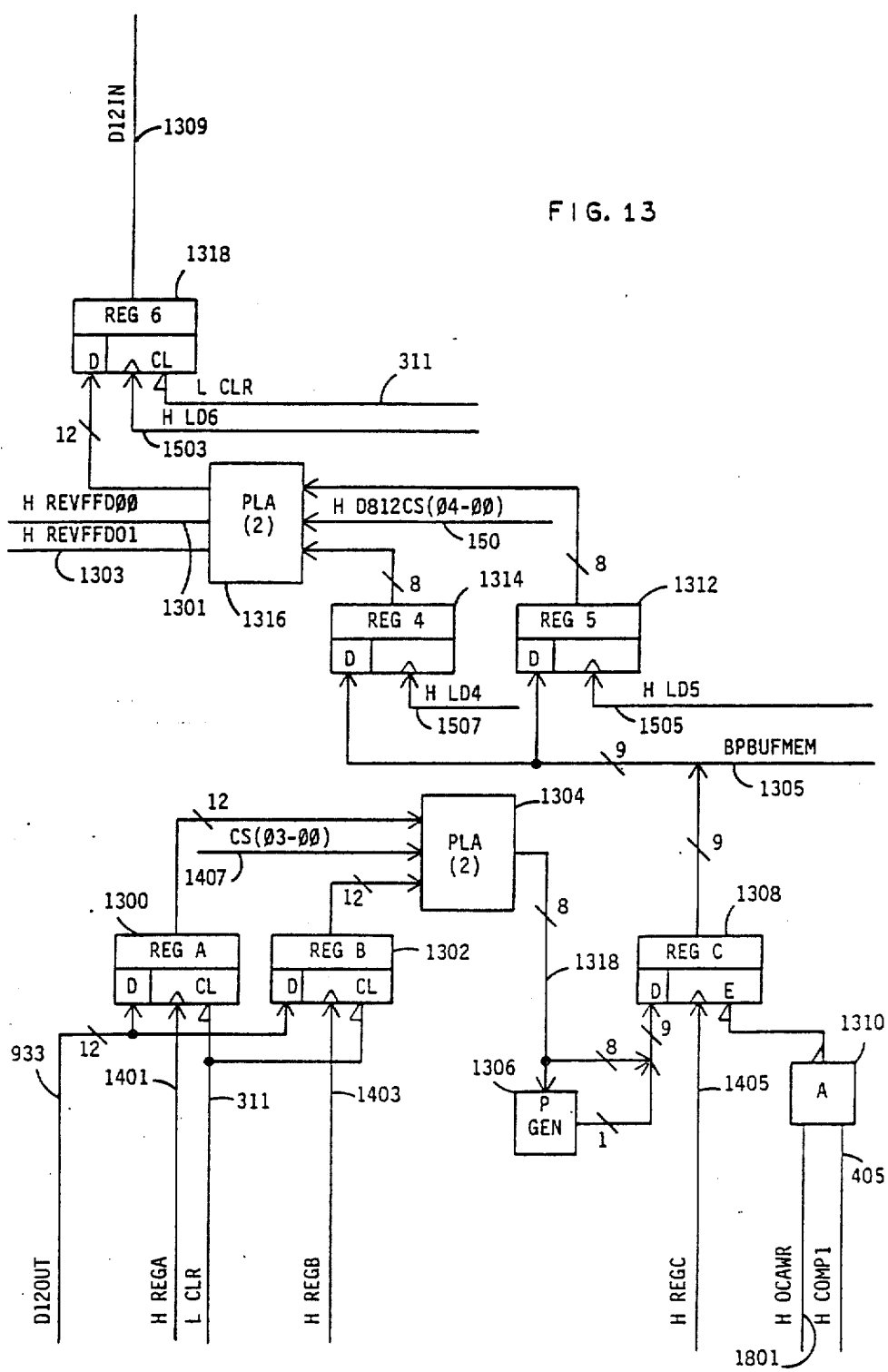
FIG. 13 is a block diagram showing the data paths through a buffer chopper.

FIG. 13 is a register level block diagram of one of the buffer choppers 104. As illustrated in FIG. 13, a buffer chopper includes two registers 1300 and 1302 connected to the D12OUT bus 933 for receiving 12-bit words from the C/D controls 102. The outputs of the registers are connected to two PLAs 1304 which chop the incoming 12-bit words into 8-bit bytes. Output bytes from the PLAs 1304 are applied to a parity generator 1306 and each byte and its parity is applied to a register 1308. The output of register 1308 is connected to the BPBUFMEN bus 1305 which connects with the tape buffer controls 106 and the tape buffer 108.

PLAs 1304 are also the source of a 12-bit throttle code FFF. When the rate at which data is supplied to the buffer chopper is inadequate to maintain the data transfer rate of the tape unit 114, it is necessary to throttle the compression. Throttling refers to the operation whereby the PLAs 1304 output the throttle code to register 1308 at a rate sufficient to maintain the data transfer rate of the tape unit 114.

The PLAs 1304 are also the source of a 12-bit code FFD that is applied to register 1308. This code is used to indicate that a block of data being compressed is a multiple of eight. The compression hardware takes a group of nine bytes and chops the data into eight 9-bit words before the data is compressed. If the block of data from the channel ends on the eighth byte of a nine byte group there is one bit left over. This last byte is combined with a filler byte of all zeros to generate the last 9-bit word. The PLAs 1304 generate the code FFD for transmission to the tape after the last byte of compressed data has been sent to thereby indicate the filler byte in the last 9-bit word. During decompression the code FFD is recognized by the C/D controls and in response thereto disregards the filler byte.

The buffer chopper also includes three registers 1312, 1314 and 1318 and two PLAs 1316. During a decompression operation 8-bit bytes of data plus each byte parity are received over the bus 1305. The parity is stripped off, checked by a parity checker (not shown) and discarded. The bytes of data are applied in parallel to registers 1312 and 1314 and the outputs of the registers are applied to the PLAs 1316. These PLAs reform the data into 12-bit words which are entered into register 1318. From register 1318 the words are transferred over the D12IN bus 1309 to the C/D controls 102.

The PLAs 1316 also produce the signals H REVFFD∅∅ and H REVFFD∅1 on leads 1301 and 1303 as subsequently described.

Buffer Chopper Compression Logic Circuits

Two PLAs 1400 and 1402 produce the control signals for sequencing the buffer chopper during a compression operation. These PLAs produce no output signal as long as the signal H COMP1 on lead 405 is false. PLA 1402 produces the signals NS ∅3-NS ∅∅ which define the next state of the logic. These signals are applied to a register 1404 and are clocked into the register by CLK1. The current state signals H CS (∅3∅∅) are applied over lead 1407 to the PLAs 1304. These signals are also applied to the inputs of PLAs 1400 and 1402.

Figure 15:
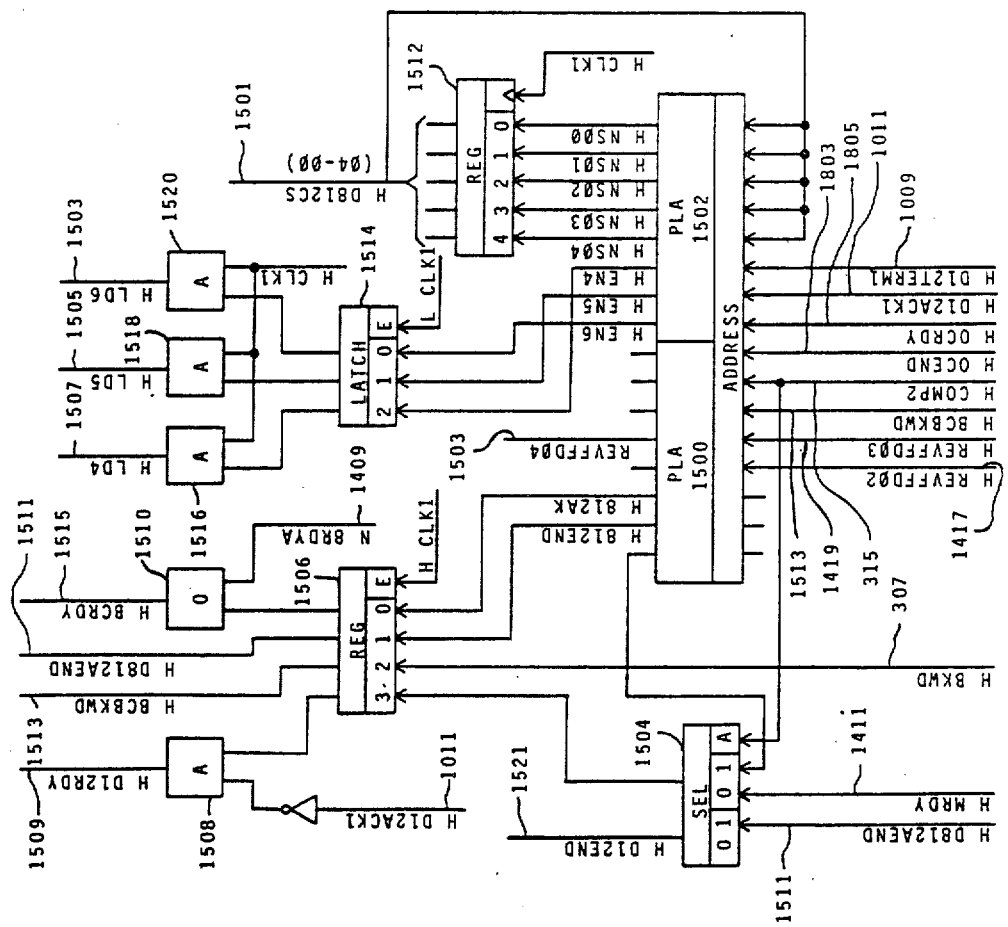

PLA 1402 produces the signal H MRDY on lead 1411 when the buffer chopper is ready to receive a word from the C/D controls 102. In FIG. 15, H MRDY passes through a selector 1504 (H COMP2 is false during compression) and is clocked into a register 1506.

The resulting output of the register passes through an AND 1508 to become the signal H D12RDY which is sent back to the C/D controls 102 over lead 1509.

The signal H 8RDY is produced by PLA 1402 in order to signal the buffer controls that the buffer chopper has a byte of data ready for transmission to the tape. The signal is clocked into register 1404 to produce the signal H 8RDYA on lead 1409. In FIG. 15 this signal passes through OR 1510 to generate H BCRDY which is transmitted to the tape buffer controls.

PLA 1402 produces a signal H 8TERM at the end of a compression operation. The signal is entered into register 1404 at CLK1 and the register produces the signal H D8TERM which is transmitted to the tape buffer controls 106 over the lead 1423.

PLA 1400 produces the signals H AEN, H BEN and H CEN to clock data into the registers 1300, 1302, and 1308. The signals from PLA 1400 pass through a latch 1408 to ANDs 1410, 1412 and 1414. A CLK1 the signals are latched into latch 1408. At the same time, CLK1 is applied to ANDs 1410, 1412 and 1414 to sample the output of the latch. The output of AND 1410 is applied to register 1300 over lead 1401. The output of AND 1412 is connected by lead 1403 to the clocking input of register 1302 and the output of AND 1414 is connected by lead 1405 to the clocking input of register 1308.

The various states of the PLAs 1400 and 1402 are defined by the current state signals H CS ($\emptyset 4$-$\emptyset\emptyset$) available at the output of register 1404. The output signals from the PLAs for a given state are further determined by the input signals H OCTHROT and H OCRDY from the buffer controls 106, H D12TERM1 and H D12ACK1 from the C/D controls 102 and H LASTCOND from the channel chopper 100.

Buffer Chopper Compression Logic States

During data compression, the signal H COMP1 on lead 405 must always be true to enable the PLAs 1400 and 1402 to produce any output signals. Therefore, it will be understood in the following description that H COMP1 is true even though it is not specifically mentioned as a condition for any state.

State $\emptyset\emptyset$. On a data compression operation the buffer chopper logic remains in state $\emptyset\emptyset$ until the C/D controls falsely generate the first D 12ACK1. In state $\emptyset\emptyset$ when H D12ACK1 goes true H MRDY is active to return H D12RDY to the C/D controls. H NS $\emptyset 1$ is active to specify $\emptyset 1$ as the next state.

State $\emptyset 1$. In state $\emptyset 1$ the signals generated by PLAs 1400 and 1402 depend upon the active input signals from the buffer controls and the C/D controls. As long as H D12ACK1, H OCTHROT and H D12TERM1 are false the logic remains in state $\emptyset 1$.

If H D12ACK1 goes true then the output H AEN from PLA 1400 is active to clock the word on the D12OUT bus 933 into register 1300. H NS$\emptyset 4$ and H NS$\emptyset\emptyset$ are active to define the next state as 11.

If H D12TERM1 and H LASTCOND are true then PLAs 1400 and 1402 make no outputs active except H NS$\emptyset 4$, H NS$\emptyset 3$ and H NS$\emptyset 1$ to define the next state as 1A.

If H D12TERM1 is true and H LASTCOND is false then the only active outputs are NS$\emptyset 3$-NS$\emptyset\emptyset$ to define end state $\emptyset$F as the next state.

If H OCTHROT is true and H D12ACK1 and H D12TERM1 are false then the active outputs H NS$\emptyset 2$ and H NS$\emptyset\emptyset$ define state $\emptyset 5$ as the next state.

State 11. The logic remains in state 11 as long as H OCRDY remains false. On each cycle H CEN, H NS$\emptyset 4$ and H NS$\emptyset\emptyset$ are active to clock the output of PLAs 1304 into register 1308 and designate state 11 as the next state. H 8RDY is made active by PLA 1402 so that H BCRDY is transmitted to the buffer controls over lead 151. When H OCRDY goes true the signal H NS$\emptyset 1$ is active to designate $\emptyset 2$ as the next state.

State $\emptyset 2$. The logic remains in state $\emptyset 2$ as long as H D12ACK1, H OCTHROT and H D12TERM1 are false. The signals H MRDY and H NS$\emptyset 1$ are active so that the logic remains in state $\emptyset 2$ and sends H D12RDY to the C/D controls over lead 1509.

If H D12ACK1 goes true then H BEN is active to load the word on the D12OUT bus into register 1302 H NS$\emptyset 4$ and H NS$\emptyset 1$ are active to designate state 12 as the next state.

If H OCTHROT goes true then H NS$\emptyset 2$ is active so that the logic proceeds to state $\emptyset 4$.

If H D12TERM1 and H LASTCOND both go true then H NS$\emptyset 3$ is active so that the logic proceeds to step $\emptyset 8$.

If H D12TERM1 goes true but H LASTCOND remains false then H NS$\emptyset 4$ and H NS$\emptyset 2$-H NS$\emptyset\emptyset$ are active to make state 17 the next state.

State 12. The logic remains in state 12 until the buffer controls 106 are ready to receive the next word. As long as H OCRDY remains false the signal H CEN is active so that H REGC clocks the output of the PLAs 1304 into register 1308. H 8RDY is active so that H BCRDY is sent to the buffer controls 106. H NS $\emptyset 4$ and H NS $\emptyset 1$ are active so that state 12 is repeated.

When H OCRDY goes true, H NS$\emptyset 1$ and H NS$\emptyset\emptyset$ become active so that the logic moves to state $\emptyset 3$.

State $\emptyset 3$. State $\emptyset 3$ is like state 12. The logic remains in state $\emptyset 3$ as long as H OCRDY is false. On each cycle H CEN is generated so H REGC causes register 1308 to be loaded at each CLK1 with the output from PLAs 1304. H 8RDY is active to cause H BCRDY to be sent to the buffer controls 106. When H OCRDY goes true the signal H NS $\emptyset 1$ goes true so that the logic will loop back to state $\emptyset 1$.

State $\emptyset 5$. State $\emptyset 5$ is entered from state $\emptyset 1$ as previously described when H OCTHROT is true. The logic remains in this state as long as H D12ACK1 and H OCRDY are false. In state $\emptyset 5$ the PLAs 1304 produce the value FF. Oh each cycle H CEN is active so that H REGC clocks the output of PLAs 1304 into register 1308 and H NS $\emptyset 2$ and H NS $\emptyset\emptyset$ are active so the state is repeated on the next cycle.

If H OCRDY goes true and H D12ACK1 is false, H CEN is active to load register 1308 from PLAs 1304. H 8RDY is active so that H BCRDY is sent to the buffer controls 106. H NS $\emptyset 3$, H NS $\emptyset 1$ and H NS $\emptyset\emptyset$ are active to make $\emptyset$B the next state.

If H D12ACK1 goes true and H OCRDY is false then H AEN and H CEN are made active so that H REGA and H REGC clock the word into register 1300 from the D12OUT bus 933 and load register 1308 from PLAs 1304. H 8RDY is active so that H BCRDY is sent to the buffer controls 106. H NS $\emptyset 3$ and H NS $\emptyset\emptyset$ are active to make the next state $\emptyset 9$.

If both H OCRDY and H D12ACK1 go true then H AEN and H CEN are active to load register 1300 from the D12OUT bus and load register 1308 from the PLAs 1304. H 8RDY is active so that H BCRDY is sent to the buffer controls 106. H NS $\emptyset 3$ and H NS $\emptyset 1$ are active to designate $\emptyset$A as the next state.

State Ø9. The logic waits in state Ø9 until H OCRDY goes true. On each cycle H 8RDY is active so that H BCRDY is sent to the buffer controls H NS Ø3 and H NS ØØ are active to make Ø9 the next state.

When H OCRDY goes true H 8RDY is active so H BCRDY is sent to the buffer controls 106. H NS Ø3 and H NS Ø1 are active to make state ØA the next state.

State ØA. This state is entered from state Ø5 or state Ø9 as previously described and the logic remains in this state (H NSØ3 and H NSØ1 are active) as long as H OCRDY is false. On each cycle H 8RDY is made active so that H BCRDY is sent to the buffer controls 106.

When H OCRDY goes true H 8RDY is again made active to send H BCRDY to the buffer controls. H NS Ø3 and H NS Ø2 become active so that the logic steps to state ØC.

State ØC. State ØC is entered from state ØA or state Ø4 and the logic remains in state ØC (H NSØ3 and H NSØ2 active) as long as H OCRDY is false. On each cycle H 8RDY causes H BCRDY to be sent to the buffer controls. When H OCRDY goes true H CEN becomes active to generate H REGC thereby loading register 1308 from the PLAs 1304. H 8RDY is active to send H BCRDY to the buffer controls. H NS Ø4 and H NS ØØ are active so that the logic will loop back to state 11.

State ØB. State ØB is entered from state Ø5 as described above. As long as H OCRDY remains false, the logic remains in state ØB with H 8RDY, H NS Ø3, H NS Ø1 and H NS ØØ being active on each cycle. When H OCRDY goes true H 8RDY again causes H BCRDY to be sent to the buffer controls and H NS Ø3, H NS Ø2 and H NS ØØ become active so that the logic steps to state ØD.

State ØD. This state is entered from state Ø4 or from state ØB. It is maintained by making H NSØ3, H NSØ2 and H NSØ1 active on each cycle as long as H OCRDY is false. PLAs 1304 output the value FF to register 1308 on each cycle H CEN is made active on each cycle to load register 1308 with the output from PLAs 1304 and H 8RDY is made active so that H BCRDY is sent to the buffer controls.

When H OCRDY goes true H CEN is made active to load register 1308 with the value FF and H MRDY is made active to send H D12RDY to the C/D controls as an indication that the buffer chopper is ready to receive another word on the D120UT bus. H NS ØØ is made active to return to state Ø1.

State Ø4. The logic waits in state Ø4 as long as D12ACK1 and H OCRDY are false. In state Ø4, PLAs 1304 output the value F to bit positions Ø-3 of register 1308 and four data bits to position 4-7. H CEN is active on each cycle to load register 1308, H 8RDY is active to send H BCRDY to the buffer controls 106, and H NS Ø2 is active so that state Ø4 is repeated.

If H OCRDY goes true and H D12ACK1 is false H CEN is made active to load register 1308 with the output of the PLAs and H 8RDY is active to send H BCRDY to the buffer controls H NS Ø3, H NS Ø2 and H NS ØØ are active so that the logic advances to state ØD.

If H D12ACK1 goes true and H OCRDY is false then H AEN and H CEN are made active to load register 1300 from the D120UT bus and load register 1308 from PLAs 1304. H 8RDY is active to send H BCRDY to the buffer controls 106 H NS Ø3-H NS Ø1 are active so that the logic advances to state ØE.

If both H OCRDY and H D12ACK1 go true then H AEN and H CEN are made active to load registers 1300 and 1308. H 8RDY causes H BCRDY to be sent to the buffer controls over lead 1515. H NS Ø3 and H NS Ø2 are active so that the logic advances to state ØC.

State ØE. The logic waits in state ØE as long as H OCRDY is false. H NS3-H NSØ1 are active to maintain this state and H 8RDY is generated on each cycle to send H BCRDY to the buffer controls 106. The PLAs 1304 output the value FF to register 1308 on each cycle.

When H OCRDY goes true H CEN is made active to load the value FF into register 1308 and H 8RDY is made active to send BCRDY to the buffer controls. H NS Ø3 and H NS Ø2 are made active so that the logic steps to state ØC.

State 1A. The logic waits in state 1A as long as H LASTCOND is true and H OCRDY is false. PLAs 1304 output the value FF to register 1308 on each cycle. H CEN is active to load register 1308 and H 8RDY is active so that H BCRDY is sent to the buffer controls. H NS Ø4, H NS Ø3 and H NS Ø1 are active to repeat the state.

When H OCRDY goes true, H NS Ø4, H NS Ø3, H NS Ø1 and H NS ØØ become active so that the logic advances to state 1B.

State 1B. The logic remains in state 1B as long as H LASTCOND is true and H OCRDY is false. PLAs 1304 output the value D to bit positions 7-4 of register 1308. H CEN and H 8RDY are active to load register 1308 and send H BCRDY to the buffer controls 106 to inform them that another byte is available on the BPBUFMEM bus. H NS Ø4, H NS Ø3, H NS Ø1 and H NS ØØ are active so that the state is repeated.

When H OCRDY goes true H 8TERM becomes active so that H D8TERM is sent to the buffer controls 106 to signal an end to the compression operation. H NSØ3-H NSØØ are active so that the logic steps to state ØF.

State ØF. State ØF is the end state. It is continuously repeated as long as H COMP1 is true. During each cycle H 8TERM is active to cause H D8TERM to be sent to the buffer controls and H NSØ3-H NSØØ are active so that the state is repeated.

State 17. The logic waits in state 17 as long as H OCRDY is false. H CEN and H 8RDY are active to load register 1308 and send H BCRDY to the buffer controls. H NS Ø4 and H NS Ø2-H NS ØØ are active to repeat the state.

When H OCRDY again goes true H 8TERM is made active so that H D8TERM is sent to the buffer controls. H NS Ø3-H NS ØØ are active to advance to end state ØF.

State Ø8. State Ø8 is repeated as long as H OCRDY is false. In state Ø8 PLAs 1304 output the value F to bit positions Ø-3 of register 1308. H CEN and H 8RDY are active to load register 1308 and signal the buffer controls (by H BCRDY) that the byte is on the BPBUFMEM bus. H NS Ø3 is active to repeat the state.

When H OCRDY goes true H NSØ4, H NSØ3 and H NSØØ become active to advance to state 19.

State 19. State 19 is repeated as long as H OCRDY is false. PLAs 1304 output the value FD to register 1308 on each cycle. H CEN and H 8RDY are active to load register 1308 and signal the buffer controls that a byte of data is on the BPBUFMEM bus. H NSØ4, H NSØ3 and H NSØØ are active to repeat the state.

When H OCRDY goes true H 8TERM goes active so that H D8TERM signals the buffer controls 106 that the compression operation is completed. H NS (∅3-∅∅) are active so that the logic advances to the end state ∅F.

Buffer Chopper Decompression Logic Circuits

During a decompression operation two PLAs 1500 and 1502 determine the logic state of the buffer chopper. PLA 1502 produces the next state signals NS (∅4-∅∅) which are gated into a register 1512 by CLK1. The register produces the current state signals H D812CS (∅4-∅∅) which are applied to the PLAs 1500 and 1502 to define the next state and are also applied over lead 1501 to the PLAs 1316. PLA 1316 produce the signal H REVFFD ∅∅ and H REVFFD on leads 1301 and 1303 during decompression logic state ∅4 if the value FF is contained in register 1314 and the value D is in the high orders of register 1312. These PLAs also produce the same signals during state 17 if the value F is in the low orders of register 1312 and the value FD is in register 1314.

PLA 1502 also produces the signals H EN6, H EN5, and H EN4 which pass through a latch 1514 to three ANDs 1516, 1518, and 1520. The signals are latched into latch 1514 by CLK1. At the same time, CLK1 is applied to the ANDs 1516, 1518 and 1520. The output of AND 1516 is the signal H LD4 which clocks a byte of data on the BPBUFMEM bus into register 1314 while the output of AND 1518 is the signal H LD5 which clocks a byte of data from the same bus into the register 1312. The output of AND 1520 is the signal H LD6 which clocks the output of the PLAs 1316 into the register 1318 from whence it is applied over the D12IN bus to the C/D controls 102.

PLA 1500 produces the signal H 812RDY when a word is loaded into register 1318. The signal passes through selector 1514 (now addressed by H COMP2) and is clocked into register 1506 by CLK1. The output of the register passes through AND 1508 to generate the signal H D12RDY as the signal to the C/D controls 102 that a word is available on the D12IN bus 1309.

The signal H 812END is produced by PLA 1500 to signal the C/D controls 102 of the end of a decompression operation. The signal is clocked into register 1506 which produces the signal H D812AEND on lead 1511. The lead is connected to selector 1504 and causes a signal H D12END to be sent back to the C/D controls 102.

The signal H 812AK is produced by PLA 1500 in order to signal the buffer controls 106 that the buffer chopper is ready to accept another byte of data. The signal is entered into register 1506 by CLK1 and the register produces an output signal which passes through OR 1510 to become the signal H BCRDY which is applied over lead 1515 to the buffer controls 106.

PLA 1500 also produces a signal H REVFFD∅4 on lead 1503 during any state in which H REVFFD∅2 or REVFFD∅3 is true. The signal is applied to one input of register 1406. A second stage of this register is connected to the output of an AND 1416 which receives signals H REVFFD∅∅ and H REVFFD∅1 from the PLAs 1316. The register produces the signals H REVFFD∅2 and H REVFFD∅3 which are applied as addressing inputs to PLAs 1500 and 1502. In addition, H REVFFD∅2 is applied to the decompression PLAs 500 and 502 in the channel chopper 100.

The signal H BKWD produced by the control register 300 is entered into a register 1506 which then produces the signal H BCBKWD that is applied to one of the addressing inputs of PLAs 1500 and 1502. Other addressing inputs of the PLAs include H OCEND and H OCRDY which are produced by the buffer controls 106 and the signals H D12ACK1 and H D12TERM1 which are produced by the C/D controls 102.

Buffer Chopper Decompression Logic States

The signal H COMP2 on lead 315 must be true throughout a decompression operation to enable PLAs 1500 and 1502. As long as H COMP2 is false the PLAs remain in state ∅∅. In the following description it will be understood that H COMP2 must be true although it will not be specifically mentioned.

State ∅∅. For a normal decompression H BCBKWD is false and PLA 1500 makes H 812AK active so that H BCRDY is sent over lead 515 to the buffer controls 106 as an indication that the buffer chopper is ready to receive a word from the buffer 108. PLA 1502 makes H NS ∅∅ active so that the logic advances to state ∅1.

When a backward decompression is being performed H BCBKWD is applied to PLAs 1500 and 1502. If H OCRDY goes true during a backward decompression, thereby indicating the tape buffer controls are ready to transfer a word form the tape buffer 108 to the buffer chopper, PLA 1500 makes H 812AK active while PLA 1502 makes H NS ∅∅ active. This causes H BCRDY to be sent to the buffer controls 106 and the logic to advance to state ∅1.

State ∅1. In state ∅1 the buffer chopper waits for the initial byte from the buffer. As long as H OCRDY and H OCEND are false PLA 1502 generates H 812AK and H NS ∅∅ so that H BCRDY is sent to the buffer controls 106 and state ∅1 is repeated.

If H OCEND should go true, indicating that the last byte has already been sent, PLA 1502 generates H NS ∅3, H NS ∅2 and H NS ∅1 so that the logic jumps to the ending state ∅E.

If H OCRDY goes true PLA 1502 makes H EN4 active so that H LD4 on lead 1507 clocks the first byte of data on the BPBUFMEM bus 1305 into register 1314. PLA 1500 makes H 812AK active so that H BCRDY is sent to the buffer controls 106 to indicate that the buffer chopper may place another word on the BPBUFMEM bus. PLA 1502 makes H NS ∅1 and H NS ∅∅ active so that the logic moves to state ∅3

State ∅3. In state ∅3 the logic waits for the second byte of data from the tape buffer 108. State ∅3 is repeated as long as H OCRDY and H OCEND are false. H 812AK is made active by PLA 1500 so that H BCRDY is sent to the buffer controls 106 PLA 1502 outputs H NS ∅1 and H NS ∅∅ to repeat state ∅3.

If H OCEND should go true, there is a boundry byte error. PLA 1502 generates H NS ∅3-H NS ∅∅ so that the logic moves to state ∅F.

If H OCRDY goes true PLA 1502 makes H EN5 active so that the signal H LD5 is generated on lead 1505 to clock the second data byte from the BPBUFMEM bus into register 1312. H NS ∅2 is made active so the logic advances to state ∅4.

State ∅4. In state ∅4 the first word is transferred from the buffer chopper to the C/D controls 102. PLA 1500 makes H 812RDY and H 812AK active while PLA 1502 makes H EN6, H NS ∅2 and H NS ∅∅ active. H EN6 causes H LD6 to go true on lead 1503 to clock the first word from PLAs 1316 into register 1318 so that it is available on the D12IN bus 1309. H 812AK causes H D12RDY on lead 1509 to go true to signal the C/D controls 102 that the word is available on the bus. H 812RDY causes H BCRDY to go true on lead 1515 to signal the buffer controls 106 that the buffer chopper is ready to accept another word. H NS ∅2 and H NS ∅∅ cause the logic to advance to state ∅5.

State ∅5. In this state the buffer chopper waits for the third byte of data from the buffer 108 and/or an acknowledgement (H D12ACK1) that the C/D controls 102 have accepted the first word. As long as H D12ACK1 and H OCRDY are false PLA 1500 makes H 812RDY and H 812AK active so that H D12RDY is sent to C/D controls 102 and H BCRDY is sent to the buffer controls 106. PLA 1502 generates H NS ∅2 and H NS ∅∅ to repeat state ∅5.

If the buffer controls 106 place the third data byte on the BPBUFMEM bus and raise H OCRDY on lead 1805 to indicate that this has been done, PLA 1502 makes H EN4 active so that H LD4 clocks the third byte of data from the BPBUFMEM bus into register 1507. PLA 1500 generates H 812RDY so that H D12RDY is again sent to the C/D controls to indicate that the first was placed on the D12IN bus. PLA 1502 makes H NS ∅3 active to advance the logic to state ∅8.

If H D12ACK1 should go true, indicating that the first word has been accepted by the C/D controls 102 then, PLA 1500 generates H 812AK so that H BCRDY is sent to the buffer controls 106 to indicate that the buffer chopper is still waiting for the third byte. PLA 1502 makes H NS ∅2 and H NS ∅1 active to advance the logic to state ∅6.

If the C/D controls 102 accept the first word and the buffer controls 106 place the third data byte on the BPBUFMEM at the same time, then H D12ACK1 and H OCRDY both go true. PLA 1502 makes H EN4 active so that H LD4 clocks the third byte from the BPBUFMEM bus into register 1314. PLA 1502 also makes H NS ∅4, H NS ∅2, H NS ∅1 and H NS ∅∅ active so that the logic advances to state 17.

State 17. In state 17 PLA 1502 makes H EN6 active to load register 1318 with the second word PLA 1500 makes H 812RDY and H 812ACK active thereby making H D12RDY and H BCRDY true. This signals the C/D controls 102 that the second word is available on the D12IN bus and signals the buffer controls 106 that the third byte of data has been accepted by the buffer chopper. PLA 1502 makes H NS ∅3 and H NS ∅∅ active to advance the logic to state ∅9.

State ∅9. In state ∅9 the logic waits for the second word on the D12IN bus to be accepted by the C/D controls 102, or for the buffer controls 106 to signal that the first byte of the next word is on the BPBUFMEM bus. During the wait H OCRDY and H D12ACK1 are both false. This causes PLA 1500 to make H 812RDY and H 812AK active so that H D12RDY is sent to the C/D controls 102 and H BCRDY is sent to the buffer controls 106. PLA 1502 generates H NS ∅3 and H NS ∅∅ to repeat state ∅9.

If the buffer controls place the second byte of the next word on BPBUFMEM bus 1305 before the C/D controls accept the second word on the D12IN bus, H OCRDY goes true. PLA 1502 makes H EN4 active so that H LD4 clocks the byte of data on the BPBUFMEM bus into register 1314. PLA 1500 generates H 812RDY and H 812AK so that H D12RDY again signals the C/D controls that the second word is on the D12IN bus and H BCRDY signals the buffer controls that the data byte has been accepted by the buffer chopper. PLA 1502 makes H NS ∅3 and H NS ∅1 active to advance the logic to state ∅A.

If the C/D controls accept the second word on the D12IN bus at the same time the buffer controls place the next byte of data on the BPBUFMEM bus, then H OCRDY and H D12ACK1 both go true. In response, PLA 1502 makes H EN4 active so that H LD4 clocks the byte of data from the BPBUFMEM bus into register 1314. PLA 1500 makes H 812AK active so that H BCRDY is sent to the buffer controls 106 to indicate that the byte has been accepted. PLA 1502 makes H NS ∅1 and H NS ∅∅ active so that the logic loops back to state ∅3.

If the buffer controls accept the second word (H D12ACK1 true) and it is not the end of a decompression operation (H OCEND is false) PLA 1500 generates H 812AK so that H BCRDY is sent to the buffer controls 106. PLA 1502 makes H NS ∅1 active so the logic advances to state ∅2.

If H D12ACK1 and H OCEND both go true PLA 1500 makes H 812END active so that H D812AEND is sent to the C/D controls to signal the end of the decompression operation. PLA 1502 makes H NS ∅3, H NS ∅2 and H NS ∅1 true so that the logic advances to state State ∅2. In state ∅2 the buffer ∅hopper waits for a first byte. As long as H OCRDY and H OCEND are false PLA 1500 generates H 812AK so that H BCRDY is sent to the buffer controls 106 to indicate that the buffer chopper is ready for another byte. PLA 1502 makes H NS ∅1 active to repeat state ∅2.

When H OCRDY goes true to indicate that the buffer controls have placed a byte of data on the BPBUFMEM bus, PLA makes H EN4 active so that H LD4 clocks the byte of data into the register 1314. PLA 1500 makes H 812AK active so that H BCRDY is sent back to the buffer controls to acknowledge that the byte has been accepted. PLA 1052 makes H NS ∅1 and H NS ∅∅ true to advance the logic to the previously described state ∅3. If H OCEND should go true to signal the end of the decompression operation, PLA 1500 makes H 812END active so that the end signal H D812AEND is sent to the C/D controls over lead 1511. PLA 1502 makes H NS ∅3, H NS ∅2 and H NS ∅1 active to advance the logic to end state State ∅6. In state ∅6 the logic waits for a third byte to be placed on the BPBUFMEM bus by the buffer controls 106. As long as H OCEND and H OCRDY are false PLA 1500 make H 812AK true so that H BCRDY is sent to the buffer controls to indicate that the buffer chopper is ready for the third byte. PLA 1502 makes H NS ∅2 and H NS ∅1 active to repeat state ∅6.

When the buffer controls place the third byte on the BPBUFMEM bus they raise H OCRDY. PLA 1502 makes H EN4 active so that H LD4 clocks the byte into register 1314. PLA 1502 makes H NS ∅4, H NS ∅2, H NS ∅1 and H NS ∅∅ true to advance the logic to state 17 previously described.

If H OCEND goes true then PLA 1500 makes H 812END active so that H D812AEND is sent to the C/D controls to signal the end of the decompression operation. PLA 1502 makes H NS ∅3, H NS ∅2 and H NS ∅1 active to advance the logic to state ∅E.

State ∅8. In this state the logic waits for the C/D controls to accept the word on the D12IN bus and raise H D12ACK1 as an acknowledgement that the word has been accepted. As long as H D12ACK1 remains false PLA 1500 makes H 812RDY active so that H D12RDY signals the C/D controls that the word is on the bus. PLA 1502 makes H NS ∅3 active to repeat state ∅8.

When the C/D controls accept the word on the D12IN bus and raise H D12ACK1, PLA 1502 makes H NS Ø4, H NS Ø2, H NS Ø1 and H NS ØØ active to advance the logic to state 17.

State ØA. In state ØA the buffer chopper waits to send a second word to the C/D controls, or to receive a second byte from the buffer controls. As long as H D12ACK1 and H OCRDY are false PLA 1500 makes H 812RDY and H 812AK active. This causes H D2RDY to be sent to the C/D controls and H BCRDY to be sent to the buffer controls. PLA 1052 makes H NS Ø3 and H NS Ø1 active to repeat state ØA.

If the buffer controls place a byte of data on the BPBUFMEM bus and raise H OCRDY, PLA 1502 makes H EN5 active so that H LD5 clocks the byte into register 1312. PLA 1500 makes H 812RDY active to thereby make H D12RDY true to signal the C/D controls that a word is still on the D12IN bus. PLA 1502 makes H NS Ø3, H NS Ø1 and H NS ØØ active to advance the logic to state ØB.

If H OCEND and H D12ACK1 should both go true, PLA 1502 makes H NS Ø3-H NS ØØ active to advance the logic to the boundary byte error state ØF.

If the C/D controls accept the word on the D12IN bus and raise H D12ACK1 but H OCEND is false PLA 1502 makes H NS Ø1 and H NS ØØ active to advance the logic to state Ø3.

If the C/D controls accept the word on the D12IN bus and the buffer controls place a byte on the BPBUF-MEM bus then H D12ACK1 and H OCRDY are both true. PLA 1502 makes H EN5 active so that H LD5 clocks the byte from the BPBUFMEM bus into register 1312. H NS Ø2 is made active to advance the logic to state Ø4.

State ØB. In state ØB the buffer chopper waits for the C/D controls 102 to accept the byte present on the D12IN bus. As long as H D12ACK1 is false PLA 1500 generates H 812RDY so that H D12RDY is sent to the C/D controls to indicate that the word is on the bus. PLA 1502 generates H NS Ø3, H NS Ø1 and H NS ØØ to repeat state ØB.

When the C/D controls accept the byte on the D12IN bus and raise H D12ACK1, PLA 1502 generates H NS Ø2 to return the logic to state Ø4.

State ØE. State ØE is the ending state which, once entered, is repeated as long as H COMP2 is true. During this state PLA 1500 makes H 812END active so that the ending signal H D812AEND is sent to the C/D controls. PLA 1502 makes H NS Ø3, H NS Ø2 and H NS Ø1 active to repeat state ØE.

State ØF. State ØF is the boundary byte error ending state. When the logic enters this state it remains there as long as H COMP2 is true. PLA 1502 makes H NS Ø3-H NS ØØ active to repeat the state.

Tape Buffer Controls

Figure 16:
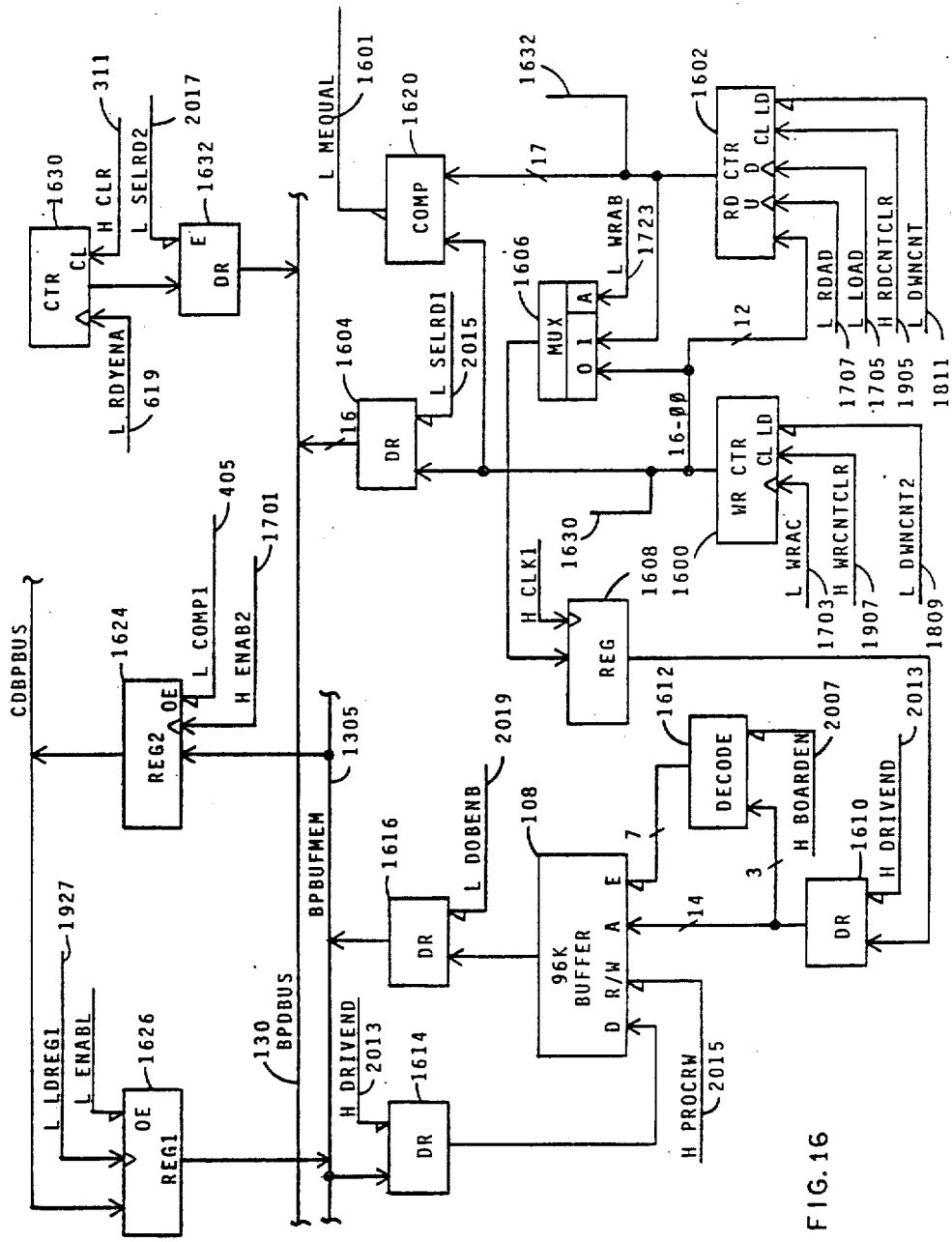
FIG. 16 shows the tape buffer and its read and write controls.
Figure 17:
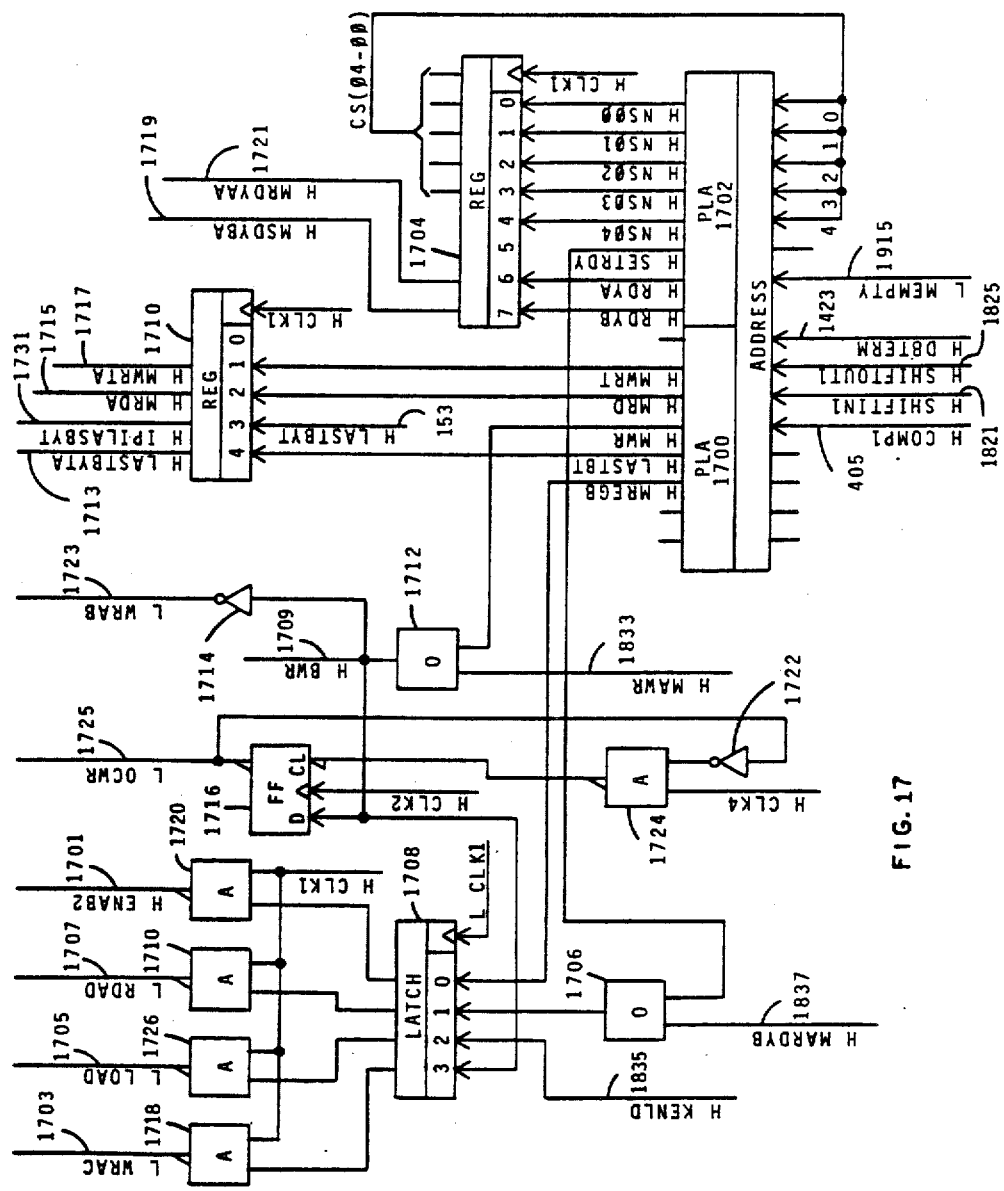
FIGS. 17-20 show the buffer control logic circuits.

FIG. 16 shows the 96K tape buffer 108 as well as the write counter 1600 and the read counter 1602 which generate addresses for writing or reading to/from the buffer. Bits 17-02 of the write counter are applied to a set of drivers 1604 so that the contents of the write counter may be read by the controller 118. The counter is read by the controller during the interval the controller is calculating the tape start-up time as subsequently described. Output bits 16-00 of the write counter are applied through a MUX 1606 to the address register 1608. The output of the address register is applied through a set of drivers 1610 to the addressing inputs of buffer 108 with the three high order bits being applied to an enable decoder 1612.

The output of read counter 1602 is applied through MUX 1606 to the address register 1608 for addressing the buffer. When signal L WRAB on lead 1723 is true then the output of the write counter 1600 addresses the buffer and when the signal L WRAB is false the output of the read counter 1602 addresses the buffer.

The outputs of the counters 1600 and 1602 are compared by a comparator 1620 which produces the signal L MEQUAL on lead 1601 when the counts in the counters are equal. In addition, the output of the write counter (bits 11-ØØ) is applied to the read counter and is loaded therein when the signal L DWNCNT on lead 1811 is true.

Bits 16 and 15 of write counter 1600 are applied over leads 1630 to an AND 1950 having an output connected to an OR 1952. When bits 15 and 16 are both true AND 1950 enables OR 1952 and the signal H WRCNTCLR on lead 1907 goes true. In FIG. 16, this signal clears the write counter 1600. In like manner, bits 16 and 15 of read counter 1602 are applied over leads 1632 to an AND 1954 which has an output connected to OR 1956. The OR 1956 produces the signal H RDCNTCLR on lead 1905 to reset the read counter 1602.

Figure 19:
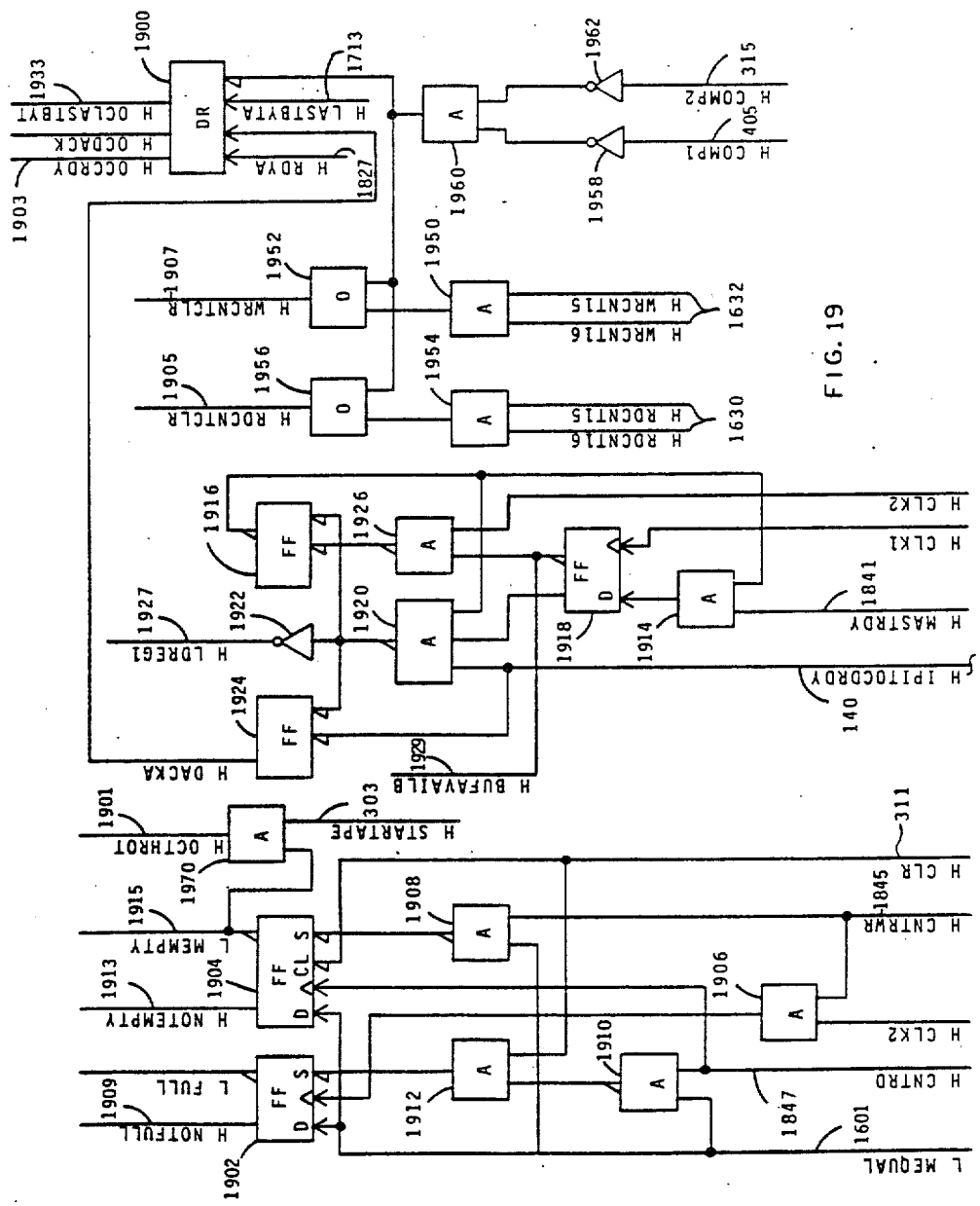

The clearing of the read and write counters is enabled at the start of a compression or decompression operation when control register 300 is loaded to make H COMP1 or H COMP2 true. In FIG. 19, H COMP1 is inverted at 198 and applied to one input of AND 1960 while H COMP2 is inverted at 1962 and applied to the second input. The output of the AND 1960 is connected to ORs 1956 and 1952. When either H COMP1 or H COMP2 goes true, the output of AND 1960 goes low so that the outputs of ANDs 1950 and 1954 may cause H RDCNTCLR and H WRCNTCLR to reset the counters. The output of AND 1960 also enables drivers 1900 during compression or decompression so that the buffer controls may send handshaking signals to the buffer chopper 104 and the IPI 112.

When the buffer 108 is addressed by write counter 1600, the bytes of data on the BPBUFMEN bus are gated through drivers 1614 to the data input of the buffer. When the read counter 1602 addresses the buffer the bytes of data read from the buffer pass through a set of drivers 1616 to the BPBUFMEM bus.

In FIG. 19, the signal H COMPRESSEN on lead 313 is true when the control register 300 is loaded to control either a compression or decompression operation. H COMPRESSION is inverted at 2012 and enables driver 2000, AND 2010 and driver 2014. The output of inverter 2012 is the signal H DRIVEND which is applied over lead 2013 to the buffer data input drivers 1614 and the buffer address drivers 1610. During a compression operation a register 1624 is enabled to permit transfer of data from buffer 108 over the BPBUFMEM bus to the CDBPBUS so that it may be applied to the IPI 112. The output of the register is continuously enabled during compression by the signal L COMP1 on lead 405. During a decompression operation data on the CDBPBUS is gated through a register 1626 to the BPBUFMEM bus and into buffer 108.

A counter 1630 is provided for counting the number of bytes of data fed to the compression circuits from the channel buffer 110. This counter is incremented by the signal L RDYENA which is produced by the channel chopper 100 each time it accepts a byte of data. The contents of the counter are read by the controller 118 during its computation of the start up time for the tape unit, as subsequently described. The output of the counter is applied to a set of drivers 1632 so that the content of the counter are applied to the controller 118 over the BPDBUS when the signal L SELRD2 enables the drivers.

Figure 20:
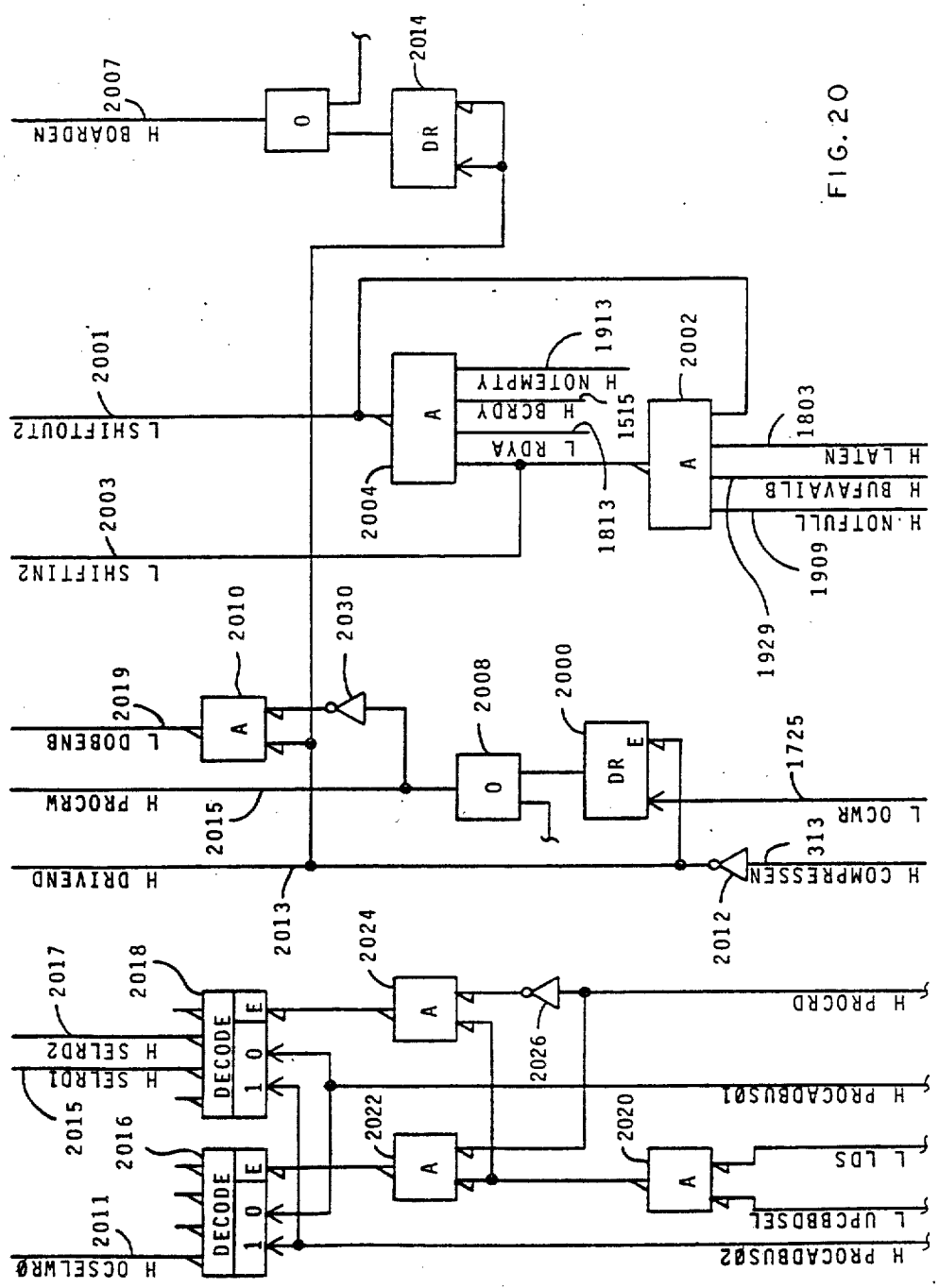

FIG. 20 shows two decoders 2016 and 2018 which are controlled by controller 118 to perform various operations. In order to enable the decoders the controller makes the signals L LDS and L UPCBBDSEL true to enable an AND 2020. The output of the AND enables one input of two further ANDs 2022 and 2024. If the controller wishes to load the control register 300 to set it up for a compression or decompression operation the controller makes the signal H PROCRD false and places zero bits on the processor address bus bit positions ∅1 and ∅2. H PROCRD passes through AND 2022 and enables decoder 2016. Address bits ∅2 and ∅1 cause the decoder to output the signal H OCSELWR∅ on lead 2011. This signal gates a control word placed on the BPDBUS by the controller 118 into the control register 300.

In order to read the contents of byte counter 1630 or write counter 1600 out to controller 118, the controller makes the signal H PROCRD true and places the appropriate address bits on the processor address bus. H PROCRD is inverted at 2026 and passes through AND 2024 to enable decoder 2018. If the address bits are ∅1 decoder 2018 produces the signal L SELRD1 on lead 2015 to enable drivers 1604 to pass the value in the write counter 1600 onto the BPDBUS. If the address bits are 1∅ decoder 2018 generates the signal L SELRD2 on lead 2017 to enable drivers 1632 to pass the byte count in counter 1630 onto the BPDBUS.

During a compression operation the circuits of FIG. 16 are stepped through a sequence of states by two PLAs 1700 and 1702. These PLAs are enabled to produce active outputs only when the signal H COMP1 on lead 405 is true. PLA 1702 produces the next state signals NS ∅4-NS ∅∅ which are clocked into a register 1704 by CLK1. The register then produces the current state signals CS ∅4-CS ∅∅ which are applied to the inputs of the PLAs to define the current state. The output signals produced by the PLAs during the current state are determined by the input signals L MEMPTY which is true when the buffer 108 is empty, H D8TERM which is true after the buffer chopper 104 sends the last byte of data, H SHIFTOUT1 which is true when conditions are right for unloading a byte of data from the tape buffer, and H SHIFTIN1 which is true when conditions are such that a byte of data may be loaded into the tape buffer.

PLA 1702 produces the signal H SETRDY in order to increment the read address counter 1602. The signal is applied OR 1706 having an output connected to latch 1708. The signal passes through latch 1708 to one input of NAND 1710. At CLK1 the signal is latched into latch 1708 and at the same time CLK1 passes through NAND 1710 to generate L RDAD on lead 1707 to increment the read address counter.

PLA 1702 makes the signal H RDYA active in order to signal the buffer choppers 104 that the buffer controls are ready to receive another byte of data. The signal is clocked into register 1704 which then produces H MRDYAA on lead 1721. This signal passes through an OR 1804 to generate H OCRDY which is transmitted back to the buffer choppers. The output of OR 1704 is inverted at 1806 to produce the signal L RDYA which is applied over lead 1813 to one input of NAND 1708.

Figure 18:
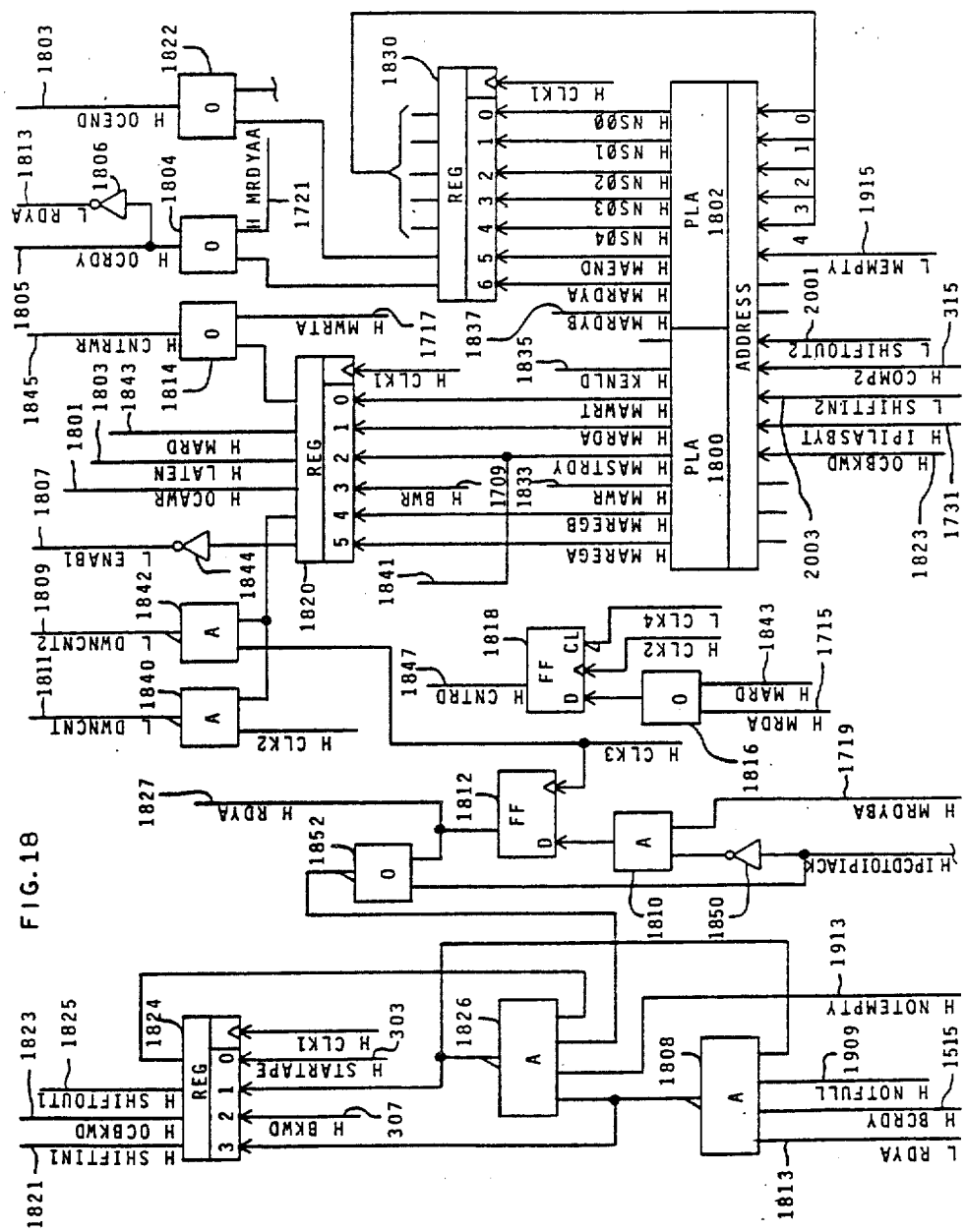

PLA 1702 produces a signal H RDYB in order to signal IPI 112 that the buffer controls are ready to transfer another byte of data from buffer 108 to the IPI. The signal is entered in register 1704 which produces the signal H MRDYBA on lead 1719. In FIG. 18, this signal passes through AND 1810 to set FF 1812. The flip-flop produces the signal H RDYA which is applied to a driver 1900. The driver produces the signal H OCRDY which is applied over lead 1903 to the IPI.

LA 1700 produces a signal H MWRT in order to control the full and empty flip-flops 1902 and 1904 which indicate the full or empty status of the buffer 108. H MWRT is applied to register 1710 and is clocked into the register by CLK1. The register generates the signal H MWRTA on lead 1717. In FIG. 18 this signal passes through OR 1814 to become the signal H CNTRWR on lead 1845. In FIG. 19 H CNTRWR is applied to one input of AND 1906 and one input of NAND 1908. At CLK2 a clock pulse passes through AND 1906 to clock FF 1902 which is either set or reset depending upon whether the signal L MEQUAL is true or false indicating that the contents of the read and write counters 1600 and 1602 are equal or not equal. If the counts are not equal H CNTRWR passes through NAND 1908 to set FF 1904. FF 1902 indicates the full or not full status of the buffer 108 while FF 1904 indicates the empty-not empty status of the buffer. When the buffer is empty FF 1904 produces a signal to enable an AND 1970. If the tape has been started the signal H STARTAPE is true and the AND produces the signal H OCTHROT on lead 1901. This signal is sent to buffer chopper circuits of FIG. 14 so that the buffer chopper PLAs 1304 may generate throttle characters as previously explained.

PLA 1700 produces the signal H MRD to control flip-flops 1902 and 1904 for a buffer read operation. The signal is entered into register 1710 which produces the signal H MRDA on lead 1715. In FIG. 18, this signal passes through OR 1816 and is clocked into FF 1818 by CLK2. The flip-flop produces the signal H CNTRD which is applied over lead 1847 to the clocking input of FF 1904 and one input of NAND 1910. If the counts in the read and write counters 1600 and 1602 are not equal H CONTRD causes FF 1904 to be set and the output of NAND 1910 blocks AND 1912 to prevent the clearing (setting) of FF 1902.

PLA 1700 produces the signal H MWR in order to write a word placed on the BPBUFMEM bus by the buffer chopper 104 into the buffer 108. The signal passes through OR 1712 to become the signal H BWR on lead 1709. The output of OR 1712 is inverted at 1714 to become the signal L WRAB on lead 1723. The output of OR 1712 also sets FF 1716 so that the signal L OCWR on lead 1725 is true. Finally, the output of OR 1712 is latched into latch 1708 and enables one input of AND 1718 which produces the signal L WRAC during CLK1.

In FIG. 16, L WRAC increments the write counter 1600. In FIG. 18 H BWR is clocked into register 1820 which produces the signal H OCAWR on lead 1801. In FIG. 13 this signal enables the output register 1308 so that the buffer chopper 104 places the byte of data on the BPBUFMEM bus.

The signal L WRAB on lead 1723 is applied to MUX 1606 and gates the output of the write counter 1600 through the MUX so that it is entered into the buffer address register 1608.

FF 1716 is set by the output of OR 1712 at CLK2. It remains set until CLK4. The output of the FF is inverted at 1722 and enables a NAND 1724 to pass CLK4 to reset the FF. While FF 1716 is set the signal L OCWR is applied to a driver 2000. During a compression operation the signal H COMPRESSEN on lead 1313 is true. This signal is inverted at 2102 and enables driver 2000. The output of the driver is low hence the output of OR 2008 is low making the signal H PROCRW on lead 2015 false. This signal is applied to the buffer 108 and, when false, enables the buffer for writing. The output of OR 2008 is inverted at 2030 and blocks AND 2010. In FIG. 16 the output of AND 2010 blocks the drivers connecting the output of the buffer to the BPBUFMEM bus.

The signal H DRIVEND at the output of inverter 2102 is false throughout a compression or decompression operation as previously explained and in FIG. 16 this signal enables drivers 1614 so that the byte of data on the BPBUFMEM is gated through the drivers to the data input of the buffer 108. H DRIVEND also enables drivers 1610 to pass the address from the address register 1608 to buffer 108 and decoder 1612. The output of inverter 2012 also enables driver 2014 and applies a low level to the driver data input. The low level output of the driver passes through OR 2114 so that the signal H BOARDEN on lead 2007 is false. In FIG. 16 this signal enables the decoder circuit 1612 to decode the three high order bits of the address and enable the buffer 108.

If PLA 1700 does not produce the signal H MWR in a given logic state then buffer 108 is enabled for reading a byte of data onto the BPBUFMEM bus. FF 1716 is not set so the signal L OCWR is false. In FIG. 20 this signal passes through driver 2000 and OR 2008 to make H PROCRW true on lead 2015. This signal, when true enables buffer 108 for reading. The output of OR 2008 is inverted at 2030 and passes through AND 2010 to make L DOBENB true on lead 2019 In FIG. 16 this signal enables drivers 1616 to pass the byte to read from the buffer 108 onto the BPBUFMEM bus.

PLA 1700 produces the signal H LASTBY on the last byte of a compression operation The signal is clocked into register 1710 which produces the signal H LASTBYTA on lead 1713 This signal is applied to a driver 1900 which generates the signal H OCLASTBYT that is transmitted over lead 1933 to the IPI 112 as the signal that the last byte has been transmitted.

PLA 1700 produces the signal H MREGB in order to transfer a byte of data from the BPBUFMEM bus to the CDBPBUS. The signal is latched into latch 1708 by CLK1 and enables one input of NAND 1720. At CLK1 a clock pulse passes through the NAND so that H ENAB2 is generated on lead 1701. In FIG. 16, H ENAB2 clocks the data from the BPBUFMEM bus into register 1624. The output of the register is continuously enabled during a compression operation because the signal L COMP1 on lead 405 is true.

As previously noted, the signals H SHIFTIN1 and H SHIFTOUT1 are applied to PLAs 1700 and 1702 to determine the outputs produced during various states These signals are derived from a register 1824. The signal L STARTAPE is applied to one input of this register. This signal is false until the controller 118 determines that it is time to start the tape unit 114 during a compression operation. The resulting output of register 1824 blocks NAND 1826 whose output is applied to another stage of the register 1824. When the NAND 1826 is blocked the register 1824 is loaded and produces the output signal H SHIFTOUT1 which is applied to the PLAs 1700 and 1702 over lead 1825. NAND 826 is blocked so that H SHIFTOUT1 is produced under several other conditions such as when FF 1812 is set, the acknowledge signal H IPCDTOIPIACK from IPI 112 is true, H NOTEMPTY on lead 1913 is false or NAND 1808 is enabled.

NAND 1808 controls the generation of H SHIFTIN1. If NAND 1826 is enabled, or if H BCRDY or H NOTFULL is false or L RDYA is true, NAND 1808 is blocked and its output sets register 1824 which then produces the signal H SHIFTIN1 which is applied to PLAs 700 and 1702.

Buffer Control Compression Sequence States

State ∅∅. The PLAs 1700 and 1702 remain in state ∅∅ until the signal H COMP1 goes true. The signals H NS ∅4-∅∅ are all false so that the current state signals CS (∅4-∅∅) produced by register 1704 are also false. When H COMP1 goes true H NS ∅∅ is active so that the next state is ∅1. In the following discussion it will be understood that H COMP1 must always be true even though it is not mentioned as an input to PLAs 1700 and 1702.

State ∅1. The logic remains in state ∅1 as long as H SHIFTIN1 and H SHIFTOUT1 are true and H D8TERM is false PLA 1702 makes H NS ∅∅ active to repeat state ∅1.

State ∅1 is also repeated if H SHIFTIN1 and H SHIFTOUT1 are true and L MEMPTY is true. PLA 1702 generates H NS ∅∅ to repeat state ∅1.

If H SHIFTIN1 goes false it is an indication that the buffer chopper 104 has placed a byte of data on the BPBUFMEM bus and raised H BCRDY to indicate that the byte is on the bus. In FIG. 18, H BCRDY passes through NAND 1808 to reset a stage in register 1824 so that H SHIFTIN1 goes false. In response, PLA 1700 makes H MWR active so that the byte is written into the buffer 108 from the BPBUFMEM bus and the write counter is incremented. PLA 1702 makes H RDYA active so that H OCRDY is sent back to the buffer chopper to acknowledge that the byte has been accepted. PLA 1702 makes H NS ∅1 active so that the logic advances to state ∅2.

If H SHIFTOUT1 goes true it is an indication that conditions are right for transferring a byte from the buffer 108 to the IPI 112. PLA 1700 makes H MREGB active so that H ENAB2 is generated to clock the byte of data read from buffer 108 into register 1624 so that it is available on the CDBPBUS 126. PLA 1702 makes H RDYB and H SETRDY active so that the read counter is incremented by the signal L RDAD on lead 1707 ad H OCCRDY is transmitted over lead 1903 to the IPI 112 to indicate that the byte is available on the bus. PLA 1702 makes H NS ∅1 and H NS ∅∅ active so that the logic advances to state ∅3.

If the buffer chopper makes H D8TERM true it signals the end of a compression operation. If L MEMPTY is false PLA 1700 makes H LASTBY active so that H OCLASTBYT is generated on lead 1933 to inform the IPI that the last byte has been transmitted. PLA 1702 makes H NS ∅2 active so that the logic advances to state ∅4.

State ∅2. In state ∅2 PLA 1700 makes H MWRT active so that H CNTRWR is true on lead 1845 to control the buffer status FFs 1902 and 1904 in accordance with whether L MEQUAL is true or false. PLA 1702 makes H NS ∅∅ active so that the logic advances to state ∅1.

State ∅3. In state ∅3 PLA 1700 makes H MRD active so that H CNTRD is true on lead 1847 to control the buffer status FFs 1902 and 1904 in accordance with whether L MEQUAL is true or false. PLA 1702 makes H NS ∅∅ active so that the logic advances to state ∅1.

State ∅4. The logic remains in state ∅4 once the last byte has been transmitted PLA 1700 makes H LASTBY active so that H OCLASTBYT is sent to the IPI 112 over lead 1933 while PLA 1702 makes H NS ∅2 active to repeat state ∅4.

Buffer Control Decompression Logic Circuits

PLAs 1800 and 1802 determine the sequence of states of the buffer controls during a decompression operation. PLA 1802 produces the next state signals H NS ∅4-∅∅ which are entered into register 1830 at CLK1 to thereby generate the current state signals CS ∅4-∅∅ which are applied to the PLAs to define the current state of the logic. Other input signals to PLAs 1800 and 1802 include L MEMPTY which is derived from flip-flop 1904 and is true when the buffer 108 is not empty, L SHIFTOUT2 which is derived from a NAND 2004 and is true when conditions are right for reading a byte of data from the tape buffer 108 onto the BPBUFMEM bus, L SHIFTIN2 which is derived from a NAND 2002 and is true when conditions are right for loading a byte of data into the tape buffer from BPBUFMEM bus. The signal H IPILASBYT is produced by the IPI 112 and applied to PLAs 1800 and 1802 when the last byte has been transferred from the IPI to the buffer controls. The signal H OCBKWD is derived from a register 1824. The register generates this signal beginning at the first CLK1 after the control register 300 is loaded and designates a backward decompression operation.

The PLA 1802 generates the signal H MAEND to signal the buffer chopper 104 that the end of a decompression operation has been reached. The signal is entered into register 1830 which produces an output signal that passes through OR 1822 to generate H OCEND on lead 1803 which is connected to the buffer chopper circuits as previously described.

PLA 1802 generates the signal H MARDYA in order to signal the buffer chopper circuits that the buffer control is ready to transfer another byte to the buffer chopper from the buffer 108. The signal is entered into register 1830 which produces an output signal through OR 1804 to generate the signal H OCRDY which is transmitted to the buffer chopper over lead 1805. The output of OR 1804 is also inverted at 1806 to obtain the signal L RDYA which is applied to NAND 2004 so that the signal L SHIFTOUT2 is false. The output of NAND 2004 enables one input of NAND 2002 so that if the other inputs to NAND 2002 are true the NAND generates the signal L SHIFTIN2 which is applied to the PLAs 1800 and 1802 over the lead 2003.

PLA 1802 produces the signal H MARDYB in order to increment the read counter 1602. H MARDYB is applied through OR 1706 to latch 1708 and the output of the latch enables NAND 1710 to pass a clock pulse thus generating L RDAD on lead 1707 to increment the count in the buffer read counter 1602.

PLA 1800 produces the signal H KENLD on lead 835 to decrement the buffer read counter 1602. The signal is applied to latch 1708 and the output of the latch enables a NAND 1726. At CLK1 the NAND generates L LOAD on lead 1705 to decrement the buffer read counter 1602.

PLA 1800 generates a signal H MAWRT to control the buffer full and buffer empty FFs 1902 and 1904. The signal is clocked into register 1820 which produces an output signal through OR 1814 to generate H CNTRWR on lead 1845. In FIG. 19 this signal is applied to AND 1906 and NAND 1908 to clock FF 1902 and set FF 1904 as previously described.

PLA 1800 produces the signal H MARDA to control the FFs 1902 and 1904 during reading from the buffer. The signal is entered into register 1820 which produces a signal H MARD on lead 1843. This signal passes through OR 1816 to set FF 1818 at CLK2. The FF produces a signal H CNTRD on lead 1847 and this signal clocks FF 1904 and enables NAND 1910 as previously described.

PLA 1800 produces the signal H MASTRDY in order to write a byte of data received from the IPI 112 over the CDBPBUS 126 into the buffer 108. H MASTRDY is applied over lead 1841 to an AND 1914. If FF 1916 is reset it enables the AND 1914 so that the signal on lead 1841 passes through the AND to set FF 1918 at CLK1. The output of the FF enables one input of NAND 1920. A second input of the NAND is enabled by the output of FF 1916. If the signal H IPI-TOCDRDY on lead 140 is true, indicating that IPI 112 has placed a byte of data on the CDBPBUS 126, the NAND 1920 produces an output signal that is inverted at 1922 to make H LDREG1 on lead 1927 true. In FIG. 16 this signal clocks the data from the CDBPBUS 126 into register 1626. The output of NAND 1920 sets FF 1924 and the output of the FF passes through a driver 1900 to generate the signal H OCDACK on lead 142. This signal is sent back to the IPI 112 as an acknowledgement that the byte on the CDBPBUS 126 has been accepted. In response, the IPI 112 drops the signal on lead 140 thus clearing FF 1924. The output of NAND 1920 also sets FF 1916 and the resulting output from the FF blocks NAND 1920 and AND 1914. At the next CLK1 FF 1918 is reset and at CLK2 a clock pulse passes through NAND 1926 to clear FF 1916. When FF 1918 is reset the signal H BUFAVAILB on lead 1929 is true.. In FIG. 20 this signal enables NAND 2002 so that L SHIFTIN2 may go true.

In FIG. 18 the signal H MASTRDY is also clocked into register 1820 which produces the signal H LATEN on lead 1803. In FIG. 20 this signal enables on input of NAND 2002.

PLA 1800 produces a signal H MAWR in order to write a byte of data to the tape buffer from the CDBPBUS The signal is applied over lead 1833 and through OR 1712 to generate H BWR and L WRAB and set FF 1716. L WRAB addresses MUX 1606 to select the output of the write counter 1600 for addressing the buffer 108. The signal H OCWR produced by FF 1716 is applied to driver 2000 so that the signal H PROCRW at the output of OR 2008 is false. In FIG. 16 this signal enables the buffer for writing. As previously explained, H COMPRESSEN on lead 313 is true thus causing H DRIVEND on lead 2103 to be false thereby enabling the driver 1610 to pass the address to the buffer and the drivers 1614 to enable the data to pass from the BPBUFMEM bus to the buffer.

The signal H BWR is applied to register 1820 and generates the signal H OCAWR on lead 1801. This signal is applied to AND 1310 but has no effect during decompression because H COMP1 is false.

PLA 1800 produces a signal H MAREGB in order to transfer the contents of the write counter 1600 to the read counter 1602 and clear the write counter. The signal is clocked into register 1820 by CLK1 and the register produces an output signal to enable two NANDs 1840 and 1842. At CLK2 NAND 1840 produces the signal L DWNCNT on lead 1811 and in FIG. 16 this signal loads the read counter 1602 with the output from the write counter 1600. At CLK3 NAND 1842 produces the signal L DWNCNT2 on lead 1809 and this signal clears write counter 1600 by loading it with all zeros.

The PLA 1800 produces the signal H MAREGA in order to gate a byte of data from register 1626 onto the BPBUFMEM bus. The signal is entered into register by CLK1 and the output of the register is inverted at 1844 to generate L ENAB1. In FIG. 16 this signal enables the output of register 1626 to pass to the BPBUFMEM bus.

Buffer Control Decompression Logic States

State ∅∅. As long as the signal H COMP2 on lead 315 is false, PLA s 1800 and 1802 produce no output signals and the logic remains in state ∅∅. When H COMP2 goes true the decompression operation begins and H COMP2 must remain true throughout the decompression operation. When H COMP2 goes true PLA 1800 makes H MASTRDY to set the logic circuits for a write to buffer 108 as previously described. PLA 1802 makes H NS ∅3 active to advance the logic to state ∅8.

State ∅8. State ∅8 determines if a normal or a backward decompression is to take place. If H OCBKWD on lead 1823 is true, indicating a backward read, PLA 1800 makes H MASTRDY true while PLA 1802 makes H NS ∅4 and H NS ∅∅ true to jump to state 11 to carry out a backward decompression.

If H OCBKWD is false, PLA 1800 makes H MASTRDY true and PLA 1802 makes H NS ∅true to advance to state ∅1 to carry out a normal decompression.

State ∅1. The logic waits in state ∅1 until IPI 112 signals that it is ready to write a byte of data to buffer 108, the buffer chopper 104 signals that it is ready to accept another word read from buffer 108, or the buffer is empty and the IPI signals that it has sent the last byte. While the logic waits for one of these conditions to occur, PLA 1800 makes H MASTRDY active while PLA 1802 makes H NS ∅∅ active to repeat the state.

If the IPI places a byte of data on the CDBPBUS and raises H IPITOCDRDY on lead 140, the signal causes H LDREG1 to go true on lead 1927 to clock the data into register 1626. In FIG. 19, IPITOCDRDY causes H BUFAVAILB on lead 1929 to go true and in FIG. 20 this signal cause NAND 2002 to make L SHIFTIN2 true. When L SHIFTIN2 goes true PLA 1800 makes H MAREGA active so that L ENAB1 gates the data out of register 1626 to the buffer. PLA 1800 also makes H MAWR active to write the data into buffer 108. PLA 1802 makes H NS ∅1 active so that the logic advances to state ∅2. If the buffer chopper is ready to receive a byte of data it raises H BCRDY and in FIG. 20 this causes NAND 2004 to generate L SHIFTOUT2. In response to this signal PLA 1800 makes H MASTRDY true and P:∅1802 makes H MARDYB, H MARDYA, H NS ∅∅ and H NS ∅1 true to read a byte from the buffer 108 to the BPBUFMEM bus, raises H OCRDY on lead 1805 to inform the buffer chopper that the byte is on the bus, and advances the logic to stae ∅3.

If the IPI 112 raises the signal H LASTBYT on lead 153 it is clocked into register 1710 and the signal H IPILASBYTA is applied to PLAs 1800 and 1802. If the buffer is empty (L MEMPTY on lead 1915 is false) PLA 1800 makes H MARDA active while PLA 1802 makes H MAEND and H NS ∅2 active to send H OCEND over lead 1803 to the buffer chopper and advance the logic to state ϕ4.

State ∅2. The buffer chopper will alternate between states ∅2 and ∅3, alternately reading a byte of data from the tape buffer to the buffer chopper or writing a byte of data from the IPI 112 to the tape buffer. If conditions are not ready for the alternate operation then the logic returns to the idle state ∅1.

In state ∅2, if L SHIFTOUT2 is true PLAs 1800 and 1802 generate H MASTRDY, H MAWRT, H MARDYB, and H MARDYA to read a byte from the buffer and signal the buffer chopper, via H OCRDY on lead 1805, that the byte is on the BPBUFMEM bus. PLA 1802 makes H NS ∅1 and H NS ∅∅ active to advance the logic to state ∅3.

If L SHIFTOUT2 is false PLA 1800 still generates H MASTRDY and H MAREGB but PLA 1802 produces only H NS ∅∅ to return the logic to state ∅1.

State ∅3. If L SHIFTIN2 is true PLA 1800 makes H MAREGA, H MAWR and H MARDA active to write the byte of data from the CPDBUS into buffer 108. PLA 1802 makes H NS ∅1 active to advance to state ∅2.

If L SHIFTIN2 is false then PLA 1800 makes H MASTRDY and MARDA active. These signals permit H IPITOCDRDY on lead 140 to be sampled and the state of the full and empty FFs 1902 and 1904 adjusted according to whether the counts in the read and write counters 1600 and 1602 are equal i.e. L MEQUAL on lead 1601 is true. PLA makes H NS ∅∅ active to advance the logic to state ∅1.

State ∅4. State ∅4 is the end state for a normal decompression operation. Once the logic enters this state it remains therein as long as H COMP2 is true. PLA 1802 makes H NS ∅2 true to repeat the state, and H MAEND true so that H OCEND is sent to the buffer chopper.

State 11. State 11 is entered from state ∅1 and then only for a backward read operation.

The logic remains in state 11 as long as H IPILASBYT and L SHIFTIN2 are false. PLA 1800 makes H MASTRDY true while PLA 1802 makes H NS ∅4 and H NS ∅∅ true to repeat the state.

When L SHIFTIN2 goes true PLA 1800 makes H MAREGA and H MAWR active to write the data from the IPI into the buffer. PLA 1802 makes H NS ∅4 and H NS ∅1 active to advance to state 12.

The logic moves from state 11 to state 12 and back to state 11, loading a byte of data from the IPI 112 into buffer 108 on each loop and incrementing the write counter 1600 This operation is continued until an entire block of data has been loaded into the buffer. When the IPI has sent the last byte it raises the signal H LASTBYT on lead 153. Register 1710 thus applies H IPILASTBYT to PLAs 1800 and 1802. If L SHIFTIN2 is false PLA 1800 makes H MAREGB active to transfer the count in the write counter 1600 to the read counter 1602 and reset the write counter. PLA 1802 makes H MARDYA, H NS ∅4, H NS ∅3 and H NS ∅∅ active to send the H OCRDY signal to the buffer chopper and advance the logic to state 19.

State 12. In state 12 PLA 1800 makes H MASTRDY and H MAWRT active while PLA 1802 makes H NS ∅4 and H NS ∅∅ active to return to state 11.

State 19. In state 19, PLA 1802 generates H KENLD so that the signal L LOAD on lead 1705 decrements the count in the read counter. PLA 1802 makes H NS ∅4, H NS Ø2 and H NS Ø1 active to advance the logic to state 16.

State 16. The logic remains in state 16 as long as the buffer is not empty (L MEMPTY is true) and L SHIFTOUT2 is false. PLA 1800 has no active outputs and PLA 1802 makes H NS Ø4, H NS Ø2 and H NS Ø1 active to repeat state 16.

When L SHIFTOUT2 goes true (the buffer chopper sends H BCRDY to NAND 2004) PLA 1800 makes H MARDA active to control buffer state FFs 1902 and 1904. PLA 1802 makes H MARDYA active to send H OCRDY to the buffer chopper as a signal that the byte read from the buffer is available on the BPBUFMEM bus. PLA 1802 makes H NS Ø4, H NS Ø2, H NS Ø1 and H NS ØØ active to advance the logic to state 16.

The logic repeatedly moves from state 16 to state 17 and back to state 16 Each time states 16 and 17 are executed, one byte is transferred from the tape buffer 108 to the channel chopper 104 and the count in the read counter is decremented. When the last byte has been transferred the read counter will contain a count of zero. It will thus be equal to the count in the write counter 1600 which was reset in state 11. Comparator 1620 thus makes L MEQUAL true on lead 1601. This signal will reset FF 1904 as the last byte is transferred so that the signal L MEMPTY goes false. When L MEMPTY goes false PLA 1800 has no active outputs and PLA 1802 makes H NS Ø2 active so that the logic advances to end state Ø4.

State 17. In state 17 PLA 1800 makes H KENLD active to decrement the read counter 1602. PLA 1802 makes H NS Ø4, H NS Ø2 and H NS Ø1 active to advance the logic to state 16.

Backward Read Circuits

During a backward read operation the tape unit 114 reads information in a direction opposite to that in which it was recorded. Each byte is transmitted to the IPI 112 which reverses the bits within a byte in a conventional manner. The bytes of data are then transferred over the CDBPBUS 126, through register 1626 in the tape buffer control 106, over the BPBUFMEM bus 1305, and entered into the tape buffer 108. An entire block of data is written into the tape buffer before decompression begins. When decompression begins the bytes of data are read from the tape buffer in the reverse order from that in which they were written therein and passed over the BPBUFMEM bus to the buffer choppers 104. The buffer choppers 104 reform the data into 12-bit words which are sent to the C/D controls 102. Decompression takes place in the normal manner and the resulting 9-bit words are transmitted to the channel chopper 100 where they are reformed into 8-bit bytes and the parity for each byte is generated. Each byte is then written into the backward read LIFO 116 and after the entire block of data has been read into the LIFO it is read out in reverse order from the LIFO through channel buffer 110 to the channel data bus 122.

Figure 21:
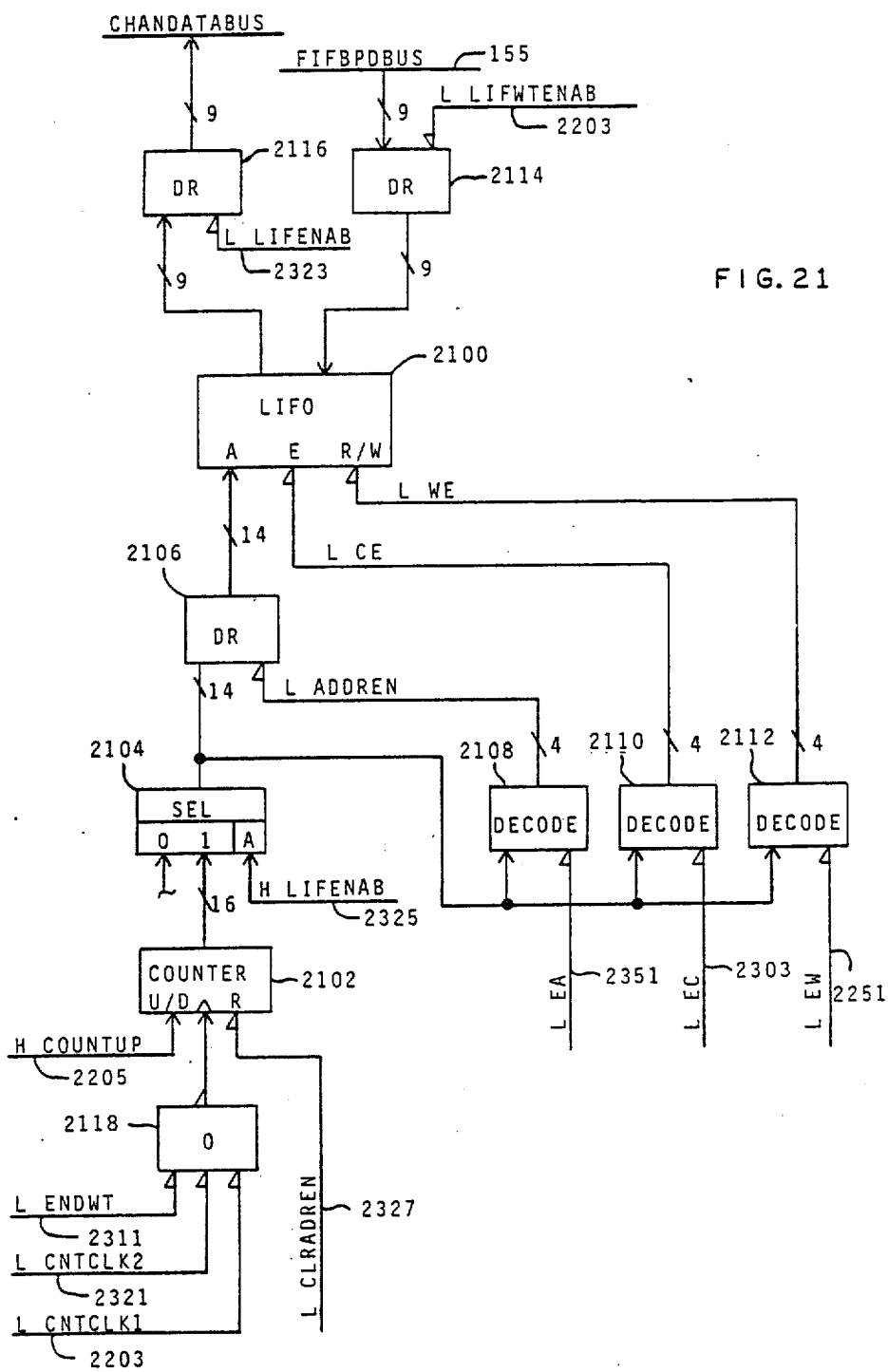
FIG. 21 illustrates the backward read LIFO memory.
Figure 22:
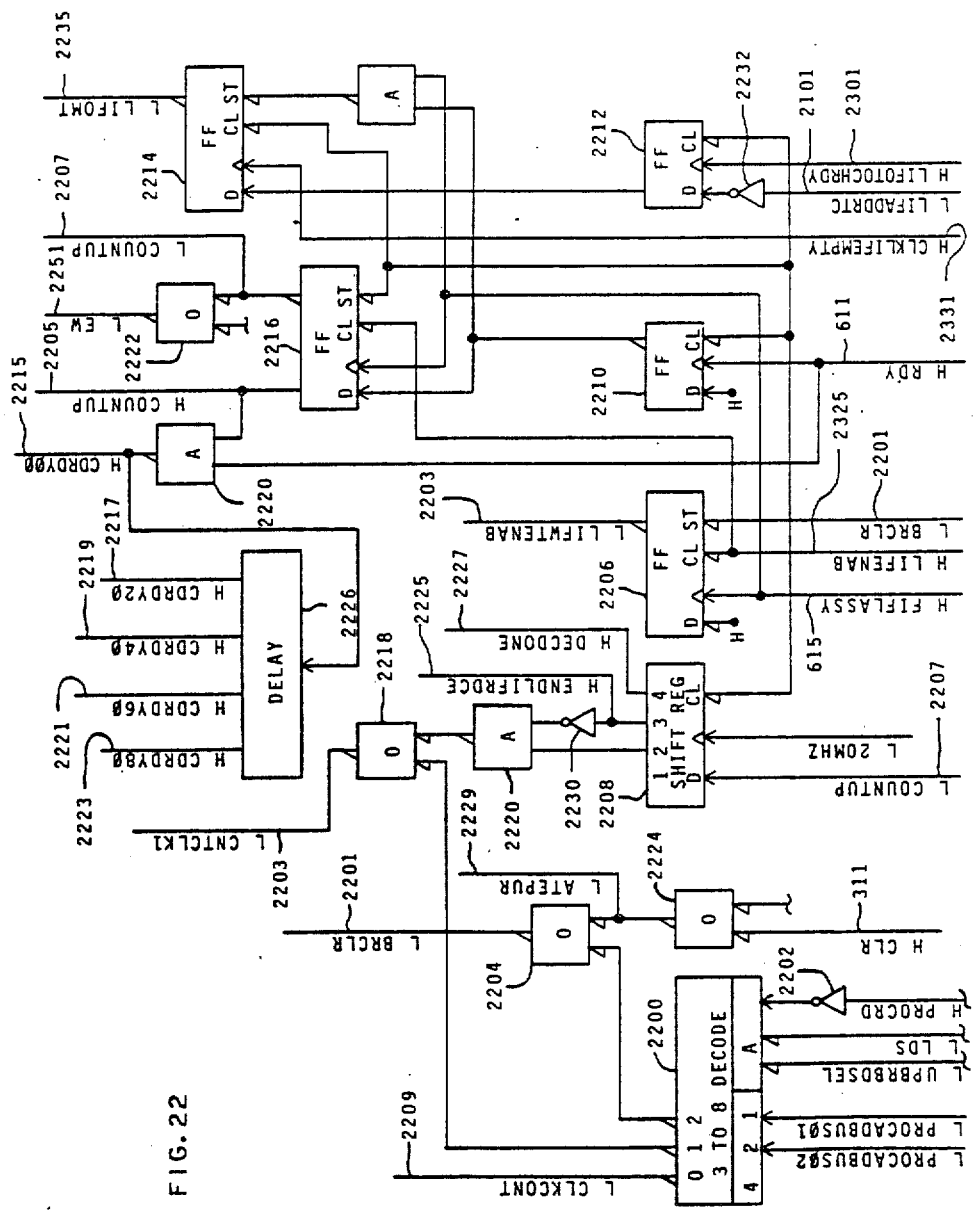
FIGS. 22 and 23 show the logic circuits for controlling the backward read LIFO.
Figure 23:
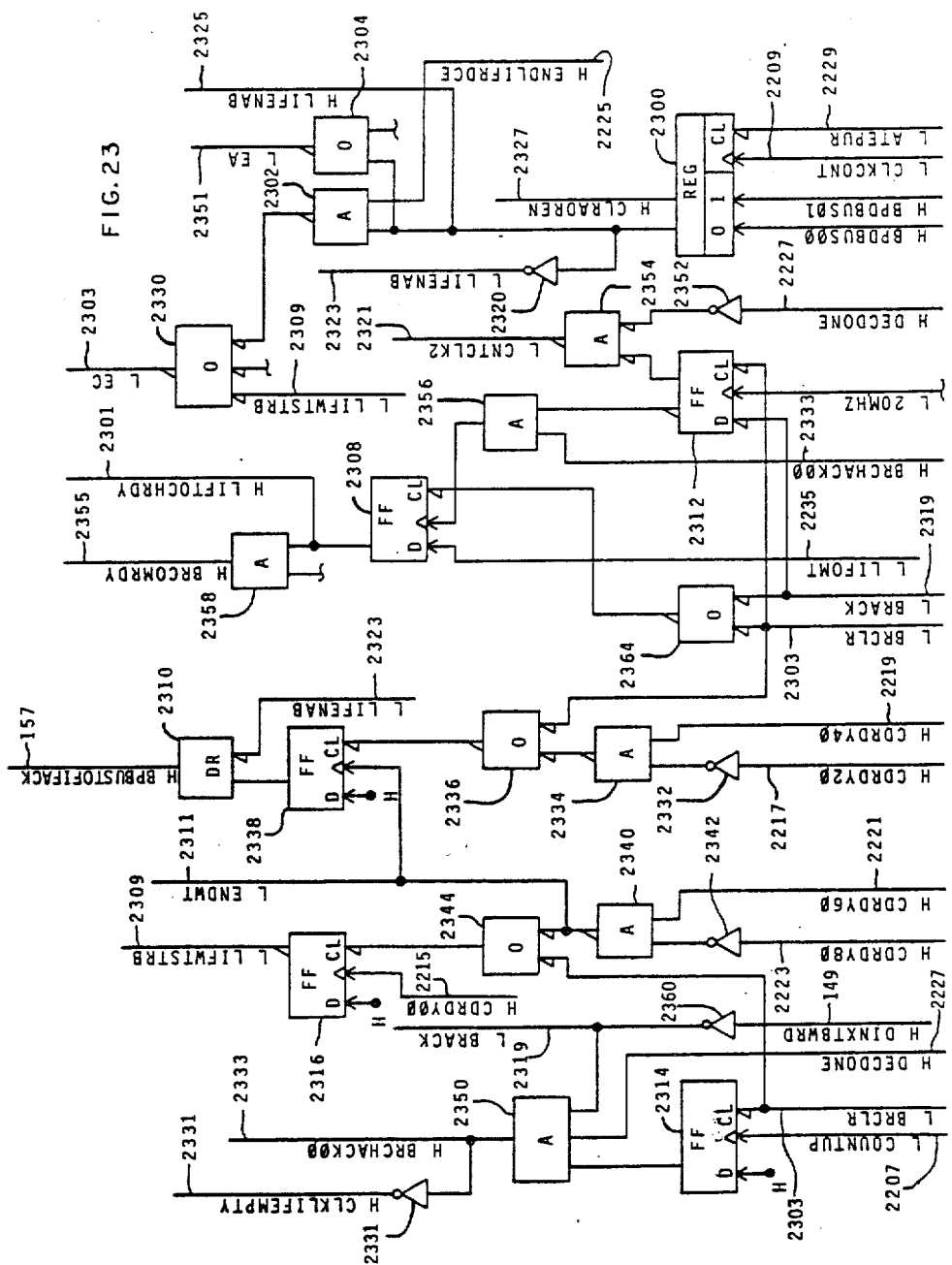

FIG. 21 shows the backward read LIFO 2100 and FIGS. 22 and 23 show the logic for controlling the LIFO and performing the handshaking with the channel chopper 104 during writing into the LIFO and the channel buffer 110 during reading from the LIFO to the channel. It will be understood that the circuits of FIGS. 21-23 are required only if the recording device 114 is capable of reading compressed data in a direction reverse to that in which it was recorded In FIG. 21, the LIFO 2100 is provided with an up-/down address counter 2102 having an output connected to a selector 2104. The selector is continuously addressed by the signal H LIFENAB on lead 2325 during a backward read decompression so the output of the counter (bits 0–13) is applied to a set of drivers 2106. The two address bits 15 and 16 are applied to an address enable decoder 2108, a chip enable decoder 2110 and a write enable decoder 2112. During a read or write operation decoder 2108 produces output signals to selectively enable drivers 2106 and the output of the drivers is applied to the addressing inputs of LIFO 2100.

During a read or write operation decoder 2110 selectively produces the chip enable signals for enabling the LIFO memory chips. During a write operation decoder 2112 makes the L WE signals false to cause writing into the LIFO. The L WE signals are false during a read operation.

Data is entered into the LIFO 2100 from the channel chopper 100. The channel chopper places the data on the FIFBPDBUS 155 and it passes through a set of drivers 2114 to the LIFO. Data in the LIFO is read out to the channel data bus through a set of drivers 2116.

The controller may send commands to the backward read circuits over the BPDBUS 130. The controller makes the signals L UPBRBDSEL and L LDS true and H PROCRD false to enable decoder 2200 and places an address on bit positions Ø2 and Ø1 of the PROCADBUS. If the address bits are 11 then a general clearing of the backward decompression circuits takes place as the bits are toggled. The decoder produces a signal which passes through OR 2204 to generate L BRCLR on lead 2201. A general clearing of the circuits also takes place when the reset bit of control register 300 is toggled to produce H CLR on lead 311. This signal passes through OR 2224 and OR 2204 to generate L BRCLR.

L BRCLR sets FF 2206 and FF 2216 and clears FF 2210, FF 2212, FF 2214, FF 2308, FF 2312, FF 2314, FF 2316 and shift register 2208. When FF 2206 is set its output signal L LIFWTENAB goes true on lead 2203. In FIG. 21 this signal enables drivers 2114 so that data placed on the FIFBPDBUS 155 passes through the drivers to LIFO 2100. When FF 2216 is set it produces the signal H COUNTUP which enables NAND 2220 and also enables address counter 2102 to count up each time the counter is clocked. FF 2216 also produces the signal L COUNTUP which passes through OR 2222 to generate L EW on lead 2251. In FIG. 16 L EW enables decoder 2112 to apply write enable signals to LIFO 2100. When L COUNTUP is true it applies a zero signal to the data input of shift register 2208 so there are no active outputs from the register.

Returning to decoder 2200, the backward decompression circuits are enabled for a backward decompression by making the address bits ØØ so that the decoder produces the signal L CLKCONT on lead 2209 In FIG. 23, as L CLKCONT is toggled it clocks bits ØØ and Ø1 from the BPDBUS into register 2300. Bit Ø1 is toggled to generate H CLRADREN on lead 2327 In FIG. 21 this signal resets the address counter 2102 to zero. Bit ØØ must be made true to set stage Ø of register 2300 before a backward decompression begins This stage of the register remains set throughout the backward decompression operation to make the signal H LIFENAB true. H LIFENAB enables one input of NAND 2302 and passes through NOR 2304 to generate L EA on lead 2351. In FIG. 21 L EA enables the address decoder 2108. H LIFENAB is also applied to FF 2206 and FF 2216 but does not clear the FFs as long as the signal is true. H LIFENAB is inverted at 2320 to produce L LIFENAB and in FIG. 21 this signal enables drivers 2116 so that data read from LIFO 2100 may pass through the drivers to the channel data bus In FIG. 23 L LIFENAB enables a driver 2310.

Assume that a backward decompression has proceeded to the point where the channel chopper 100 has placed the first byte of data on the FIFBPDBUS 155 and raised the signal H RDY on lead 611. In FIG. 22, H RDY clocks and sets FF 2210 H RDY also passes through NAND 2220 to generate H CDRDY ØØ on lead 2215 and pulse the delay line 2226 so that is successively produces the 20 ns timing signals H CDRDY 2Ø, H CDRDY 4Ø, H CDRDY 6Ø and H CDRDY 8Ø.

In FIG. 23, H CDRDY ØØ clocks and sets FF 2316 so that L LIFWTSTRB goes true on lead 2309. This signal passes through OR 2330 so that L EC goes true. In FIG. 21, L EC enables the decoder 2110 to apply chip enable signals to LIFO 2100 and the byte of data on FIFBPDBUS 155 is written into the LIFO 2100.

The signal H CDRDY 2Øis inverted at 2332 and blocks NAND 2334 The output of NAND 2334 is applied to OR 2336 and since L BRCLR is false the output from OR 2336 to FF 2338 is high. H CDRDY 4Øis applied to NAND 2334 When H CDRDY goes true, H CDRDY 2Øgoes false and the NAND produces an output through OR 2336 to clear FF 2338

H CDRDY 6Ø is applied to NAND 2340 and H CDRDY 8Ø is inverted at 2342 and applied to a second input of NAND 2340 The output of NAND 2340 is low from the time H CDRDY 6Ø goes true until the time H CDRDY 8Ø goes true. The output of NAND 2340 passes through NOR 2344 to reset FF 2316 and terminate the write strobe signal L LIFWTSTRB. The output of NAND 2344 also clocks and sets FF 2338 so that the signal H BPBUSTOFIFACK is sent back over lead 157 to the channel chopper 100 as an indication that the byte on the FIFBPDBUS 155 has been accepted The output of NAND 2340 is the signal L ENDWT which is applied over lead 2311 and through OR 2118 to clock and increment the address counter 2102.

The cycle described above is repeated each time the channel chopper 100 places a byte of data on the FIFBPDBUS 155 and raises the signal H RDY on lead 157. After an entire block of data has been written into the LIFO 2100, the channel chopper 100 raises the signal H FIFLASSY on lead 615 to indicate that the last byte has been sent. At this time a decompressed block of data is contained in the LIFO 2100 and was written therein in normal order. When H FIFLASSY goes true the circuits operate to read the data from the LIFO 2100 in the reverse order from which it is written therein, thereby supplying decompressed data to the channel in reverse order In FIG. 22 H FIFLASSY clocks and resets FF 2206 to terminate L LIFWTENAB thereby blocking drivers 2114. H FIFLASSY also blocks FF 2216. Since FF 2210 has remained set since the first H RDY signal its output causes FF 2216 to be reset when it is clocked. This terminates L EW so that decoder 2112 does not apply write enable signals to LIFO 2100. The LIFO is thus ready to read data out to the channel. When FF 2216 is reset the signal H COUNTUP goes false and in FIG. 21 this enables address counter 2102 to be decremented each time it is clocked Also the signal L COUNTUP on lead 2207 goes false. This clocks and sets FF 2314 and applies a high level signal to the data input of shift register 2208.

The shift register is shifted by 20 MHZ clock pulses to generate timing pulses for the read operation. Output 2 of the shift register is applied to a NAND 2220 and output 3 is inverted at 2230 and applied to a second input of NAND 2220 When output 2 is high and output 3 is low, the NAND is enabled and produces a signal which passes through OR 2218 and OR 2118 to clock and decrement counter 2102.

When output 3 of shift register 2208 goes true the signal H ENDLIFRDCE on lead 2225 passes through NAND 2302 and OR 2330 to generate L EC. In FIG. 21 L EC enables decoder 2110 which produces the chip enable signals so that the LIFO address specified by counter 2102 may be read out of the LIFO and through drivers 2116 to the channel data bus.

When output 4 of shift register 2208 goes true, the signal H DECODEDONE on lead 2227 passes through AND 2350 to generate H BRCHACK ØØ on lead 2333. This signal is inverted at 2352 to produce H CLKLIFEMPTY on lead 2331. H DECODEDONE is also inverted at 2352 and passes through AND 2354 and OR 2118 to drive the clock input of counter 2102 low.

When H BRCHACK ØØ on lead 2333 goes true the signal passes through AND 2356 to clock FF 2308 assuming that LIFO 2100 is not empty, the signal L LIFMT on lead 2235 will be false. FF 2308 is set and reproduces the signal H LIFTOCHRDY on lead 2301. This signal passes through AND 2358 to generate H BRCOMRDY on lead 2355.

H LIFOTOCHRDY clocks FF 2212. The address counter 2102 produces the signal L LIFADDRTC on lead 2101 when the counter contains a zero count. L LIFADDRTC is inverted at 2332 and applied to the data input of FF 2212. Assuming the LIFO is not empty, i.e. the address counter does not contain a zero count, the clocking of FF 2212 does not change its state and it remains reset.

The signal H BRCOMRDY is transmitted over lead 2355 to the channel as an indication that data is available on the channel data bus. The backward read circuits then wait for the channel buffer to accept the data and raise the signal H DINXTBWRD on lead 149. While the circuits are waiting for the channel buffer to accept the data shift register 2208 continuously produces the signal H ENDLIFRDCE to read out the addressed location in the LIFO. The register also continuously produces the signal H DECODEDONE so that the clocking input of the address counter 2102 is held low by L CNTCLK2.

When the channel buffer accepts the data and raises the signal on lead 149, the signal is inverted at 2360 and blocks AND 2350. The signal H CLKLIFEMPTY goes true on lead 2331 to clock FF 2214. Since FF 2212 was not set, FF 2214 remains reset. The output of inverter 2360 is the signal L BRACK on lead 2319. When this signal goes true it passes through OR 2364 and clears FF 2308 thus terminating H BRCOMRDY In response, the channel buffer terminates the signal H DINXTBWRD on lead 149.

Whiel L BRACK is true it sets FF 2312 and the signal L CNTCLK2 at the output of AND 2354 rises to clock and decrement the address counter 2102. When L BRACK goes false FF 2312 is gain reset by the next 20 MHZ clock pulse.

As soon as the channel buffer terminates H DINXTBWRD on lead 149, AND 2350 is again enabled and H BRCHACK ØØ again sets FF 2308 so that H BRCOMRDY is sent to the channel buffer to indicate that more data is on the channel data bus.

The cycle is repeated as long as the counter is not empty. That is, the LIFO is read out to the channel data bus and the address counter decremented by L CONTCLK2. When the data is on the bus H BRCOMRDY is sent to the channel buffer. When the channel buffer accepts the data H DINXTBWRD is raised to drop H BRCOMRY and the cycle is repeated. This continues until the entire block of data except for the last byte has been transferred from LIFO 2100 to the channel buffer. At this time the address counter 2102 will contain a count of zero. When FF 2308 is set H LIFTOCHRDY on lead 2301 blocks and sets FF 2212. After the channel buffer accepts the last byte of data and raises H DINXTBWRD on lead 149, H CLKLIFEMPTY goes true on lead 2331. This clocks FF 2214 and since FF 2212 was set the FF 2214 is set. L LIFOMT on lead 2235 goes true and in FIG. 23 this signal insures that FF 2308 will reset if an attempt is made to transfer any more data. The signal L LIFOMT on lead 2235 may set a status register (not shown) which may be read by the controller 118 to determine that the backward read operation has been completed.

Compression Start

Referring to FIG. 1A, when a device connected to the channel 122 wishes to write a block of data to the tape unit 114 it transmits a value representing the block size over the channel and BPD bus 130 to the controller 118. The device then issues a write command to the controller. In response, the controller generates the signals L UPCDBDSEL and L LDS which are applied to an AND 2020 in FIG. 20 The output of the AND enables one input of AND 2022. The controller makes the signal H PROCRD false so AND 2022 enables decoder 2024. The controller places zeros on bits Ø1 and Ø2 of the processor address bus so that the decoder 2024 produces the signal L OCSELWRØ on lead 2011. In FIG. 3, this signal clocks a control word, from the controller 118 into the control register 300. The control word provided by the controller over the BPDBUS sets the register so that the circuits of FIG. 3 produce the signals H COMPRESSEN and H COMP. The signal H STEN is false. These signals enable the channel chopper 100, C/D controls 102, buffer choppers 104 and tape buffer controls 106 to perform a compression operation as previously described.

The device begins sending data over the channel data bus 122 and through channel buffer 110 to the channel choppers 100. The compression circuits compress the data and it is stored in the tape buffer 108. Meanwhile, the controller 118 repeatedly executes a program to determine if the condition is met whereby $$IB - IO \leq \frac{QO + (RT)(TS)}{\frac{RT}{RC} - \frac{1}{CT}}$$  Eq. (1)

where,
RC = compressor input data rate;
RT = output device data rate;
TS = time to get output device up to speed;
IB = data block size;
IO = number of input bytes processed by the compressor prior to starting the output device;
QO = number of output bytes produced by the compressor prior to starting the output device; and,
CT = a design parameter which sets the maximum overall compression which may be achieved following tape start using the formula.

In the above equation CT is important in that it is the only variable which the designer may control. The choice of CT is the means by which the designer sets the trade-off between the compressor performance and tape write performance. Compressions higher than CT are throttled back to CT or less. If CT is set high, say at 10, then 10 to 1 compression can be achieved following start-up but the start-up will be later on every write. This impacts tape performance especially on blocks with low compressability. On the other hand, if CT is set low, say at 2, it causes the tape start-up to occur much sooner but limits the compression which may be achieved following tape start-up to 2 to 1 thus impacting compressor performance on blocks with high compression potential. If Cl is the compression following start and if this compression is reasonalbly uniform then setting CT=Cl in Equation (1) will produce a start time which achieves maximal compression and minimal total time for the entire operation. If CT=C1 it means that both compression and performance are optimized. Since C1 is not known in advance, the designer sets CT knowing that if C1 CT then compression will be throttled back to at most CT but performance will be optimal while if C1 CT then compression will be optimal but performance will not. CT may be set to a constant value or it may be made a function or other known or measurable quantities. For example, CT might be made a function of block size (IB) so that higher compression could be achieved on larger blocks where the pay off is greater. CT might also be set based on a study of the amount of throttling which has occurred on the same or similar applications previously run. The generation of the throttle character as previously described makes the amount of throttling easily available to analysis CT might also be set based on the use of the data being written. For example, in a case where data which is written once and probably never read (i.e. file backup) CT should be set to optimize performance over compression. On the other hand, in the case where data is written once and read many times CT should Ø=set to optimize compression to a higher degree.

In order to determine if the condition specified by Eq. (1) is met, the controller 118 executes a subroutine to count the number of bytes of data transferred from the channel to the compression system in a given interval of time. This provides the compressor input data rate RC.

In order to determine the number of input bytes processed by the compressor prior to tape start IO) the controller reads the write counter 1600 which controls the writing of compressed data into the tape buffer 108. The controller makes the signals L UPCDBDSEL, L LDS and H PROCRD true. L LDS and L UPCDBDSEL enable AND 2020 and its output enables one input of AND 2026. H PROCRD is inverted at 2028 and enables AND 2026 so that the AND produces an output signal to enable decoder 2030. The controller makes bit 1 of the processor address bus high so that the decoder 2030 produces the signal H SELRD1 on lead 015. In FIG. 16, H SELRD1 enables drivers 1604 so that the output of the write counter 1600 is passed over the BPDBUS 130 to the controller 118.

The controller 118 obtains the value QO by sensing the output of counter 1630. This counter is incremented each time the channel chopper 100 accepts another byte of data from the channel. In FIG. 20, the controller issues the same signals as when reading the output of the write counter 1600 except that processor address bit Ø2 is true and bit Ø1 is false. The decoder thus produces the signal L SELRD2 on lead 2017 and this signal enables drivers 1632 so that the contents of the counter 1630 are passed over the BPDBUS 130 to the controller. Since the values RT, TS and CT are known the right side of Eq. (1) may be implemented by PROM table look-up. Since the data block size IB is sent to the controller from the channel before the write command, the left side of Eq. (1) may be implemented by subtracting IO from IB. A comparison may then be made between the table look-up value and the difference between IB and IO.

When the left side of Eq. (1) is equal to or less than the right side of the equation the controller sends another command to the control register 300 to make the signal H STARTAPE true. This command also makes H COMPRESSEN and H COMP true and H STEN false. Immediately prior to sending STARTAPE to control register 300, the controller 118 issues a start tape command to the IPI to initiate tape motion in the tape unit 114. It should be understood that while it is preferred that the right side of Eq. (1) be implemented by a table look-up procedure because it is faster, the entire equation could also be solved by a series of arithmetic operations with those values that are constant, i.e. RT, TS, RC and CT being stored in memory.

Summary

From the foregoing description it is seen that the present invention provides an improved data compression/decompression system wherein output device start-up time is optimized to obtain the best balance between total cycle time and the degree of data compression. Common circuitry requiring only one string table performs both the compression and decompression operations. The system includes means which avoids the necessity of periodically addressing and clearing each string table location A unique throttle control generates filler characters during write operations when tape under-run is imminent. Referring to FIG. 1A, the buffer choppers 100, compression/decompression controls 102 and buffer choppers 104 may be implemented on a single chip VLSIC techniques. Optionally, the tape buffer control 106 and IPI 112 may be implemented on the chip but if the IPI 112 is included on the chip then an optional bybass around the IPI should be provided for greater flexibility of chip use.

While a specific preferred embodiment of the invention has been described in detail, it would be understood that various modifications and substitutions may be made in the described embodiment without departing from the spirit and scope of the invention as defined by the appended claims. For example, the channel choppers 100 need not reform 8-bit bytes to 9-bit bytes The system may be adapted to accept 9-bit bytes (8-bits plus parity) from the channel buffer 110 and apply 9-bit bytes to the channel 122 by changing the PLAs in the channel chopper The embodiments of the invention in which an exclusive property or privilege is claimed are defined as follows.

1. A data compression system for compressing incoming data characters, said system comprising:

a string table having a plurality of addressable storage locations each capable of storing a prefix code, a string code and a sub-block count;

a string code counter for producing an output signal upon reaching a predetermined count;

means for incrementing said code counter each time a string code is written into said string table;

a sub-block counter;

means responsive to said output signal for incrementing the count in said sub-block counter;

address hashing means responsive to an incoming data character for successively addressing said string table to read the prefix code and sub-block count from the addressed locations;

comparing means for comparing each sub-block count read from said string table with the count in said sub-block counter and producing a comparison signal when they are equal; and, means responsive to said comparing means for writing the sub-block count in said sub-block counter, the string code in said code counter and a prefix code into said string table only if said comparing means does not produce said comparison signal.

2. A data compression system as claimed in claim 1 and further comprising means responsive to a predetermined count in said code counter for resetting said code counter.

3. A data compression system comprising:

data compression means responsive to uncompressed data for producing compressed data at a rate which varies;

a buffer;

a recording means for recording compressed data at a rate different from the rate at which said compressed data is produced;

control means for controlling the writing of said compressed data produced by said data compression means into said buffer and reading compressed data from said buffer to said recording means, said control means including means producing a throttle signal when said buffer is empty, and means responsive to said throttle signal for generating throttle characters and writing them into said buffer.

4. A data compression system as claimed in claim 3 wherein said data compression means produces said compressed data a word at a time, said control means including chopper means for chopping said data into bytes which are individually written into said buffer, said control means being responsive to said throttle signal for generating multiple byte throttle characters which are written into said buffer by said control means.

5. A data compression system as claimed in claim 3 including means for issuing a start signal to said recording means, and means responsive to said start signal for enabling said means producing said throttle signal whereby said throttle characters may be written into said buffer only after said recording means has been started.

6. A data compression system as claimed in claim 4 wherein said control means includes first and second counters, means for incrementing said first counter each time a byte is written into said buffer, means for incrementing said second counter each time a byte is read from said buffer, and comparing means for comparing counts in said counters and producing said throttle signal when said counts are equal.

7. A data compression system for compressing incoming uncompressed data or decompressing compressed data, said system including:
- a string table for storing string codes, prefix codes and sub-block counts;
- a character register;
- a code register;
- a sub-block counter;
- a string code counter;
- a length counter;
- first comparing means for comparing the count in said sub-block counter with a sub-block count read from said string table, said first comparing means producing a first comparison signal when said counts are equal;
- second comparing means responsive to said string table and said code register for producing a second comparison signal when a prefix code read from said string table is equal to a code in said code register;
- third means for entering each incoming data character into said character register;
- fourth means responsive to each incoming data character for reading from said string table a string code, a prefix count and a sub-block count;
- fifth means responsive to said first and second comparing means for incrementing said length counter, entering a string code read from said string table into said character register, and controlling said third means to enter another incoming data character into said character register;
- sixth means responsive to said first comparing means and active when a sub-block count read from said string table is not equal to the count in said sub-block counter for storing the contents of said sub-block counter, said code register and said code counter in said string table as a sub-block count, a prefix code and a string code, respectively, said sixth means including means to reset said length counter, increment said code counter, and transfer the contents of said character register to said code register when said sub-block count read from said string table is not equal to the count in said sub-block counter.

8. A data compression system as claimed in claim 7 and further comprising:
- a buffer chopper for chopping compressed data into bytes;
- a bus connected to said code register and said buffer chopper for transferring compressed data to said buffer chopper; and,
- further means responsive to said first comparing means for transmitting a signal to said buffer chopper indicating that compressed data is present on said bus when a sub-block count read from said string table is not equal to the count in said sub-block counter.

9. A data compression system for decompressing incoming compressed data represented by string codes, said system comprising:
- a code counter;
- an addressable string table for storing prefix codes and extension characters;
- an address register for addressing said string table;
- a LIFO memory;
- a length counter for addressing said LIFO memory;
- first means responsive to incoming compressed data for producing a first signal when a string code has a value greater than a predetermined value;
- a character register;
- a code register; and,
- second means for entering each string code of said incoming data into said address register to address said string table and read a prefix code and an extension character therefrom if the count in said length counter is zero and,
- sequence control means including first control means responsive to said first signal for transferring the contents of said address register to said code register, entering a prefix code and extension character read from said string table into said address register and character register, respectively, transferring an extension character from said character register to said LIFO memory, and incrementing said length counter,
- said sequence control means including second control means operable subsequent to said first control means and responsive to said first means for transferring the contents of said address register to said character register, and transferring the contents of said code counter to said address register to address said string table to write the contents of said character register in said string table as an extension character,
- said sequence control means including third control means operable subsequent to said second control means for decrementing said length counter and transferring the contents of a location in said LIFO memory to said character register.

10. A data compression system as claimed in claim 9 and further comprising channel chopper means for receiving decompressed data from said character register.

11. A data compression system as claimed in claim 9 wherein said first control means includes means operable in the absence of said first signal for transferring the contents of said address register to said character register and said code register, transferring the contents of said code counter to said address register to write the contents of said character register into said string table, and incrementing said code counter.

12. A data compression system as claimed in claim 11 wherein said second control means includes means responsive to said first signal for writing the contents of said character register into said LIFO memory, incrementing said length counter, and reading a prefix code and extension character from said string table to said address register and character register, respectively.

13. In a data compression system wherein data from a source is compressed in a data compression apparatus and is passed from the compression apparatus through a buffer to an output device, a method of optimizing output device start-up time, said method comprising:
- applying data from said source to said compression apparatus and storing compressed data produced by said compression apparatus in said buffer;
- repeatedly determining if the equation $$IB - IO \leq \frac{QO + (RT)(TS)}{\frac{RT}{RC} - \frac{1}{CT}}$$

is true; and,
- starting said output device and transmitting compressed data from the buffer to the output device only after it is determined that the equation is true, where, RC is the compressor input data rate;
RT is the output device data rate;
TS is time required for the output device to reach operating speed;
IB is the data block size;
IO is the number of input bytes processed by the compressor apparatus prior to device start-up;
QO is the number of output bytes produced by the compressor prior to device start-up; and,
CT is a design parameter which sets the maximum overall compression which may be achieved following output device start using said equation.

* * * * *